US006327558B1

(12) United States Patent
Nishimura

(10) Patent No.: US 6,327,558 B1
(45) Date of Patent: Dec. 4, 2001

(54) APPARATUS FOR SIMULATING ELECTRICAL CHARACTERISTICS OF A CIRCUIT INCLUDING A FERROELECTRIC DEVICE AND A METHOD FOR SIMULATING ELECTRICAL CHARACTERISTICS OF A CIRCUIT INCLUDING A FERROELECTRIC DEVICE

(75) Inventor: Kiyoshi Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/121,627

(22) Filed: Jul. 23, 1998

(30) Foreign Application Priority Data

Dec. 26, 1997 (JP) .................................................. 9-360753

(51) Int. Cl.[7] .................................................. G06F 9/455

(52) U.S. Cl. .................................................. 703/20; 703/2

(58) Field of Search .................................................. 703/20, 15, 14, 703/13, 2

(56) References Cited

U.S. PATENT DOCUMENTS 5,867,405 * 2/1999 Jiang et al. .............................. 703/5

OTHER PUBLICATIONS

M. De Magistris et al., Application of a Rheological Model to the Simulation of Ferroelectric Hysteresis, 8th International Symposium on Electrets, ISE 8, 1994, pp. 628–633.*
C. Deng–Yuan et al., A Simple Unified Analytical Model for Ferroelectric Thin Film Capacitor and its Applications for Nonvolatile Memory Operation, Proceedings of the 9th IEEE Int'l Symposium on Applications of Ferroelectrics, ISAF '94, 1994, pp. 25–28.*

A. Sheikholeslami et al., A Survey of Behavioral Modeling of Ferroelectric Capacitors, IEEE Transactions on Ultrasonics, Ferroelectrics and Frequency Control, vol. 44, No. 4, Jul. 1997, pp. 917–924.*
T. Tsurumi et al., Dielectric Property of $BaTiO_3$—$SrTiO_3$ Atifically Modulated Structure Made by MBE, Proceedings of the 11th IEEE Int'l Symposium on Applications of Ferroelectrics, ISAF 98, 1998, pp. 47–50.*
N. Farag et al., Computer–Aided Modeling of Dielectric and Ferroelectric Properties, IEEE Electrical Insulation Magazine, vol. 15, No. 3, May–Jun. 1999, pp. 25–31.*
J.T. Evans et al., A Ferroelectric Capacitor Simulation Model, IEEE 7th International Symposium on Applications of Ferroelectrics, 1991, pp. 692–697.*

(List continued on next page.)

*Primary Examiner*—Kevin J. Teska
*Assistant Examiner*—Russell W. Frejd
(74) *Attorney, Agent, or Firm*—Merchant & Gould P.C.

(57) ABSTRACT

It is an object of the present invention to provide a simulation apparatus capable of easily evaluating dynamic characteristics of a circuit including a ferroelectric device quantitatively. Means 30 and 32 calculate dynamic capacitance of a without-polarization reversal term, Cp, and a with-polarization reversal term, Cr, respectively, by differentiating the without-polarization reversal term fQp and the with-polarization reversal term fQr, respectively, representing simple saturation functions with the voltages applied to the ferroelectric part. Means 34 calculates dynamic capacitance Cd of the ferroelectric part by composing both the dynamic capacitance Cp and the dynamic capacitance Cr. Means 36 determines dynamic time constants τ of the circuit including the ferroelectric part in accordance with the dynamic capacitance Cd. Means 38 determines both transient charge response q(t) and transient current response i(t) and the like in accordance with the time constants τ. The transient responses can be simulated by using the without-polarization reversal term fQp and the with-polarization reversal term fQr both representing simple saturation functions.

27 Claims, 43 Drawing Sheets

OTHER PUBLICATIONS

D.E. Dunn, A Ferroelectric Capacitor Macromodel and Parameterization Algorithm for Spice Simulation, IEEE Transactions on Ultrasonics, Ferroelectrics and Frequency Control, vol. 41, May 1994, pp. 360–369.*

P.A. Contla et al., Simple Model for the Design of Polymeric Piezoelectric Ultrasonic Tranducers, International Conference on Acoustic Sensing and Imaging, Mar. 1993, pp. 1–6.*

Masayoshi Omura et al.; "Simulations of Ferroelectric Characteristics Using a One–Dimensional Lattice Model", *Japanese Journal of applied Physics*; Sep. 1991; vol. 30, No. 9B, pp. 2384–2387.

Kiyoshi Nishimura, Takaaki Fuchikami, and Kazuhiro Hoshiba; "A Ferroelectric Hysteresis Loop Model", *Electronics and Communications in Japan*; Oct. 1997; vol. 80, No. 10, pp. 1–8.

* cited by examiner

APPARATUS FOR SIMULATING ELECTRICAL CHARACTERISTICS OF A CIRCUIT INCLUDING A FERROELECTRIC DEVICE AND A METHOD FOR SIMULATING ELECTRICAL CHARACTERISTICS OF A CIRCUIT INCLUDING A FERROELECTRIC DEVICE

CROSS-REFERENCE TO RELATED APPLICATION

The entire disclosure of Japanese Patent Application No. Hei 9-360753 filed on Dec. 26, 1997 including specification, claims, drawings and summary are incorporated herein by reference in its entirety.

BACKGROUND OF INVENTION

1. Field of the Invention

This invention relates to a simulation apparatus for a ferroelectric device, more specifically an apparatus for simulating dynamic characteristics of a circuit including a ferroelectric memory device.

2. Description of the Related Art

It is known that a ferroelectric device shows a hysteresis in a relation between applied voltages and polarization charges. The ferroelectric device can be used as an nonvolatile type semiconductor memory or other devices by utilizing the electric characteristic. In this connection, the hysteresis of the ferroelectric device need to be evaluated quantitatively in case of using the ferroelectric device to a memory or other circuits.

In order to evaluate the hysteresis of the ferroelectric device quantitatively, a method presented on the JAPANESE JOURNAL OF APPLIED PHYSICS Volume 30, Number 9B page 2384 to 2387 issued on September, 1991 as a "Simulations of Ferroelectric Characteristics Using a One-Dimensional Lattice Model" under the name of OMURA et. al. can be used.

The method uses a simulation model utilizing an overall free energy "f" defined as an equation shown in below, $$f = \Sigma_{n=1, N} \{\alpha/2 \cdot p_n^2 + \beta/4 \cdot p_n^4 + k/2 \cdot (p_n - p_{n-1})^2 - p_n \cdot e\}$$

In the equation, $P_n$ shows a dipole moment of the n th lattice, k is an interaction coefficient of atoms located adjacently, e means an electric field and the equation satisfies a condition of $\alpha<0$, $\beta>0$. Also, $\alpha$ can be shown in a numerical formula shown in below as a function of temperature T, $$\alpha = a(T - T_0)$$

wherein a condition of a>0 must be satisfied, and $T_0$ shows the Curie temperature. In addition, an equation shown in below is the equation for defining symbols in the above equation calculating the simulation model utilizing the overall free energy "f", $$\Sigma_{n=1, N}\{X_n\} = X_1 + X_2 + \ldots X_N$$

The hysteresis of the ferroelectric device will be evaluated quantitatively in accordance with the overall free energy "f" thus calculated.

However, the simulation method described above has the following problems to be resolved. The equation shown in above which describes physical phenomena under atomic basis is used as the simulation model in the conventional simulation method. Therefore, it is not appropriate to use the equation for describing phenomena caused under electric basis. Also, complication of the equation make hard to understand the equation itself at sight. As a result, it is not-easy to use the simulation results on engineering basis such as circuit analysis or the like. In addition, a computer having higher processing capabilities is required when the equation is calculated by the computer because the equation itself is complicated.

Further, in order to increase an operation speed of the ferroelectric memory or similar devices, it is necessary to evaluate not only the hysteresis of the ferroelectric device quantitatively but also quantitatively evaluate dynamic characteristics of a circuit including the ferroelectric device such as transient responses. The simulation model described above can not be used for simulating the dynamic characteristics of the circuit on engineering basis because the calculation is too complex to carry out.

SUMMARY OF THE INVENTION

It is an object of the present invention to provide a simulation apparatus capable of easily evaluating dynamic characteristics of a circuit including a ferroelectric device quantitatively.

In order to apply a simulation model to a practical ferroelectric device, specific constants such as characteristic constants realizing a simulation model need to be determined. Eventually, it is hard to apply the simulation model to the practical circuit using the ferroelectric device when determination of the characteristic constants is difficult to carry out. Further, it is another object of the present invention to provide an apparatus for extracting the characteristic constants of the ferroelectric device easily.

In accordance with the present invention there is provided an apparatus for simulating electrical characteristics of a circuit including a ferroelectric device, the apparatus calculating dynamic characteristics of the circuit in accordance with a hysteresis representing a relationship between voltages applied to the ferroelectric device and polarization charges charged in the ferroelectric device, the apparatus comprises:

first means for determining a without-polarization reversal term at least a part of which as a saturation function, the without-polarization reversal term corresponds to phenomena not accompanying with reversal of spontaneous polarization of the ferroelectric device in the hysteresis, second means for determining a with-polarization reversal term at least a part of which as a saturation function, the with-polarization reversal term corresponds to phenomena accompanying with reversal of spontaneous polarization of the ferroelectric device in the hysteresis, and third means for determining dynamic characteristics of the circuit including the ferroelectric device in accordance with the hysteresis of the ferroelectric device composing of both the without-polarization reversal term and the with-polarization reversal term.

In another aspect, the present invention provide a method for simulating electrical characteristics of a circuit including a ferroelectric device, the method is characterized by calculating dynamic characteristics of the circuit in accordance with a hysteresis representing a relationship between voltages applied to the ferroelectric device and polarization charges charged in the ferroelectric device, the method comprises the steps of:

determining a without-polarization reversal term at least a part of which as a saturation function, the without-polarization reversal term corresponds to phenomena not accompanying with reversal of spontaneous polarization of the ferroelectric device in the hysteresis, determining a with-polarization reversal term at least a part of which as a saturation function, the with-polarization reversal term corresponds to phenomena accompanying with reversal of spontaneous polarization of the ferroelectric device in the hysteresis, and determining dynamic characteristics of the circuit including the ferroelectric device in accordance with both the without-polarization reversal term and the with-polarization reversal term.

Further, in accordance with the present invention there is provided a program storage medium readable by a machine, the machine performs procedures for calculating dynamic characteristics of a circuit including a ferroelectric device based on a hysteresis representing a relationship between voltages applied to the ferroelectric device and polarization charges charged in the ferroelectric device in accordance with a program stored in the program storage medium, the program is characterized by comprising the steps of:

determining a without-polarization reversal term at least part of which as a saturation function, the without-polarization reversal term corresponds to phenomena not accompanying with reversal of spontaneous polarization of the ferroelectric device in the hysteresis, determining a with-polarization reversal term at least a part of which as a saturation function, the with-polarization reversal term corresponds to phenomena accompanying with reversal of spontaneous polarization of the ferroelectric device in the hysteresis, and determining the dynamic characteristics of the circuit including the ferroelectric device in accordance with both the without-polarization reversal term and the with-polarization reversal term.

In another aspect, there is provided an apparatus for extracting characteristic constants of a ferroelectric device used for describing a hysteresis as a composition of both a without-polarization reversal term at least a part of which being described in a saturation function not accompanying with reversal of spontaneous polarization of the ferroelectric device, and a with-polarization reversal term at least a part of which being described in a saturation function accompanying with reversal of spontaneous polarization of the ferroelectric device, the hysteresis representing a relationship between voltages applied to the ferroelectric device and polarization charges charged therein, the apparatus comprises:

first extracting means for extracting a first characteristic constant Qpmax corresponding to a saturation point of the saturation function composing the without-polarization reversal term, second extracting means for extracting a second characteristic constant Kp corresponding to sensitivity of the saturation function composing the without-polarization reversal term, third extracting means for extracting a third characteristic constant Qrmax corresponding to a saturation point of the saturation function composing the with-polarization reversal term, fourth extracting means for extracting a fourth characteristic constant Kr corresponding to sensitivity of the saturation function composing the with-polarization reversal term, and fifth extracting means for extracting a fifth characteristic constant Ec corresponding to a starting point of the saturation function composing the with-polarization reversal term.

Yet further, in accordance with the present invention there is provided a method for extracting characteristic constants of a ferroelectric device used for describing a hysteresis as a composition of both a without-polarization reversal term at least a part of which being described in a saturation function not accompanying with reversal of spontaneous polarization of the ferroelectric device, and a with-polarization reversal term at least a part of which being described in a saturation function accompanying with reversal of spontaneous polarization of the ferroelectric device, the hysteresis representing a relationship between voltages applied to the ferroelectric device and polarization charges charged therein, the method is characterized by comprising the steps of:

extracting a first characteristic constant Qpmax corresponding to a saturation point of the saturation function composing the without-polarization reversal term, extracting a second characteristic constant Kp corresponding to sensitivity of the saturation function composing the without-polarization reversal term, extracting a third characteristic constant Qrmax corresponding to a saturation point of the saturation function composing the with-polarization reversal term, extracting a fourth characteristic constant Kr corresponding to sensitivity of the saturation function composing the with-polarization reversal term, and extracting a fifth characteristic constant Ec corresponding to a starting point of the saturation function composing the with-polarization reversal term.

Still another aspect, there is provided a program storage medium readable by a machine, the program storage medium being used for performing procedures for extracting characteristic constants of a ferroelectric device used for describing a hysteresis as a composition of both a without-polarization reversal term at least a part of which being described in a saturation function not accompanying with reversal of spontaneous polarization of the ferroelectric device, and a with-polarization reversal term at least a part of which being described in a saturation function accompanying with reversal of spontaneous polarization of the ferroelectric device in accordance with a program stored in the medium by the machine, the program is characterized by comprising the steps of:

extracting a first characteristic constant Qpmax corresponding to a saturation point of the saturation function composing the without-polarization reversal term, extracting a second characteristic constant Kp corresponding to sensitivity of the saturation function composing the without-polarization reversal term, extracting a third characteristic constant Qrmax corresponding to a saturation point of the saturation function composing the with-polarization reversal term, extracting a fourth characteristic constant Kr corresponding to sensitivity of the saturation function composing the with-polarization reversal term, and extracting a fifth characteristic constant Ec corresponding to a starting point of the saturation function composing the with-polarization reversal term.

While, the novel features of the invention are set forth in a general fashion, both as to organization and content, the invention will be better understood and appreciated, along with other objects and features thereof, from the following detailed description taken in conjunction with the drawings.

BRIEF DESCRIPTION OF THE DRAWINGS

FIG. 8 is a diagram of a Sawyer-Tower circuit 18a.

FIG. 9 is a graph illustrating a hysteresis loop of the ferroelectric capacitor Cf measured by the Sawyer-Tower circuit 18a.

FIG. 10 is a graph illustrating plotted curves of remanent polarization charges Pr and maximum polarization charges Ps measured by the Sawyer-Tower circuit 18a.

DETAILED DESCRIPTION OF THE PREFERRED EMBODIMENT

1. First Embodiment

[Overall Structure of an Apparatus]

Figure 1:
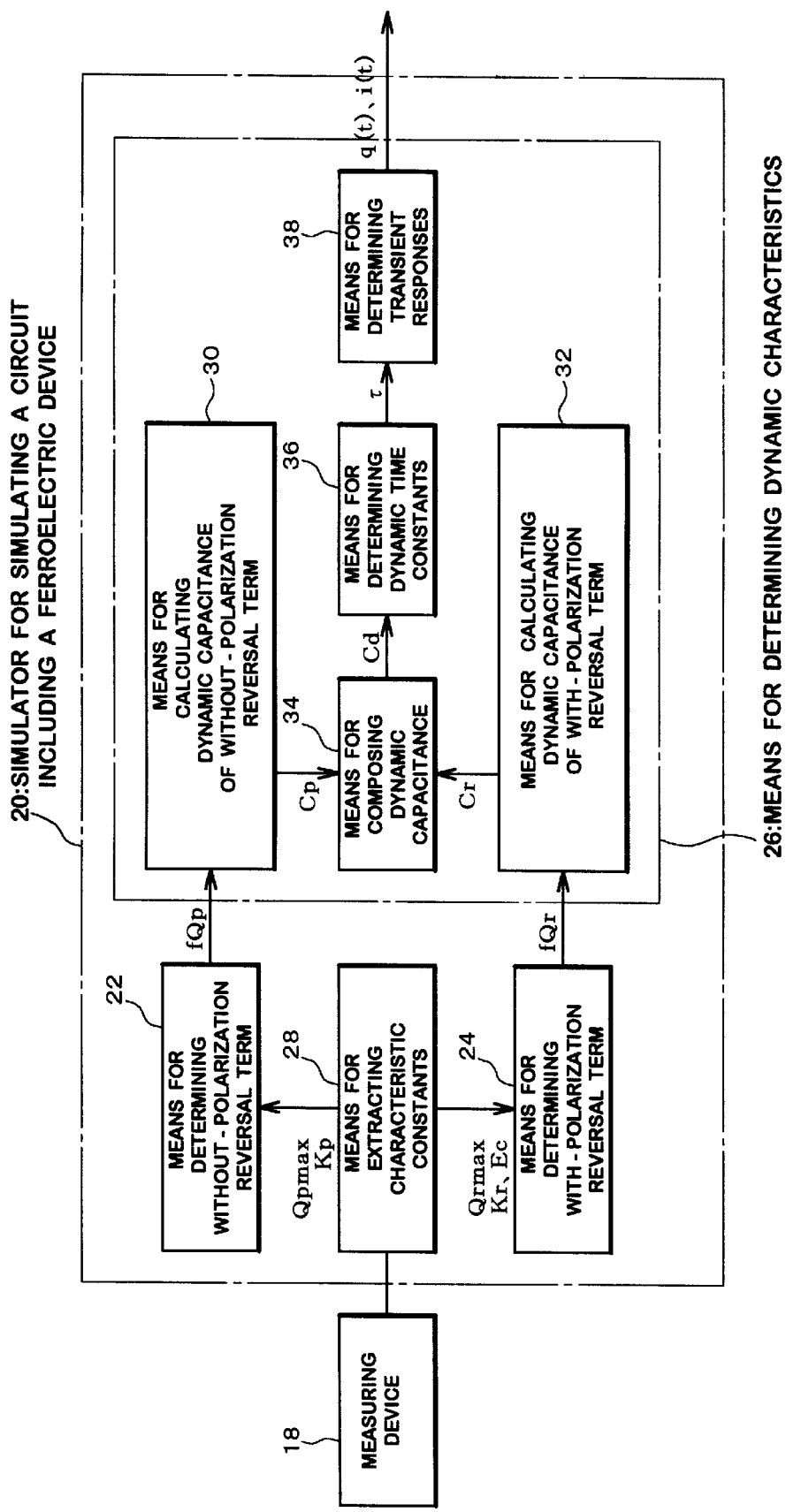
FIG. 1 is a block diagram illustrating an overall structure of a simulator 20 for simulating a circuit including a ferroelectric device as an embodiment of an apparatus for simulating electrical characteristics of a circuit including a ferroelectric device in accordance with the present invention.

FIG. 1 is a block diagram illustrating an overall structure of a simulator 20 for simulating a circuit including a ferroelectric part as an embodiment of an apparatus for simulating electrical characteristics of a circuit including a ferroelectric part in accordance with the present invention.

The simulator 20 is an apparatus for determining dynamic characteristics of the circuit including the ferroelectric part in accordance with hysteresis which represent a relationship between voltages applied to the ferroelectric part and polarization charges charged in the ferroelectric part, the hysteresis being generated in accordance with data obtained from a measuring device 18.

In the simulator 20, the hysteresis of the ferroelectric part is modeled as a sum of a without-polarization reversal term fQp and a with-polarization reversal term fQr both of which include simple saturation functions. The without-polarization reversal term fQp is a term corresponding to phenomena not accompanying with reversal of spontaneous polarization of the ferroelectric part in the hysteresis. In the without-polarization reversal term fQp, polarization charges will be a value of zero volt even when applied voltage is made zero from a positive value or from a negative value. In other words, the without-polarization reversal term fQp not cause the hysteresis.

On the contrary, the with-polarization reversal term fQr is a term corresponding to phenomena accompanying with reversal of spontaneous polarization of the ferroelectric part in the hysteresis. In the with-polarization reversal term fQr, polarization charges will not be a value of zero volt, it has a certain value even when the applied voltage is made zero volt. The polarization charges thus remained is referred as remanent polarization charges (or remanent polarization). The value of the remanent polarization is varied depend on either the applied voltage is made to zero volt from a positive value or the applied voltage is made to zero volt from a negative value. In other words, the with-polarization reversal term fQr cause the hysteresis.

In order to apply the hysteresis of the ferroelectric part thus modeled to an actual ferroelectric part (for instance a specific ferroelectric capacitor), characteristic constants as to the actual ferroelectric part described later will be extracted and the characteristic constants thus extracted is applied to the hysteresis model in the simulator 20. Dynamic characteristics (for instance, transient responses) of a circuit including the actual ferroelectric part (for instance, a circuit connecting a ferroelectric capacitor and a resistor in series) is determined in accordance with the hysteresis of the actual ferroelectric capacitor thus applied thereto.

As shown in FIG. 1, the simulator 20 comprises a means 28 for extracting characteristic constants which functions as an apparatus for extracting characteristic constants of a ferroelectric part, a means 22 for determining the without-polarization reversal term, a means 24 for determining the with-polarization reversal term and a means 26 for determining dynamic characteristics of the circuit.

Figure 2:
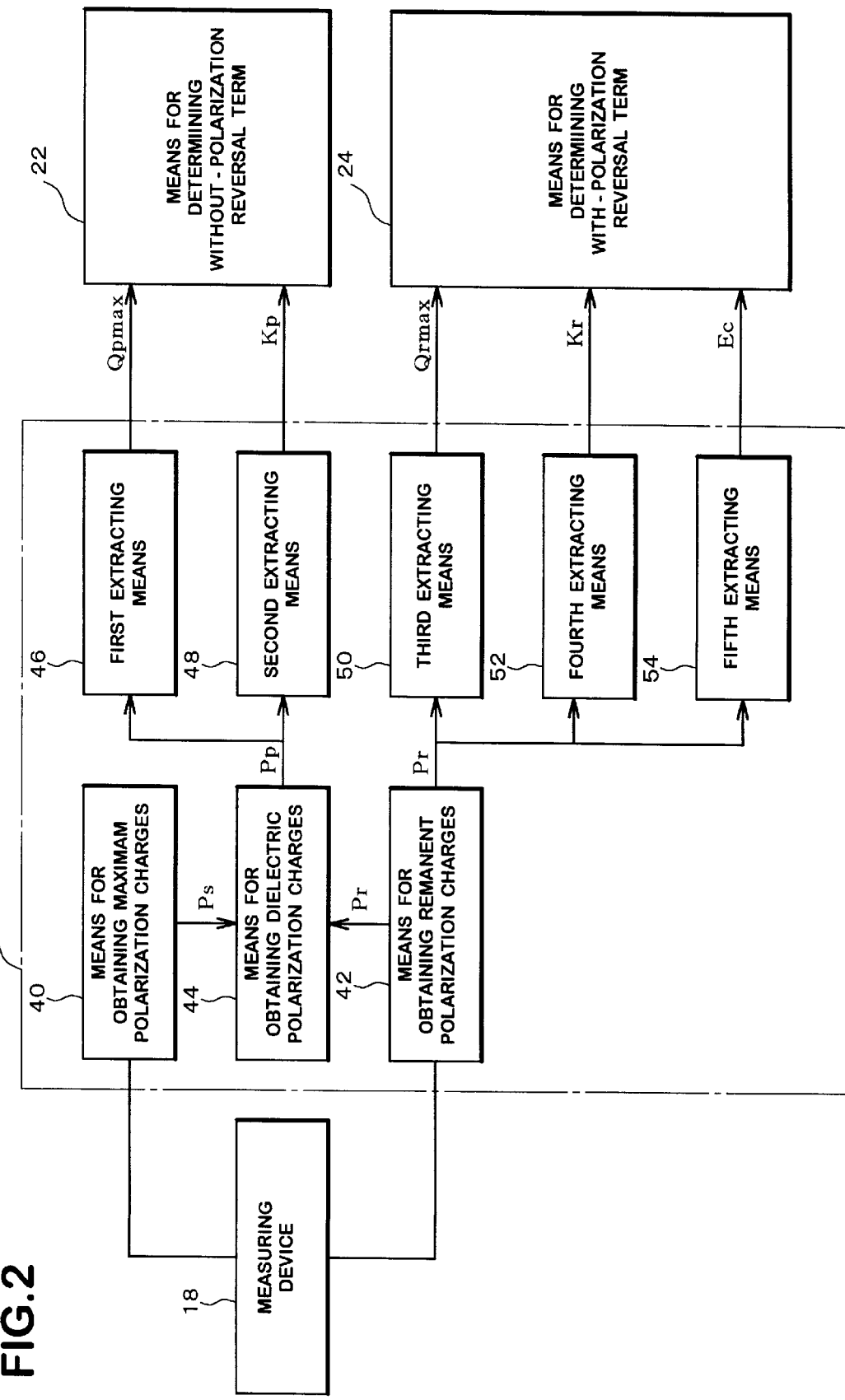
FIG. 2 is a block diagram illustrating a means 28 for extracting characteristic constants in detail.

A total of five (5) characteristic constants used for describing the hysteresis of the ferroelectric part are extracted in accordance with the data obtained through the measuring device 18. FIG. 2 is a block diagram illustrating the means 28 for extracting characteristic constants in detail. The means 28 for extracting characteristic constants comprises a means for obtaining maximum polarization charges 40, a means 42 for obtaining remanent polarization charges, a means 44 for obtaining dielectric polarization charges, a first extracting means 46, a second extracting means 48, a third extracting means 50, a fourth extracting means 52 and a fifth extracting means 54.

The means for obtaining maximum polarization charges 40 obtains maximum polarization charges Ps of the ferroelectric part correspondingly with voltage amplitudes $V_T$ of an alternating voltage for extracting the characteristic constants. The maximum polarization charges Ps are the polarization charges charged in the ferroelectric capacitor in maximum values when the alternating voltage for extracting the characteristic constants is applied thereto. Data such as a value of the maximum polarization charges Ps are obtained by the means 40 for obtaining maximum polarization charges through the measuring device 18.

The means 42 for obtaining remanent polarization charges obtains remanent polarization charges Pr of the ferroelectric part correspondingly with voltage amplitudes $V_T$ of the alternating voltage for extracting the characteristic constants. The remanent polarization charges Pr are the polarization charges charged in the ferroelectric part with remanence when the alternating voltage for extracting the characteristic constants is applied thereto. Data such as a value of the remanent polarization charges Pr are obtained by the means 42 for obtaining remanent polarization charges through the measuring device 18.

The means 44 for obtaining dielectric polarization charges obtains dielectric polarization charges Pp of the ferroelectric part correspondingly with voltage amplitudes $V_T$ of the alternating voltage for extracting the characteristic constants by calculating a difference between the maximum polarization charges Ps and the remanent polarization charges Pr thus obtained. The dielectric polarization charges Pp represents the difference between the maximum polarization charges Ps and the remanent polarization charges Pr.

The first extracting means 46 extracts a first characteristic constant Qpmax corresponding to a saturation point of a saturation function composing the without-polarization reversal term fQp. In this case, the first extracting means 46 extracts the dielectric polarization charges Pp as the first characteristic constant Qpmax when a ratio for a variation of the dielectric polarization charges Pp to a variation of the voltage amplitude $V_T$ is within a predetermined value.

The second extracting means 48 extracts a second characteristic constant Kp corresponding to sensitivity of the saturation function composing the without-polarization reversal term fQp. In this case, the second extracting means 48 extracts the second characteristic constant Kp under an equation described below by utilizing both k representing a constant when the desired values of the dielectric polarization charges Pp is described as a product of the constant k and the first characteristic constant Qpmax, and $V_T$k describing the voltage amplitude $V_T$ corresponding to the desired values of the dielectric polarization charges Pp, $$Kp=-\ln(1-k)/VTk$$

when a condition of $0 \leq k \leq 1$ is satisfied.

Further, the second extracting means 48 estimates the saturation function using the extracted first characteristic constant Qpmax and the extracted second characteristic constant Kp as the saturation point and the sensitivity of the saturation function respectively. And the second extracting means 48 adjusts the second characteristic constant Kp to minimize sum totals of absolute values of differences between function values of the saturation function thus estimated and the dielectric polarization charges Pp corresponding to the function values.

The third extracting means 50 extracts a third characteristic constant Qrmax corresponding to the saturation point of the saturation function composing the with-polarization reversal term fQr. In this case, the third extracting means 50 extracts remanent polarization charges Pr as the third characteristic constant Qrmax when a ratio for a variation of the remanent polarization charge Pr to a variation of the voltage amplitudes $V_T$ is within a predetermined value.

The fifth extracting means 54 extracts a fifth characteristic constant Ec corresponding to a starting point of the saturation function composing the with-polarization reversal term fQr. In this case, the fifth extracting means 54 extracts the fifth characteristic constant Ec under an equation described below by utilizing K1, $V_T$k1, K2 and $V_T$k2, the k1 representing a constant when remanent polarization charges Pr is described as a product of k1 and Qrmax, the $V_T$k1 describing the voltage amplitudes $V_T$ corresponding to one of the desired values of the remanent polarization charges Pr, the K2 representing a constant when remanent polarization charges Pr is described as a product of k2 and Qrmax, and the $V_T$k2 describing the voltage amplitudes $V_T$ corresponding to the other one of the desired values of the remanent polarization charges Pr, $$Ec=(VTk1 \cdot \ln(1-k2)-VTk2 \cdot -\ln(1-k1))/(\ln(1-k2)-\ln(1-k1))$$

when a condition of $0 \leq k1 \leq 1$, $0 \leq k2 \leq 1$, $k1 \neq k2$ is satisfied.

The fourth extracting means 52 extracts a fourth characteristic constant Kr corresponding to sensitivity of the saturation function composing the with-polarization reversal term fQr. In this case, the fourth extracting means 52 extracts the fourth characteristic constant Kr under an equation described below by using the fifth characteristic constant Ec, and utilizing both k representing a constant when the remanent polarization charges Pr is described as a product of k and Qrmax, and $V_T$k describing the voltage amplitudes $V_T$ corresponding to the desired values of the remanent polarization charges Pr, $$Kr=-\ln(1-k)/(VTk-Ec)$$

when a condition of $0 \leq k \leq 1$ is satisfied.

Further, the fourth extracting means 52 estimates the saturation function using the extracted third characteristic constant Qrmax, the extracted fifth characteristic constant Ec and the extracted fourth characteristic constant Kr as the saturation point, a starting point and the sensitivity of the saturation function respectively. And the fourth extracting means 52 adjusts the fourth characteristic constant Kr to minimize sum totals of absolute values of differences between function values of the saturation function thus estimated and the remanent polarization charges Pr corresponding to the function values.

Referring back to FIG. 1, the means 22 determines the without-polarization reversal term fQp at least a part of which as the saturation function. The without-polarization reversal term fQp corresponds to phenomena not accompanying with reversal of spontaneous polarization of the ferroelectric part in the hysteresis. The means 24 determines the with-polarization reversal term fQr at least a part of which as the saturation function. The with-polarization reversal term fQr corresponds to phenomena accompanying with reversal of spontaneous polarization of the ferroelectric part in the hysteresis.

How to describe both the without-polarization reversal term fQp and the with-polarization reversal term fQr using the five (5) characteristic constants thus extracted will be described hereunder.

It is assumed that voltages v applied to the ferroelectric part will be determined at a range described below by utilizing a number n1 which is greater than or equal to 1, a number n2 which is greater than or equal to 1 and the characteristics constant Ec, $$-n1 \cdot Ec \leq v \leq n2 \cdot Ec$$

The means 22 for determining the without-polarization reversal term calculates the without-polarization reversal term fQp in accordance with the first characteristic constant Qpmax and the second characteristic constant Kp under an equation described below, $$fQp=-Q p\max\{1-\exp(Kp \cdot v)\}$$

when a condition of $-n1 \cdot Ec \leq v<0$ is satisfied, $$fQp=Qp\max\{1-\exp(-Kp \cdot v)\}$$

when a condition of $0 \leq v \leq n2 \cdot Ec$ is satisfied.

The means 24 for determining the with-polarization reversal term calculates the with-polarization reversal term fQr (composed of a first with-polarization reversal term fQr1 and a second with-polarization reversal term fQr2) under equations described below in accordance with the third characteristic constant Qrmax, sensitivities Krn for applied voltages of the with-polarization reversal term (composed of both sensitivities Krn1 and Krn2) and the fifth characteristic constant Ec, $$fQr1=-Qr\max[1-\exp\{Krn2 \cdot (-(n1-1)Ec)\}]$$

when a condition of $-n1 \cdot Ec \leq v < -(n1-2)Ec$ is satisfied, $$fQr1=-Qr\max[1-\exp\{Krn2(v-Ec)\}]$$

when a condition of $-(n1-2)\ Ec \leq v<Ec$ is satisfied, $$fQr1=Qr\max[1-\exp\{-Krn1(v-Ec)\}]$$

when a condition of $Ec \leq v \leq n2 \cdot Ec$ is satisfied, $$fQr2=-Qr\max[1-\exp\{Krn2(v+Ec)\}]$$

when a condition of $-n1 \cdot Ec \leq v < -Ec$ is satisfied, $$fQr2=Qr\max[1-\exp\{-Krn1(v+Ec)\}]$$

when a condition of $-Ec \leq v \leq (n2-2)Ec$ is satisfied, $$fQr2=Qr\max[1-\exp\{-Krn1 \cdot (n2-1)Ec\}]$$

when a condition of $(n2-2)Ec \leq v \leq n2 \cdot Ec$ is satisfied.

The sensitivities Krn1 and Krn2 used in the equations above will be calculated under equations described below in accordance with the fourth characteristic constant Kr and the values n1 and n2, $Krn1=Kr$ when a condition of $1 \leq n1 < 2$ is satisfied, $Krn1=(n1-1)Kr$ when a condition of $2 \leq n1$ is satisfied, $Krn2=Kr$ when a condition of $1 \leq n2 < 2$ is satisfied, $Krn2=(n2-1)Kr$ when a condition of $2 \leq n2$ is satisfied.

Both a first hysteresis curve fQd1 and a second hysteresis curve fQd2 can be determined by composing the without-polarization reversal term fQp, the first with-polarization reversal term fQr1 and the second with-polarization reversal term fQr2 under the equation described below, $fQd1=fQp+fQr1$ $fQd2=fQp+fQr2$ An inherent hysteresis of the actual ferroelectric part (such as the ferroelectric capacitor) can be specified by using the five (5) characteristic constants such as the first characteristic constant Qpmax, the second characteristic constant Kp, the third characteristic constant Qrmax, the fourth characteristic constant Kr and the fifth characteristic constant Ec. In addition, simulation of the hysteresis of the ferroelectric capacitor can be carried out under desired voltages v using the number n1 and n2 defining the applied voltage v.

The means 26 for determining dynamic characteristics of the circuit shown in FIG. 1 determines dynamic characteristics of the circuit including the ferroelectric part in accordance with the hysteresis of the ferroelectric part thus determined which is represented by both the without-polarization reversal term fQp and the with-polarization reversal term fQr. The means 26 for determining dynamic characteristics of the circuit comprises a means 30 for calculating dynamic capacitance of the without-polarization reversal term, a means 32 for calculating dynamic capacitance of the with-polarization reversal term, a means 34 for composing dynamic capacitance, a means 36 for determining dynamic time constants and a means 38 for determining transient responses.

The means 30 for calculating dynamic capacitance of the without-polarization reversal term calculates dynamic capacitance Cp of the ferroelectric part (hereinafter referred to as dynamic capacitance Cp of the without-polarization reversal term) corresponding to the without-polarization reversal term fQp by differentiating the without-polarization reversal term fQp with the voltages applied thereto. The means 32 for calculating dynamic capacitance Cr of the with-polarization reversal term calculates dynamic capacitance of the ferroelectric part (hereinafter referred to as dynamic capacitance Cr of the with-polarization reversal term) corresponding to the with-polarization reversal term fQr by differentiating the with-polarization reversal term fQr with the voltages applied thereto. The means 34 for composing dynamic capacitance calculates dynamic capacitance Cd of the ferroelectric part by composing both the dynamic capacitance Cp of the without-polarization reversal term and the dynamic capacitance Cr of the with-polarization reversal term.

The means 36 for determining dynamic time constants determines time constants $\tau$ of the circuit including the ferroelectric part in accordance with the dynamic capacitance Cd of the ferroelectric part. In other words, the means 36 for determining dynamic time constants determines the time constants of the circuit including the ferroelectric part in accordance with the dynamic capacitance corresponding to transient voltage generated at the ferroelectric part during a transient period.

The means 38 for determining transient responses determines transient responses of the circuit including the ferroelectric part in accordance with the dynamic time constants of the circuit. In other words, the means 38 for determining transient responses determines the transient responses by performing following procedures, such as a step for determining response time corresponding to a variation of the polarization charges corresponding to the transient voltage in accordance with the dynamic time constants corresponding to the transient voltage, and a step for setting time bases using the response time as factors thereof, and a step for determining relationship between the factors and response values corresponding to the factors.

In this embodiment, the simulator 20 is composed so as to determine the transient responses when the ferroelectric part is headed for a predetermined balanced state. Both a balanced state which the ferroelectric part is headed during writing data therein and another balanced state which the ferroelectric part is headed during read out data can be assumed as the predetermined balanced state.

[Hardware structure]

Figure 3:
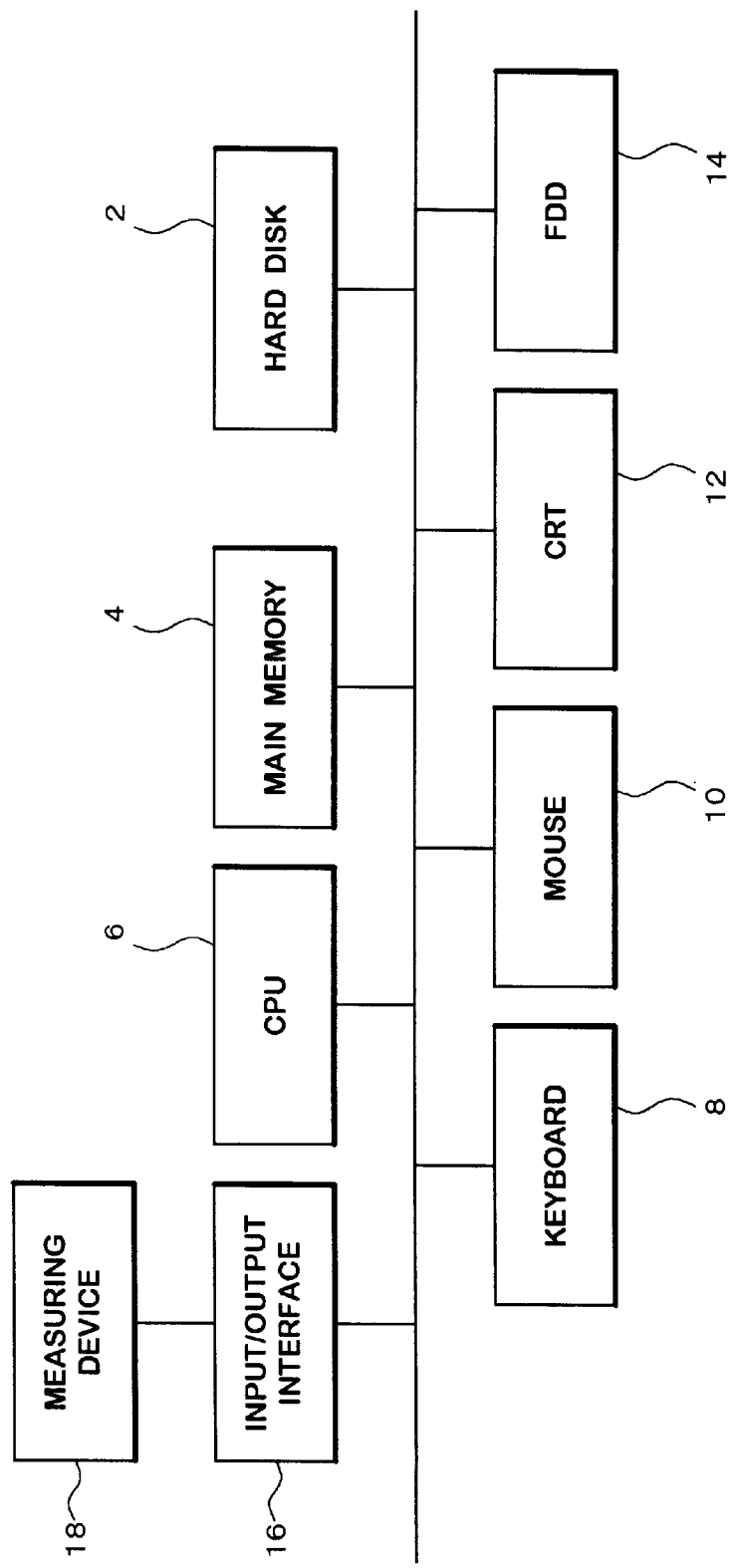
FIG. 3 is an example of hardware structure of the simulator 20 using a CPU for performing various operations.

FIG. 3 is a block diagram illustrating an example of hardware structure of the simulator 20 shown in FIG. 1 using a CPU for performing various operations.

Programs for performing simulation of the circuit including the ferroelectric part, the first characteristic constant Qpmax, the second characteristic constant Kp, other characteristic constant thus extracted and other data are stored in a hard disk 2. The programs stored in the hard disk 2 are loaded on a main memory 4. The CPU 6 executes the programs loaded on the main memory 4.

The CPU 6 controls the measuring device 18 through an input/output interface (hereinafter referred to as I/O interface) 16 as well as obtaining various data from the measuring device 18 through the I/O interface 16.

Values n1, n2 used for determining the voltage applied to the ferroelectric part and the like are inputted through a keyboard 8. Also, commands to the simulator 20 are inputted through the keyboard 8 and a mouse 10. Results coming out by performing simulation and others are displayed on a cathode ray tube (hereinafter referred to as CRT) 12. Further, handling of various data and/or programs transferred between external devices (not shown) are carried out through a flexible disk (not shown) by a flexible disk drive (hereinafter referred to as FDD) 14.

In FIG. 3, the CPU 6 shown in FIG. 3 functions as the means 28 for extracting characteristic constants, the means 22 for determining the without-polarization reversal term, the means 24 for determining the with-polarization reversal term and the means 26 for determining dynamic characteristics of the circuit.

[Processing]

[Overall Processing]

Figure 4:
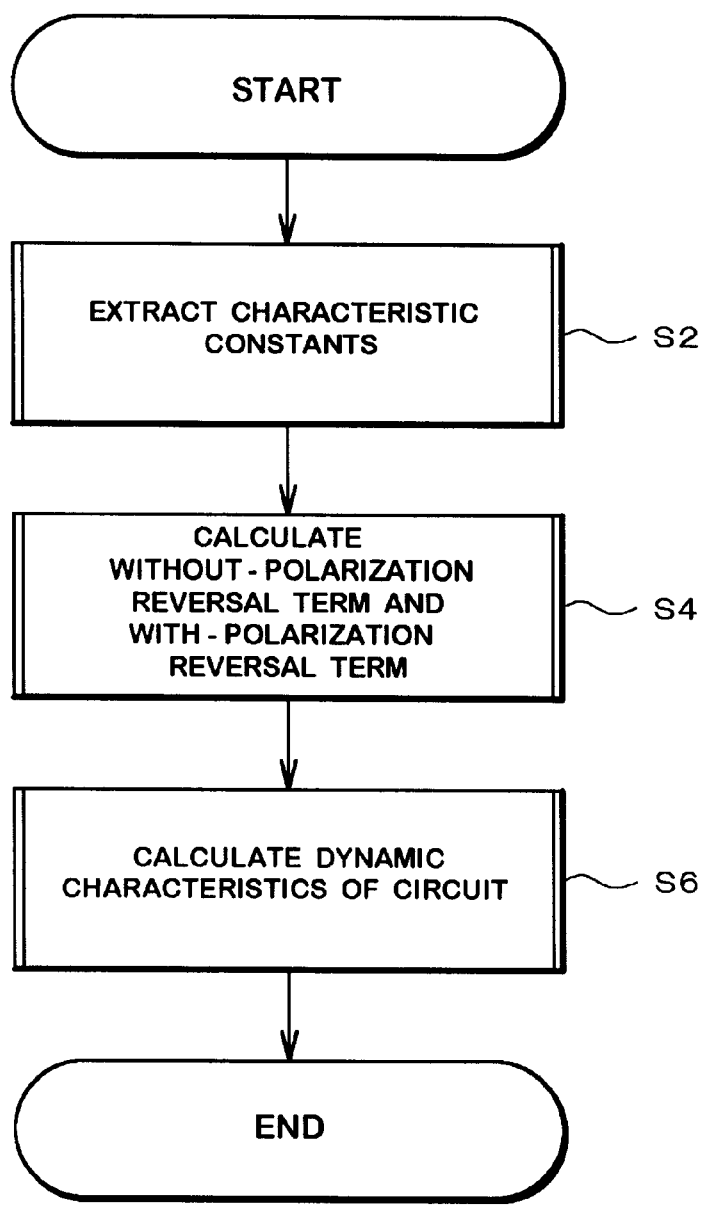
FIG. 4 is a flow chart illustrating steps for simulating the circuit including a ferroelectric capacitor Cf with the simulator 20.

FIG. 4 is a flow chart illustrating processes for simulating the circuit including a ferroelectric capacitor Cf with the simulator 20 when voltages applied to the ferroelectric part are symmetric in a positive state and a negative state. Processing performed by the simulator 20 will be described herein based on the flow chart shown in FIG. 4. At first, the CPU 6 performs a process for extracting the characteristic constants (step S2). The five (5) characteristic constants such as the first characteristic constant Qpmax, the second characteristic constant Kp, the third characteristic constant Qrmax, the fourth characteristic constant Kr and the fifth characteristic constant Ec described above are extracted during the process.

Thereafter, the CPU 6 performs a process for calculating both the without-polarization reversal term and the with-polarization reversal term (step S4). In the process, both the without-polarization reversal term fQp and the with-polarization reversal term fQr are calculated in accordance with the characteristic constants such as the first characteristic constant Qpmax, the second characteristic constant Kp, the third characteristic constant Qrmax, the fourth characteristic constant Kr and the fifth characteristic constant Ec thus extracted.

Finally, the CPU 6 performs another process for calculating dynamic characteristics (step S6). In the process, the dynamic characteristics of the circuit including the ferroelectric part are calculated in accordance with both the without-polarization reversal term fQp and the with-polarization reversal term fQr thus calculated.

Figure 5:
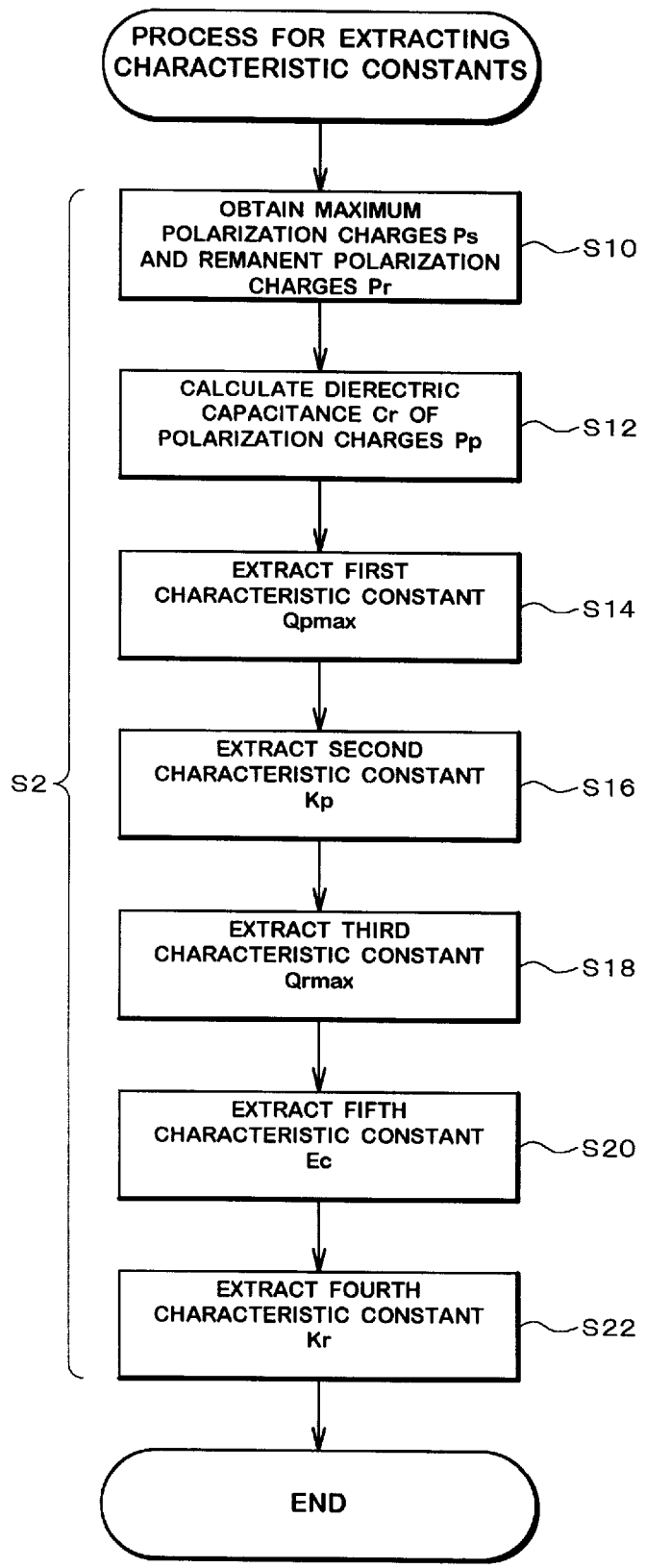
FIG. 5 is a flow chart describing detail of a process for extracting the characteristic constants.
Figure 6:
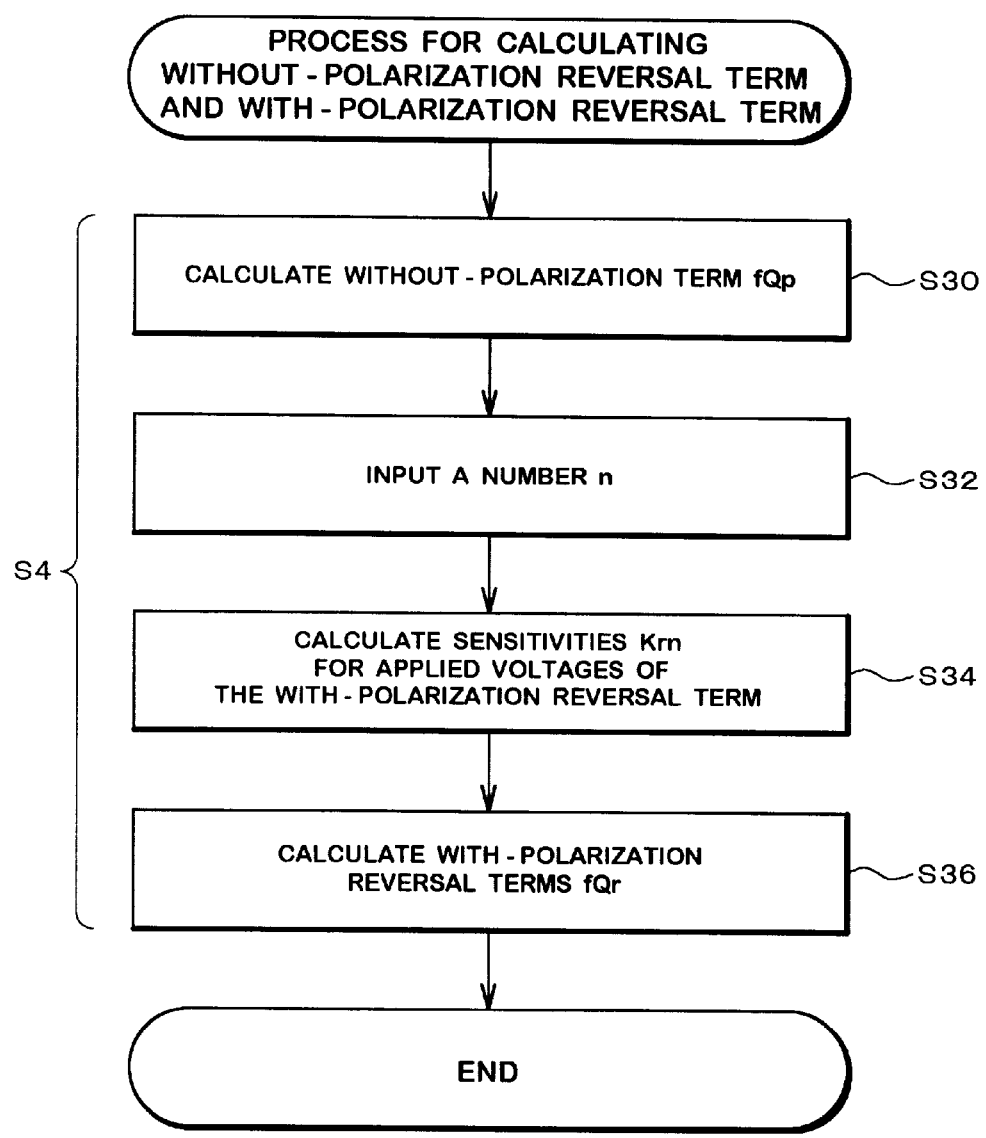
FIG. 6 is a flow chart describing detail of a process for calculating a with-polarization reversal term and a without-polarization reversal term.
Figure 7:
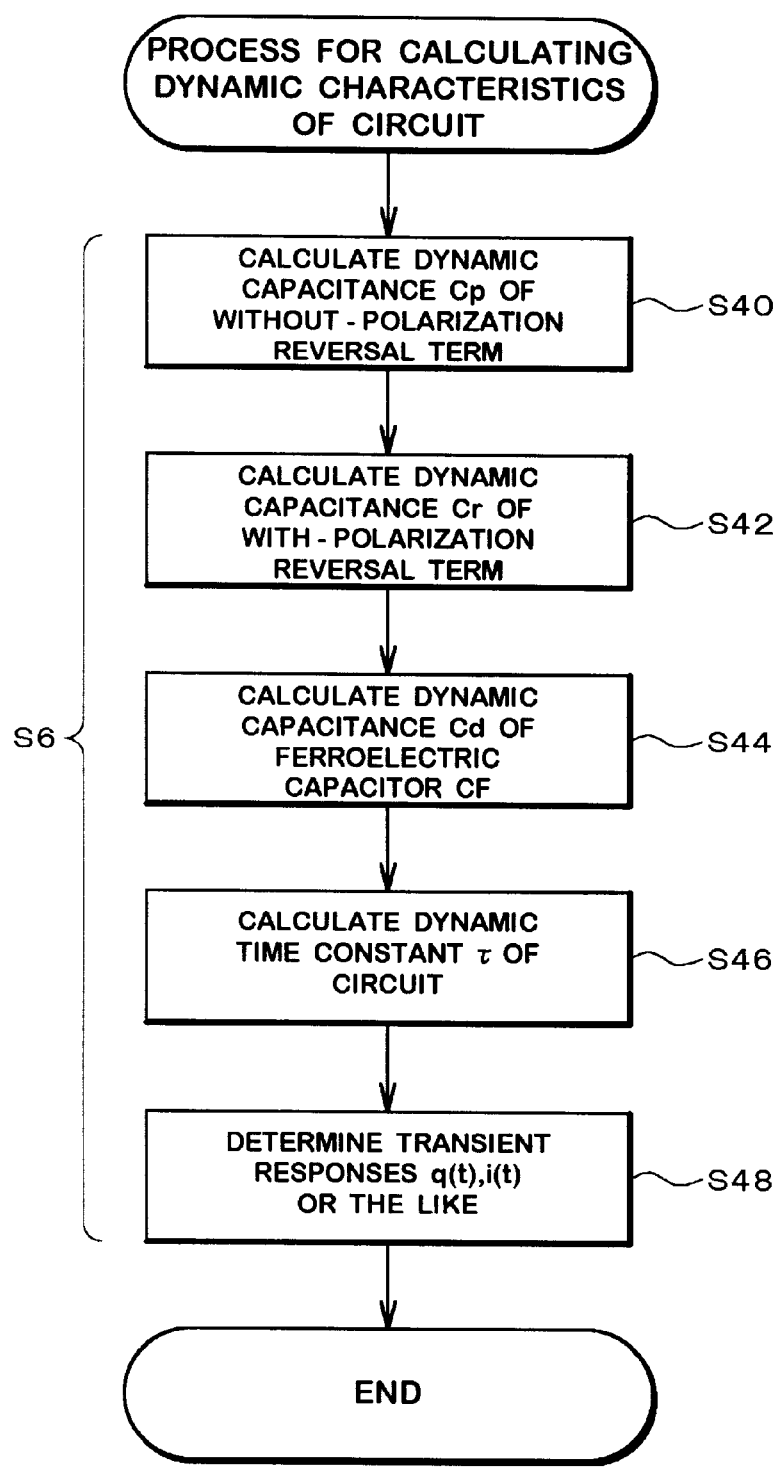
FIG. 7 is a flow chart describing detail of a process for calculating dynamic characteristics.
Figure 8:
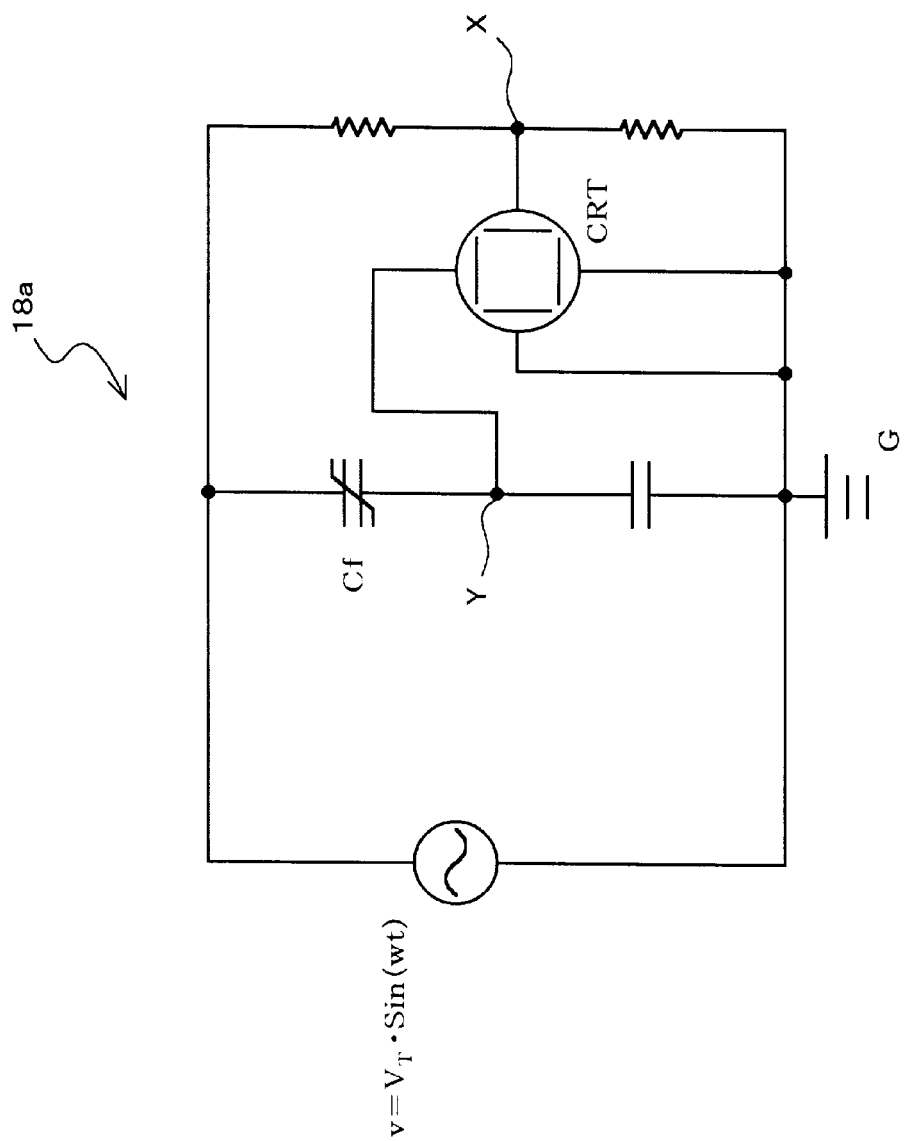

Each of FIG. 5, FIG. 6 and FIG. 7 is a flow chart describing detail of a process for extracting the characteristic constants, a flow chart describing detail of a process for calculating both the with-polarization reversal term and the without-polarization reversal term, and a flow chart describing detail of a process for calculating the dynamic characteristics.

All of the processes such as the process for extracting the characteristic constants, the process for calculating both the with-polarization reversal term and the without-polarization reversal term, and the process for calculating the dynamic characteristics can be performed as independent process instead of a series of the processes.

[Process for Extracting the Characteristic Constants]

Detail of the process for extracting the characteristic constants shown as the step S2 in FIG. 2 is described herein in accordance with both FIG. 3 and FIG. 5. In the process, a Sawyer-Tower circuit 18a is utilized as the measuring device 18. The ferroelectric capacitor Cf is installed in the Sawyer-Tower circuit 18a as the ferroelectric part. The CPU 6 obtains both maximum polarization charges Ps and remanent polarization charges Pr measured by the Sawyer-Tower circuit 18a both of which are used for determining the characteristic constants (FIG. 5, step S10).

Figure 9:
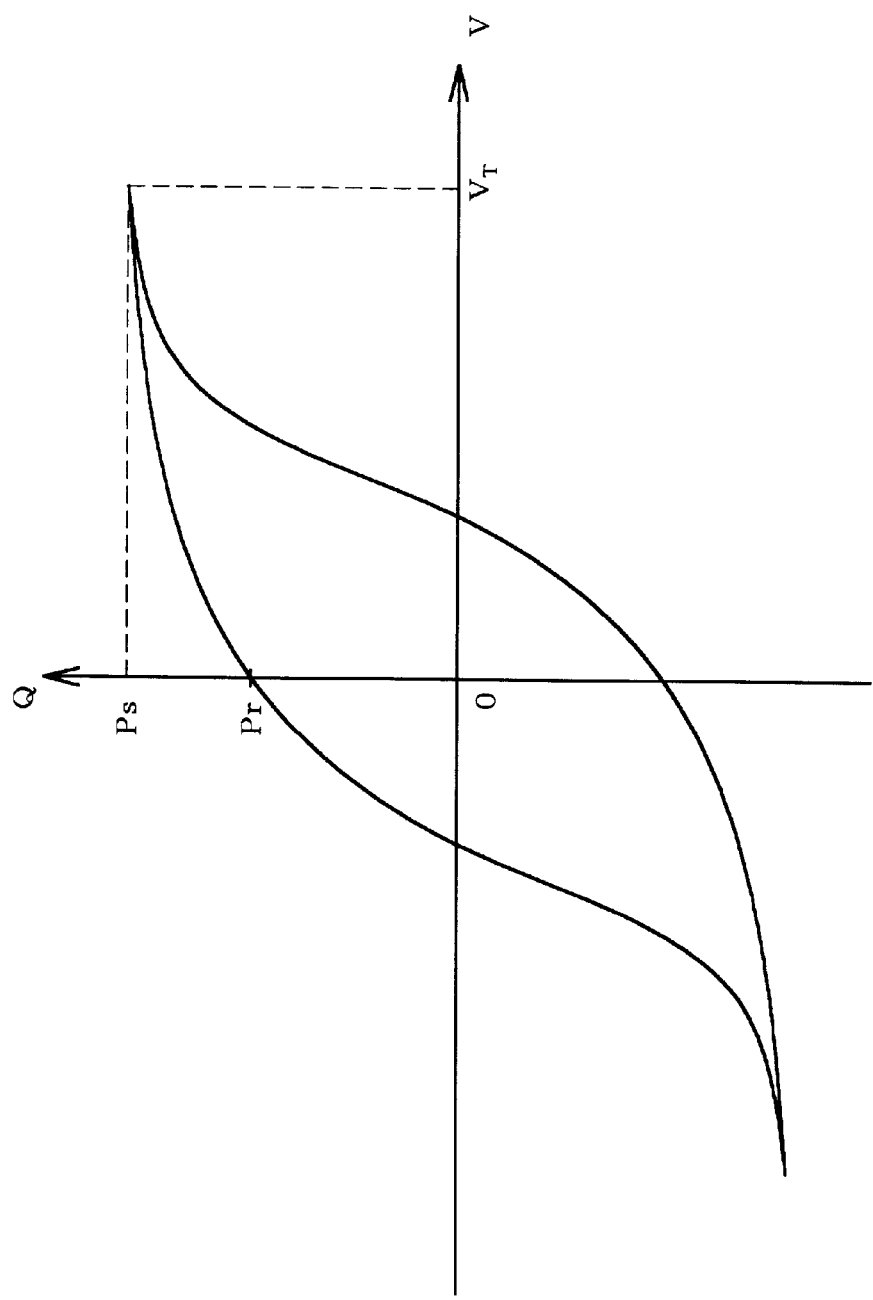

An alternating voltage v for extracting the characteristic constants which satisfies an equation v=$V_T$·sin($\omega$t) is applied to the Sawyer-Tower circuit 18a. A relationship between the alternating voltage v applied to the ferroelectric capacitor Cf and polarization charges Q charged therein is detected by measuring potentials generated at a point X and a point Y of the Sawyer-Tower circuit 18a. FIG. 9 is a graph illustrating the relationship between the alternating voltage v and the polarization charges Q displayed on another CRT equipped in the Sawyer-Tower circuit 18a.

In FIG. 9, the maximum polarization charges Ps represents polarization charges charged in the ferroelectric capacitor Cf when the maximum value of the alternating voltage (equivalent to the voltage amplitude of the alternating voltage v) $V_T$. The remanent polarization charges Pr represents another polarization charges charged in the ferroelectric capacitor Cf when the value of the alternating voltage is zero volt.

The CPU 6 controls the Sawyer-Tower circuit 18a through the I/O interface 16 as well as obtaining both the maximum polarization charges Ps and the remanent polarization charges Pr measured by the Sawyer-Tower circuit 18a when an alternating voltage having a variety of voltage amplitudes $V_T$ is applied thereto through the I/O interface 16.

Figure 10:
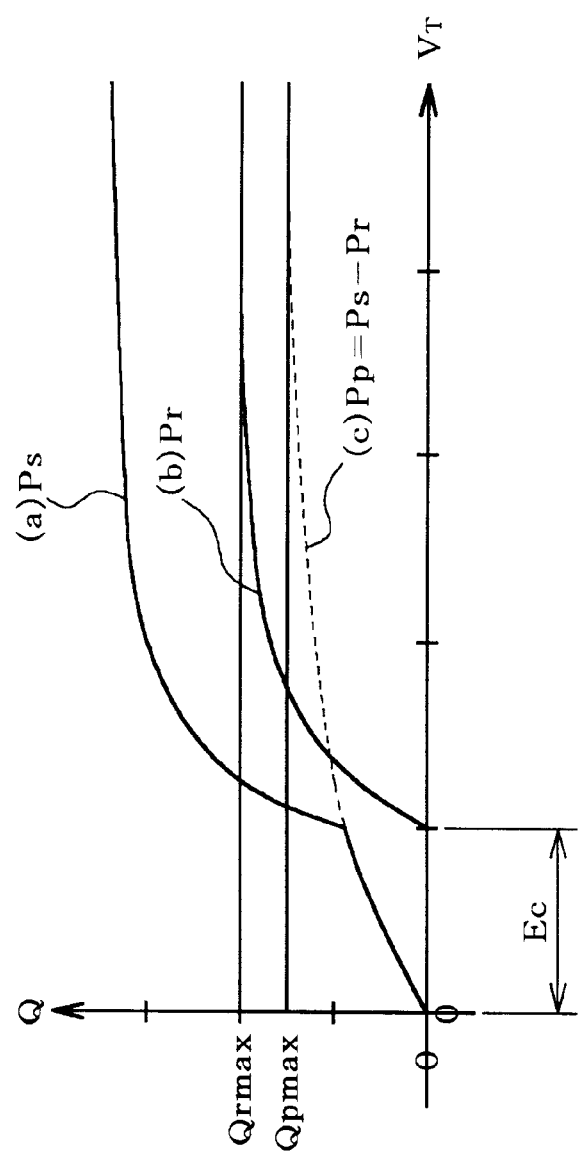

A curve (a) shown in FIG. 10 is a plotted curve illustrating a relationship between the voltage amplitudes $V_T$ and the maximum polarization charges Ps, both obtained in this step. Further a curve (b) shown in FIG. 10 is a plotted curve illustrating a relationship between the voltage amplitudes $V_T$ and the remanent polarization charges Pr, both obtained in this step.

Next, The CPU 6 performs a process for calculating the dielectric polarization charges Pp of the ferroelectric part in accordance with the data thus obtained (FIG. 5, step S12). The dielectric polarization charges Pp is calculated as a difference between the maximum polarization charges Ps and the remanent polarization charges Pr. Another curve (c) shown in FIG. 10 is a plotted curve illustrating a relationship between the voltage amplitudes $V_T$ and the dielectric polarization charges Pp.

All the relationships between the voltage amplitudes $V_T$ and the maximum polarization charges Ps, the relationship between the voltage amplitudes $V_T$ and the remanent polarization charges Pr, and another relationship between the voltage amplitudes $V_T$ and the dielectric polarization charges Pp are stored respectively in the hard disk 2 show in FIG. 3 which functions as a storing means.

Further, the CPU 6 performs a process for extracting the first characteristic constant Qpmax (FIG. 5, step S14). The first characteristic constant Qpmax is a characteristic constant corresponding to a saturation point of a saturation function composing the without-polarization reversal term fQp (saturated polarization charges in the without-polarization reversal term). In this case, the CPU 6 extracts the dielectric polarization charges Pp as the first characteristic constant Qpmax in accordance with the relationship between the voltage amplitudes $V_T$ and the dielectric polarization charges Pp being calculated in the previous step when a ratio for a variation of the dielectric polarization charges Pp to a variation of the voltage amplitudes $V_T$ is within a predetermined value.

In other words, a value of the dielectric polarization charges Pp illustrated as the curve (c) in FIG. 10 which has a gradient within a predetermined value (in this embodiment, for instance a gradient under 0.005) is selected as the first characteristic constant Qpmax.

Next, the CPU 6 performs a process for extracting the second characteristic constant Kp (FIG. 5, step S16). The second characteristic constant Kp is a characteristic constant corresponding to sensitivity of the saturation function composing the without-polarization reversal term fQp (sensitivity for the applied voltage of the without-polarization reversal term). In this case, the CPU 6 extracts the second characteristic constant Kp under an equation described below by utilizing both k representing a constant when the desired value of the dielectric polarization charges Pp thus obtained is described as a product of k and Qpmax, and $V_T$k describing the voltage amplitudes $V_T$ corresponding to the desired values of the dielectric polarization charges Pp, $$Kp = -\ln(1 - k \cdot Qpmax/Qpmax)/VTk$$
$$= -\ln(1-k)/VTk$$

when a condition of $0 \leq k \leq 1$ is satisfied.

In other words, the second characteristic constant Kp is calculated by assuming the curve (c) shown in FIG. 10 as a simple saturation function described in an equation below as well as substituting a set of values which satisfies a condition of (VT, Pp)=(VTk, k·Qpmax) out of a plurality of sets of ($V_T$, Pp) obtained in the step S12 into the equation, $$Pp=Qp\text{max}\{1-\exp(-Kp\cdot VT)\}$$

when a condition of VT≧0 is satisfied.

Further, the CPU 6 adjusts the second characteristic constant Kp thus extracted to minimize sum totals of absolute values of differences between function values of the saturation function (Pp in the equation (1)) thus estimated and the dielectric polarization charges Pp (values measured in the step S12) corresponding to the function values.

Next, the CPU 6 performs a process for extracting the third characteristic constant Qrmax (FIG. 5, step S18). The third characteristic constant Qrmax is a characteristic constant corresponding to a saturation point of a saturation function composing the with-polarization reversal term fQr (saturated polarization charges in the with-polarization reversal term). In this case, the CPU 6 extracts the remanent polarization charges Pr as the third characteristic constant Qrmax when a ratio for a variation of the remanent polarization charges Pr to a variation of the voltage amplitudes $V_T$ is within a predetermined value.

In other words, a value of the remanent polarization charges Pr illustrated as the curve (b) in FIG. 10 which has a gradient within a predetermined value (in this embodiment, for instance a gradient under 0.005) is selected as the third characteristic constant Qrmax.

Next, the CPU 6 performs a process for extracting the fifth characteristic constant Ec (FIG. 5, step S20). The fifth characteristic constant Ec is a characteristic constant corresponding to a starting point of the saturation function composing the with-polarization reversal term fQr (a voltage of reference coercive electric field). In this case, the CPU 6 extracts the fifth characteristic constant Ec under an equation described below by utilizing K1, VTk1, K2 and VTk2, the k1 representing a constant when remanent polarization charges Pr is described as a product of k1 and Qrmax, the VTk1 describing the voltage amplitudes $V_T$ corresponding to one of the desired values of the remanent polarization charges Pr, the K2 representing a constant when remanent polarization charges Pr is described as a product of k2 and Qrmax, and the VTk2 describing the voltage amplitudes $V_T$ corresponding to the other one of the desired values of the remanent polarization charges Pr, $$\begin{aligned}
Ec &= (VTk1\cdot\ln(1-k2\cdot Qr\text{max}/Qr\text{max})-\\
&\quad VTk2\cdot\ln(1-k1\cdot Qr\text{max}/Qr\text{max}))/\\
&\quad (\ln(1-k2\cdot Qr\text{max}/Qr\text{max})-\ln(1-k1\cdot Qr\text{max}/Qr\text{max}))\\
&= (VTk1\cdot\ln(1-k2)-VTk2\cdot\ln(1-k1))/\\
&\quad (\ln(1-k2)-\ln(1-k1))
\end{aligned}$$

when a condition of 0≦k1≦1, 0≦k2≦1, k1≠k2 is satisfied.

In other words, the fifth characteristic constant Ec is calculated by assuming the curve (b) shown in FIG. 10 as a simple saturation function described in an equation below as well as substituting two sets of values which satisfy conditions of (VT, Pr)=(VTk1, k1·Qrmax) and (VT, Pr)=(VTk2, k2·Qrmax) out of a plurality of sets of ($V_T$, Pr) obtained in the step S10 into the equations, $$Pr=Qr\text{max}[1-\exp\{-Kr(VT-Ec)\}]$$

when a condition VT≧Ec is satisfied.

Next, the CPU 6 performs a process for extracting the fourth characteristic constant Kr (FIG. 5, step S22). The fourth characteristic constant Kr is a characteristic constant used for calculating sensitivity of the saturation function composing the with-polarization reversal term fQr (sensitivities for applied voltages of the with-polarization reversal term). In this case, the CPU 6 extracts the fourth characteristic constant Kr under an equation described below by using the fifth characteristic constant Ec, and utilizing both k representing a constant when the remanent polarization charges Pr is described as a product of k and Qrmax, and $V_T$k describing the voltage amplitudes $V_T$ corresponding to the desired values of the remanent polarization charges Pr, $$Kr=-\ln(1-k)/(VTk-Ec)$$

when a condition of 0≦k≦1 is satisfied.

In other words, the fifth characteristic constant Kr is calculated by substituting the constant Ec calculated in the previous step and a set of values which satisfies a condition of (VT, Pr)=(VTk, k·Qrmax) out of a plurality of sets of ($V_T$, Pr) obtained in the step S10 into the equation (2) described in above.

Either of (VT, Pr)=(VTk1, k1·Qrmax) or (VT, Pr)=(VTk2, k2·Qrmax) can be used instead of (VT, Pr)=(VTk, k·Qrmax).

The CPU 6 adjusts the fourth characteristic constant Kr to minimize sum totals of absolute values of differences between function values of the saturation function (Pr in the equation (2)) thus estimated by using the third characteristic constant Qrmax, the fifth characteristic constant Ec and the fourth characteristic constant Kr as the saturation point, the starting point and the sensitivity thereof, and the remanent polarization charges Pr (values measured in the step S10) corresponding to the function values.

Thus, the process for extracting the characteristic constants is performed (see FIG. 4, step S2). The five (5) characteristic constants such as the first characteristic constant Qpmax, the second characteristic constant Kp, the third characteristic constant Qrmax, the fourth characteristic constant Kr and the fifth characteristic constant Ec extracted during the process are stored in the hard disk 2 shown in FIG. 3.

Although, both the second characteristic constant Kp and the fourth characteristic constant Kr once extracted are adjusted in this embodiment, these characteristic constants can be used without any adjustment. In this way, both the second characteristic constant Kp and the fourth characteristic constant Kr can determined in shorter period of time.

Further, though all the characteristic constants (five constants) are determined by calculation in this embodiment, at least one characteristic constant can be determined by eye-measurement using the curve (b) and the curve (c) shown in FIG. 10.

[Process for Calculating the With-polarization Reversal Term and the Without-polarization Reversal Term]

Details of the processes for calculating both the with-polarization reversal term and the without-polarization reversal term shown as the step S4 in FIG. 4 are described herein in accordance with both FIG. 3 and FIG. 6. As described above, both the without-polarization reversal term fQp and the with-polarization reversal term fQr are calculated in accordance with the first characteristic constant Qpmax, the second characteristic constant Kp, the third characteristic constant Qrmax, the fourth characteristic constant Kr and the fifth characteristic constant Ec all of which are extracted. The CPU 6 calculates the without-polarization reversal term fQp in accordance with the first characteristic constant Qpmax, the second characteristic constant Kp both stored in the hard disk 2 under equations described below, $$fQp = -Qp\max\{1-\exp(Kp \cdot v)\}$$

when a condition of v<0 is satisfied, and, $$fQp = Qp\max\{1-\exp(-Kp \cdot v)\}$$

when a condition of $0 \leq v$ is satisfied.

Figure 11:
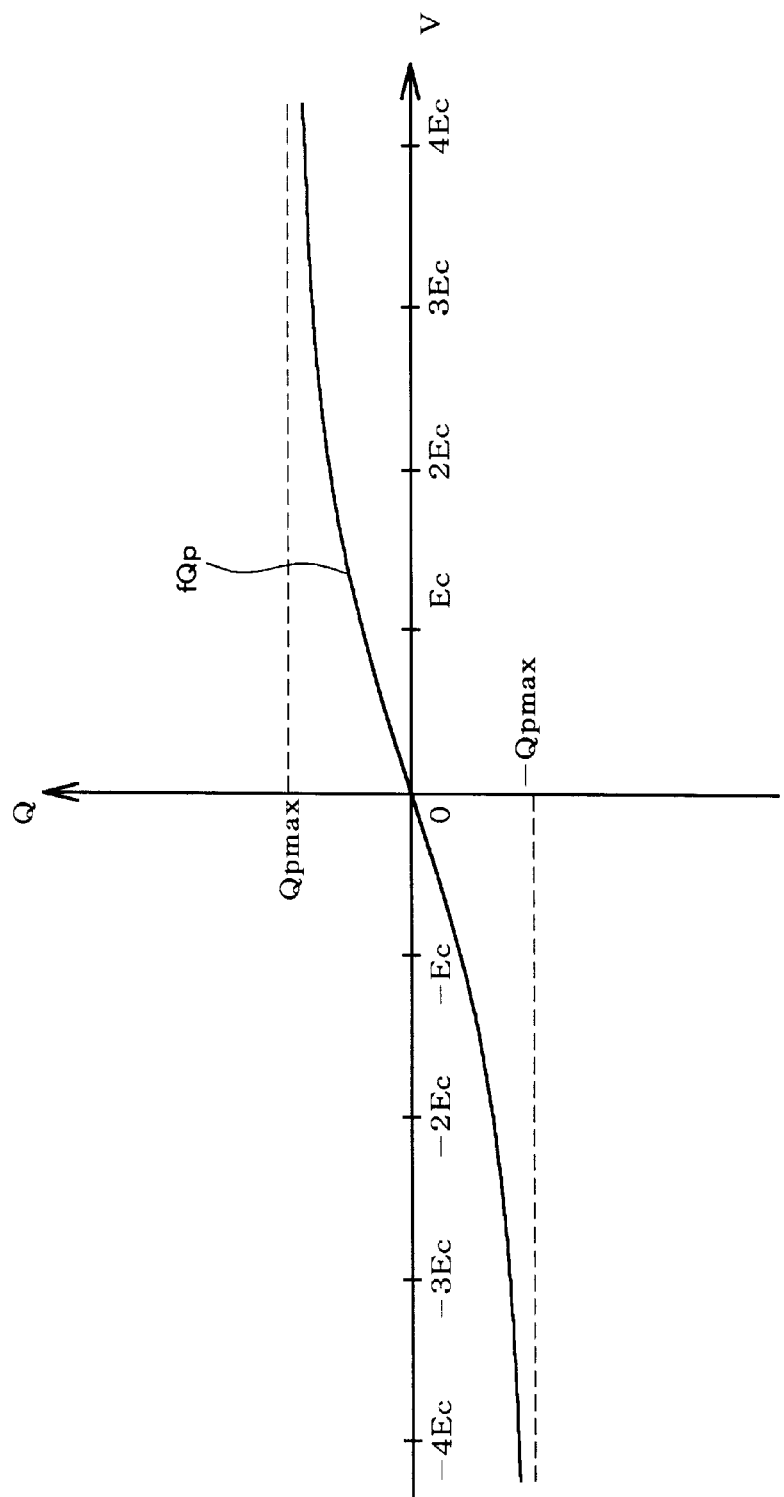
FIG. 11 is a graph illustrating the without-polarization reversal term fQp.

In other words, the CPU 6 calculates the without-polarization reversal term fQp as the saturation function by using the first characteristic constant Qpmax, the second characteristic constant Kp as both the saturation point and the sensitivity thereof respectively. FIG. 11 is a graph illustrating the without-polarization reversal term fQp thus calculated. As it is understood from a comparison between the equation (3) and the equation (1), a part of the without-polarization reversal term fQp is similar to the curve (c) shown in FIG. 10.

Next, the CPU 6 receives a number n defining the applied voltage v inputted by the keyboard 8 (FIG. 6, step S32). As described earlier, the voltages applied to the ferroelectric capacitor Cf are symmetric both in the positive state and the negative state in this embodiment. The number n is inputted for determining a range of the applied voltages to the ferroelectric capacitor Cf by utilizing the fifth characteristic constant Ec under a condition shown in below, $$-n \cdot Ec \leq v \leq n \cdot Ec$$

Then, the CPU 6 calculates the sensitivities Krn for applied voltages of the with-polarization reversal term in accordance with the inputted number n and the fourth characteristic constant Kr stored in the hard disk 2 under equations described below, $$Krn = Kr$$

when a condition of $1 \leq n < 2$ is satisfied, $$Krn = (n-1)Kr$$

when a condition of $2 \leq n$ is satisfied.

Figure 12:
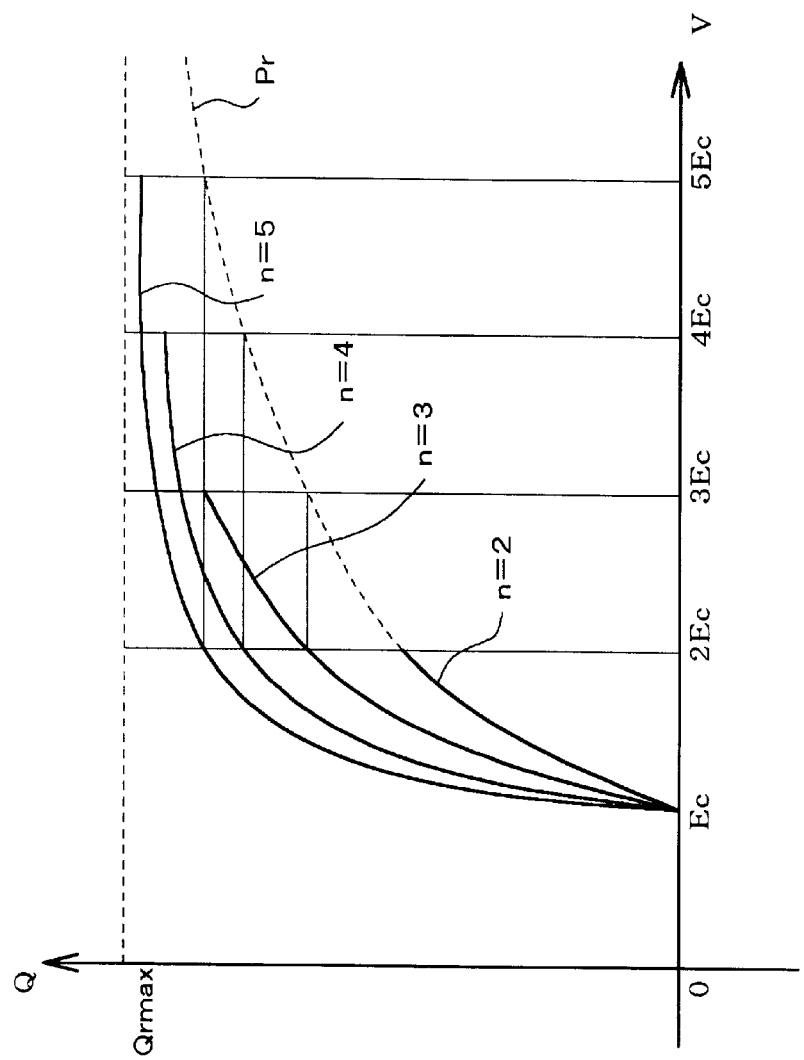
FIG. 12 is a graph illustrating a part of the with-polarization reversal term fQr plotted by utilizing sensitivities Kr2, Kr3, Kr4 and Kr5 for applied voltages of the with-polarization reversal term corresponding to numbers such as n=2, 3 and 5, the numbers defines the applied values of the applied voltages.

FIG. 12 is a graph illustrating a part of the with-polarization reversal terms fQr plotted by utilizing sensitivities Kr2, Kr3, Kr4 and Kr5 for the applied voltages of the with-polarization reversal terms corresponding to the numbers n such as two (2), three (3), four (4) and five (5) those defining values of the applied voltages. As it is recognized from FIG. 12, a part of the with-polarization reversal term fQr plotted by utilizing the sensitivity Kr2 is almost the same as a part of the curve (b) shown in FIG. 10. Further, a part of the with-polarization reversal terms fQr plotted by utilizing the sensitivities Kr3, Kr4 and Kr5 are almost the same as a part of the curve (b) shown in FIG. 10 when the curve (b) is compressed to one-half, one-third and one-fourth in a direction of an axis illustrating the voltage.

As it is understood from the equation described above, a condition of sensitivities Krn equal to the fourth characteristic constant Kr is satisfied, regardless of value of the number n when another condition of n is greater than or equal to a and less than 2 is satisfied.

Next, the CPU 6 performs a process for calculating both the first with-polarization reversal term fQr1 and the second with-polarization reversal term fQr2 used as a function of the applied voltage under an equations described below (hereinafter referred to as equation (4)) in accordance with the third characteristic constant Qrmax, and the fifth characteristic constant Ec both stored in the hard disk 2, and the sensitivities Krn calculated in the previous (FIG. 6, step S36), $$fQr1 = -Qr\max[1-\exp\{Krn \cdot (-(n-1)Ec)\}]$$

when a condition of $-n \cdot Ec \leq v < -(n-2)Ec$ is satisfied, $$fQr1 = -Qr\max[1-\exp\{Krn(v-Ec)\}]$$

when a condition of $-(n-2)Ec \leq v < Ec$ is satisfied, $$fQr1 = Qr\max[1-\exp\{-Krn(v-Ec)\}]$$

when a condition of $Ec \leq v \leq n \cdot Ec$ is satisfied, $$fQr2 = -Qr\max[1-\exp\{Krn(v+Ec)\}]$$

when a condition of $-n \cdot Ec \leq v < -Ec$ is satisfied, $$fQr2 = Qr\max[1-\exp\{-Krn(v+Ec)\}]$$

when a condition of $-Ec \leq v \leq (n-2)Ec$ is satisfied, $$fQr2 = Qr\max[1-\exp\{-Krn \cdot (n-1)Ec\}] \qquad \text{equation (4).}$$

when a condition of $(n-2)Ec \leq v \leq n \cdot Ec$ is satisfied

Figure 13:
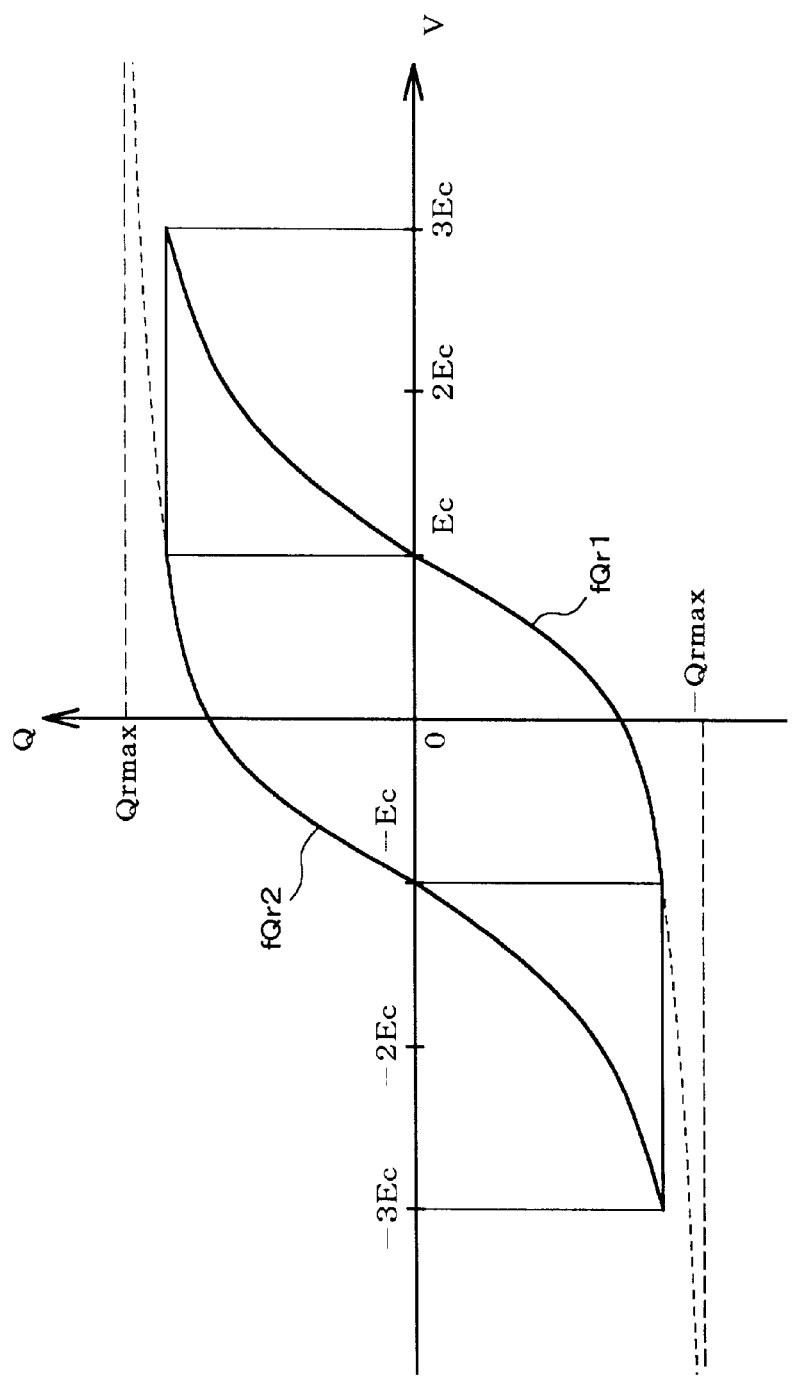
FIG. 13 is a graph illustrating both a first with-polarization reversal term fQr1 and a second with-polarization reversal term fQr2 when the number defining the applied voltage is 3.

In other words, the CPU 6 calculates the with-polarization reversal term fQr as a function including the saturation function using the third characteristic constant Qrmax, the fifth characteristic constant Ec and the fourth characteristic constant Kr as the saturation point, the starting point and the sensitivity of the saturation function respectively. FIG. 13 is a graph illustrating both the first with-polarization reversal term fQr1 and the second with-polarization reversal term fQr2 when the number n defining the applied voltage is 3.

In this way, the process for calculating both the without-polarization reversal term and the with-polarization reversal term (see FIG. 4, step S4) is performed. The without-polarization reversal term fQp, the sensitivities Krn, the first with-polarization reversal term fQr1 and the second with-polarization reversal term fQr2 all of which calculated in the step S4 can be stored in the hard disk 2 (see FIG. 3).

A hysteresis loop fQd composed of both the first hysteresis curve fQd1 and the second hysteresis curve fQd2 is calculated under equations described below in accordance with the without-polarization reversal term fQp calculated in the earlier step, the first hysteresis curve fQd1 and the second hysteresis curve fQd2, $$fQd1 = fQp + fQr1$$

$$fQd2 = fQp + fQr2$$

Figure 14:
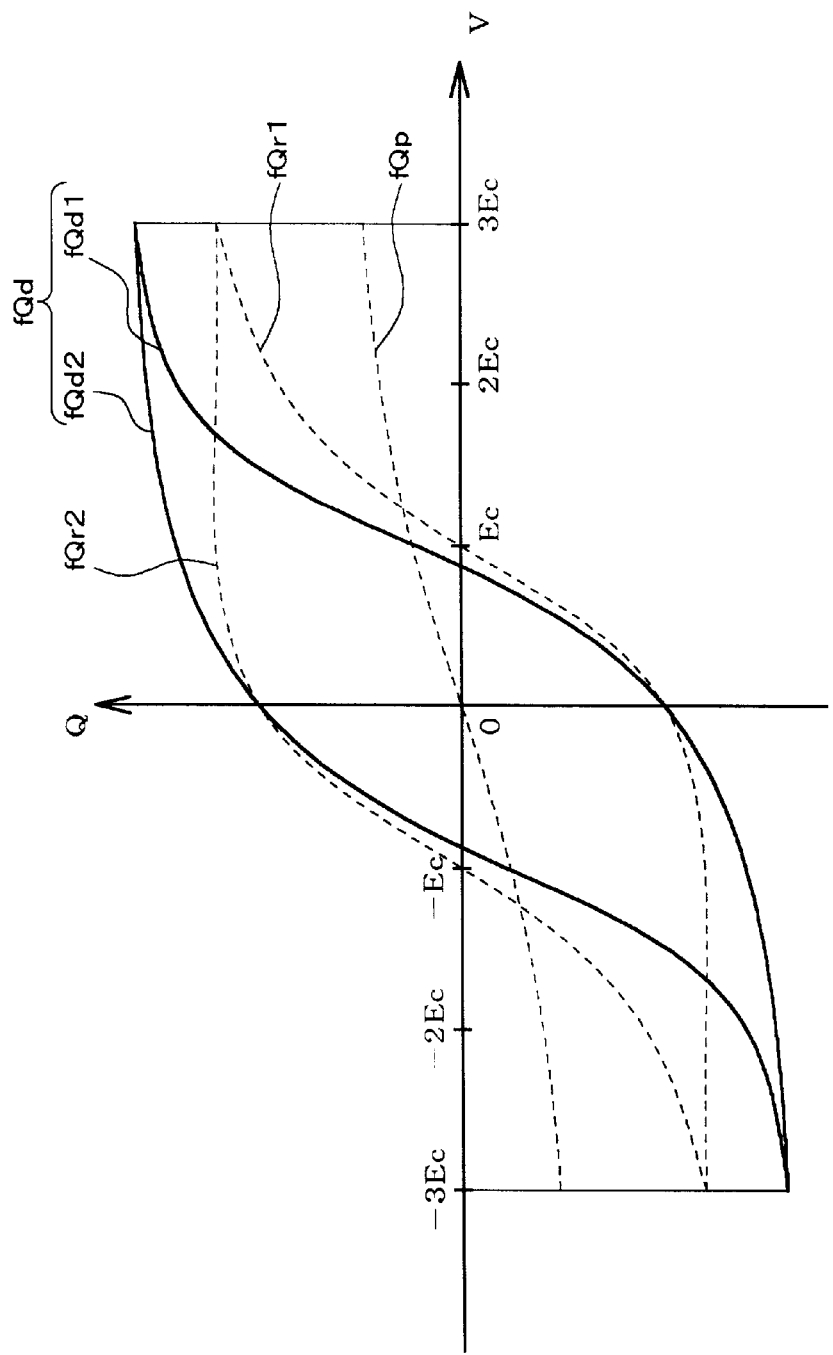
FIG. 14 is a graph illustrating a hysteresis loop made of both a first hysteresis curve fQd1 and a second hysteresis curve fQd2 when the number defining the applied voltage is 3.

FIG. 14 is a graph illustrating a hysteresis loop composed of both the first hysteresis curve fQd1 and the second hysteresis curve fQd2 when the number n defining the applied voltage is 3.

Another hysteresis loop can be plotted even when the number n is other value such as two, three over two (3/2) and the like. Also, The hysteresis loop can be plotted in the same way even when the voltages applied to the ferroelectric part are not symmetric. This is because the five (5) characteristic constants as to the ferroelectric capacitor Cf are determined as inherent constants regardless of whether the applied voltages are symmetric or not.

[Process for Calculating Dynamic Characteristics of the Circuit]

Detail of the process for calculating dynamic characteristics of the circuit shown in step S6 of FIG. 4 is described in accordance with both FIG. 3 and FIG. 7. As described earlier, the dynamic characteristics of the circuit including the ferroelectric capacitor Cf are calculated in accordance with the hysteresis of the ferroelectric capacitor Cf represented by both the without-polarization reversal term fQp and the with-polarization reversal term fQr in the process for calculating dynamic characteristics.

[Calculation of the Dynamic Capacitance]

The dynamic capacitance of the ferroelectric capacitor Cf are calculated during the steps shown as step S40 to step S44 in FIG. 7.

In general, capacitance of the capacitor are described in a value calculated by differentiating electric charges charged in the capacitance with voltages applied thereto. The electric charges of the ferroelectric capacitor Cf that is equivalent to the polarization charges thereof shown as the hysteresis loop fQd to the applied voltages is in a nonlinear shape as shown in FIG. 14. Hence, the capacitance of the ferroelectric capacitor Cf is varied, so that it is described as a function of the voltage v. The capacitance thus varied is referred to as the dynamic capacitance Cd.

Further, the hysteresis loop fQd of the ferroelectric capacitor Cf can be described as a sum of both the without-polarization reversal term fQp and the with-polarization reversal term fQr as shown in FIG. 14. In this embodiment, the dynamic capacitance Cd of the ferroelectric capacitor Cf is determined by calculating both the dynamic capacitance Cp of the without-polarization reversal term corresponding to the without-polarization reversal term fQp and the dynamic capacitance Cr of the with-polarization reversal term corresponding to the with-polarization reversal term fQr separately with each other, and then composes both the dynamic capacitance Cp and the dynamic capacitance Cr.

The CPU 6 performs a process for calculating the dynamic capacitance Cp of the without-polarization reversal term of the ferroelectric capacitor Cf by differentiating the without-polarization reversal term fQp calculated earlier (see equation (3)) with the voltages v applied to the ferroelectric capacitor Cf (FIG. 7, step S40).

The dynamic capacitance Cp is calculated under an equation described below, $$Cp = d\,fQp/dv$$
$$= Qpmax \cdot Kp \cdot \exp(Kp \cdot v)$$

when a condition of $v<0$ is satisfied, $$Cp = d\,fQp/dv$$
$$= Qpmax \cdot Kp \cdot \exp(-Kp \cdot v)$$

when a condition of $0 \leq v$ is satisfied.

Thereafter, the CPU 6 calculates the dynamic capacitance Cr of the with-polarization reversal term of the ferroelectric capacitor Cf composed of both the dynamic capacitance Cr1 of the first with-polarization reversal term corresponding to the first with-polarization reversal term fQr1, and the dynamic capacitance Cr2 of the second with-polarization reversal term corresponding to the second with-polarization reversal term fQr2 by differentiating the with-polarization reversal term fQr (see equation (4)) with the voltage v applied to the ferroelectric capacitor Cf (FIG. 7, step S42).

The dynamic capacitance Cr is calculated under an equation described below, $$Cr1 = d\,fQr1/dv$$
$$= 0$$

when a condition of $-n \cdot Ec \leq v < -(n-2)Ec$ is satisfied, $$Cr1 = d\,fQr1/dv$$
$$= Qrmax \cdot Krn \cdot \exp\{Krn(v - Ec)\}$$

when a condition of $-(n-2)Ec \leq v < Ec$ is satisfied, $$Cr1 = d\,fQr1/dv$$
$$= Qrmax \cdot Krn \cdot \exp\{-Krn(v - Ec)\}$$

when a condition of $Ec \leq v \leq n \cdot Ec$ is satisfied, $$Cr2 = d\,fQr2/dv$$
$$= Qrmax \cdot Krn \cdot \exp\{Krn(v + Ec)\}$$

when a condition of $-n \cdot Ec \leq v < -Ec$ is satisfied, $$Cr2 = d\,fQr2/dv$$
$$= Qrmax \cdot Krn \cdot \exp\{-Krn(v + Ec)\}$$

when a condition of $-Ec \leq v \leq (n-2)Ec$ is satisfied, $$Cr2 = d\,fQr2/dv$$
$$= 0$$

when a condition of $(n-2)Ec \leq v \leq n \cdot Ec$ is satisfied

Next, the CPU 6 calculates the dynamic capacitance Cd of the ferroelectric capacitor Cf composed of both first dynamic capacitance Cd1 and second dynamic capacitance Cd2 by composing the dynamic capacitance Cp of the without-polarization reversal term (see the equation (6)) and the dynamic capacitance Cr of the with-polarization reversal term (see the equation (7)) calculated in both the previous step and the step ahead of it under equations described in below (FIG. 7, step S44), $$Cd1 = Cp + Cr1 \qquad \text{equation (8)}$$
$$= d\,fQp/dv + d\,fQr1/dv$$
$$Cd2 = Cp + Cr2$$
$$= d\,fQp/dv + d\,fQr2/dv.$$

Figure 15:
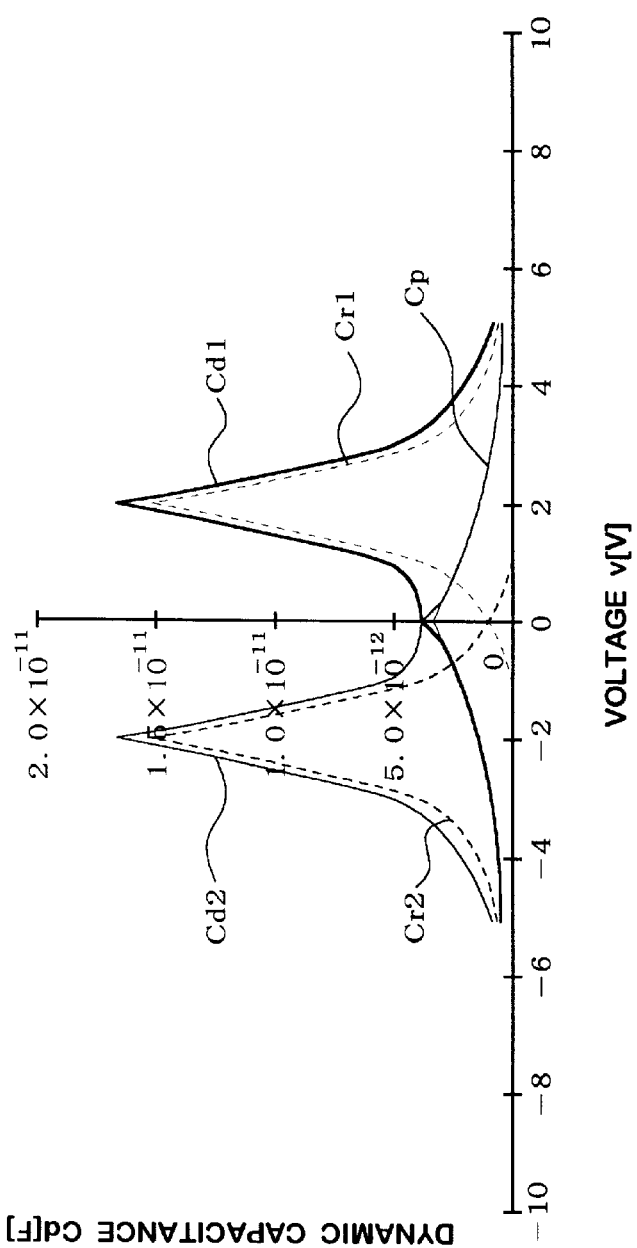
FIG. 15 is a graph illustrating dynamic capacitance Cp of a without-polarization reversal term, dynamic capacitance Cr1 of the first with-polarization reversal term, dynamic capacitance Cr2 of the second with-polarization reversal term, first dynamic capacitance Cd1 and second dynamic capacitance Cd2.

FIG. 15 is a graph illustrating the dynamic capacitance Cp of the without-polarization reversal term, the dynamic capacitance Cr1 of the first with-polarization reversal term, the dynamic capacitance Cr2 of the second with-polarization reversal term, and both the first dynamic capacitance Cd1 and the second dynamic capacitance Cd2 calculated as a sum of the CP, Cr1 and the Cr2.

FIG. 15 is a graph plotted by setting the characteristic constants as follows, $Qr\max=25(\mu C/cm^2)$ $Qp\max=20(\mu C/cm^2)$ $Ec=2$(volts)

$Ec+1/Kr=3$(volts)

$1/Kp=3$(volts)

wherein n equal to 2.5 (that is amplitude $V_{IN}$ of the applied voltage v is 5 (volts)).

As shown in FIG. 14, the polarization charges of the ferroelectric capacitor Cf illustrated in a hysteresis loop fQd have two different values such as the first hysteresis curve fQd1 and the second hysteresis curve fQd2 depending upon the hysteresis of the applied voltages v. In other words, the polarization charges shows a hysteresis loop. Thus, the dynamic capacitance Cd of the ferroelectric capacitor Cf show two different curves such as the first dynamic capacitance Cd1 and the second dynamic capacitance Cd2 as shown in FIG. 15 depending upon hysteresis of the voltages applied thereto.

Figure 16:
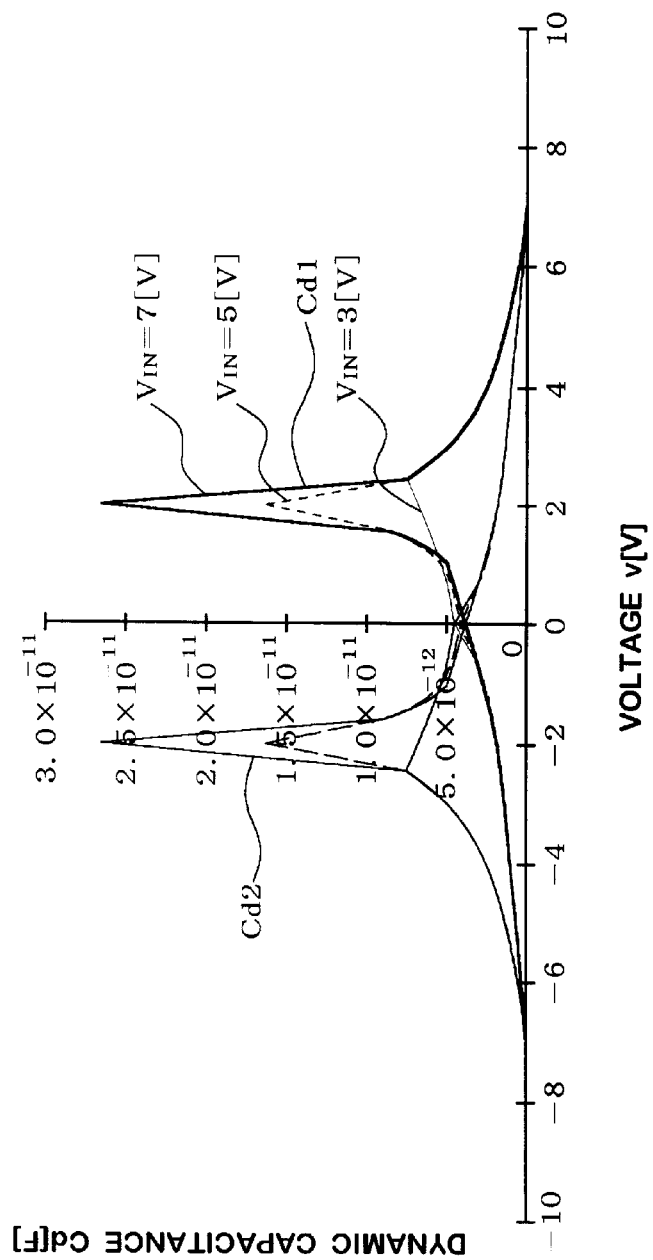
FIG. 16 is a graph illustrating both the first dynamic capacitance Cd1 and the second dynamic capacitance Cd2 each of which is calculated in accordance with various numbers n defining the applied voltages and comparing results of the calculation.

FIG. 16 is a graph illustrating both the first dynamic capacitances Cd1 and the second dynamic capacitances Cd2 each of which is calculated in accordance with various numbers n which will be described below, and comparing results of the calculation. The values of the characteristic constants used for plotting FIG. 16 are the same as the values used for FIG. 15.

n equal to 3.5 (that is the amplitude $V_{IN}$ of the applied voltage v is 7 (volts)), n equal to 2.5 (that is the amplitude $V_{IN}$ of the applied voltage v is 5 (volts)), and n equal to 1.5 (that is the amplitude $V_{IN}$ of the applied voltage v is 3 (volts))

Figure 17:
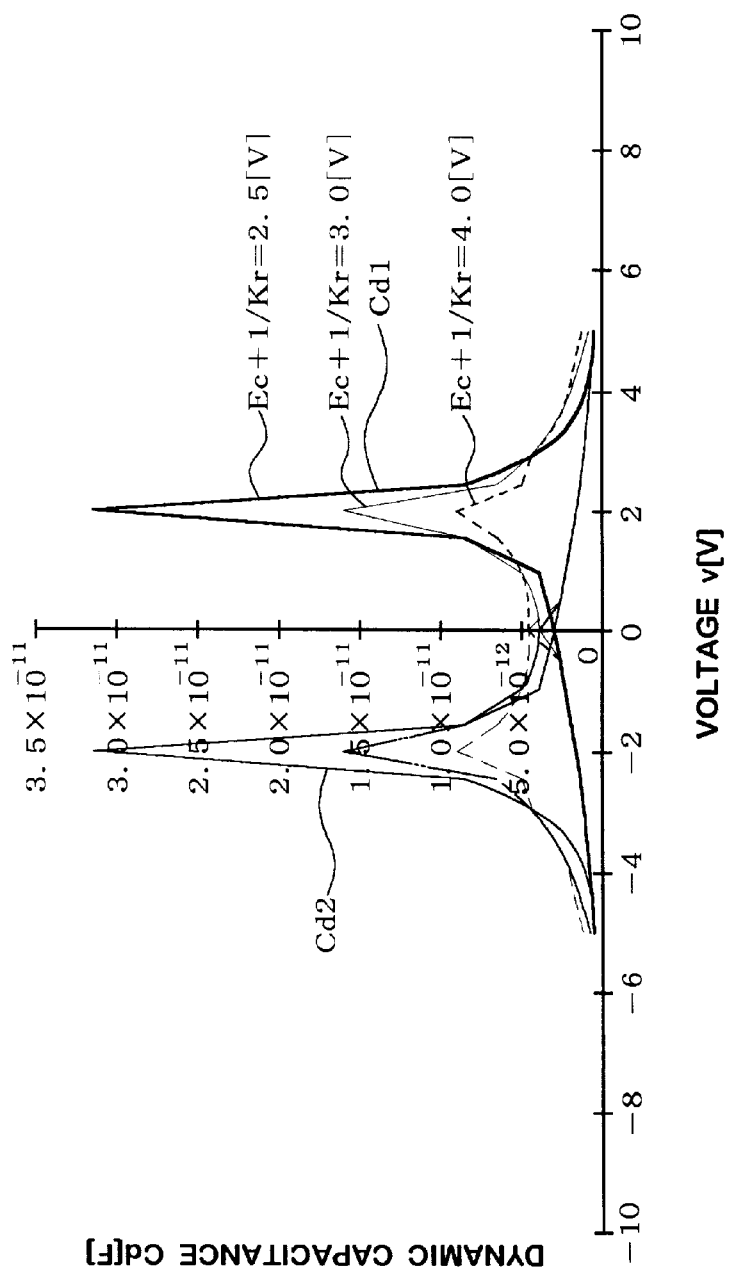
FIG. 17 is another graph illustrating both the first dynamic capacitance Cd1 and the second dynamic capacitance Cd2 each of which is calculated in accordance with various characteristic constants Kr, and comparing results of the calculation.

Further, FIG. 17 is another graph illustrating both the first dynamic capacitances Cd1 and the second dynamic capacitances Cd2 each of which is calculated in accordance with various values of Ec and one over Kr (just the fourth characteristic constant Kr is varied, and the fifth characteristic constant Ec is fixed at 2 volts) which will be described below, and comparing results of the calculation. The values of the characteristic constants except for the fourth characteristic constant Kr and the fifth characteristic constant Ec and the number n used for plotting FIG. 17 are the same as the values used for FIG. 15.

$Ec+1/Kr=2.5$ (volts)

$Ec+1/Kr=3.0$ (volts)

$Ec+1/Kr=4.0$ (volts)

[Process for Calculating Dynamic Time Constants, and Process for Determining Transient Responses]

Next, a process for calculating the dynamic time constants τ of the circuit including the ferroelectric capacitor Cf (FIG. 7, step S46), and a process for determining the transient responses (q(t), i(t) or the like) will be described (FIG. 7, step S48).

Figure 18:
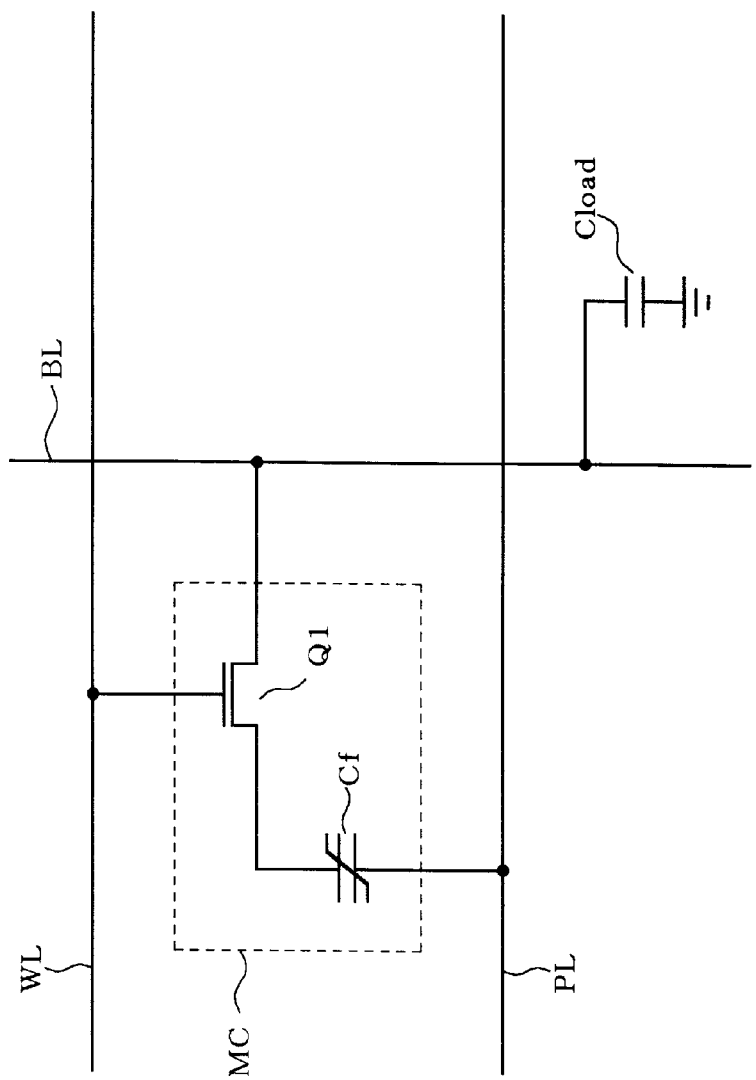
FIG. 18 is a circuit diagram of a memory cell MC and periphery thereof composing a ferroelectric memory device.

An example of the circuit including the ferroelectric capacitor Cf is shown in FIG. 18. FIG. 18 is a circuit diagram of a memory cell MC and periphery thereof composing the ferroelectric memory device. The memory cell MC comprises both the ferroelectric capacitor Cf for storing data corresponding to polarization states and a selector transistor Q1 for selecting the memory cell MC, so that the memory cell MC is referred to as a one-transistor and one-capacitor type memory cell.

One end of the ferroelectric capacitor Cf is connected to a plate line PL, and the other end of the ferroelectric capacitor Cf is connected to a bit line BL through the selector transistor Q1. Further, a load capacitor Cload for read-out operation is connected to the bit line BL. Further, a gate of the selector transistor Q1 is connected to a word line WL.

Figure 19:
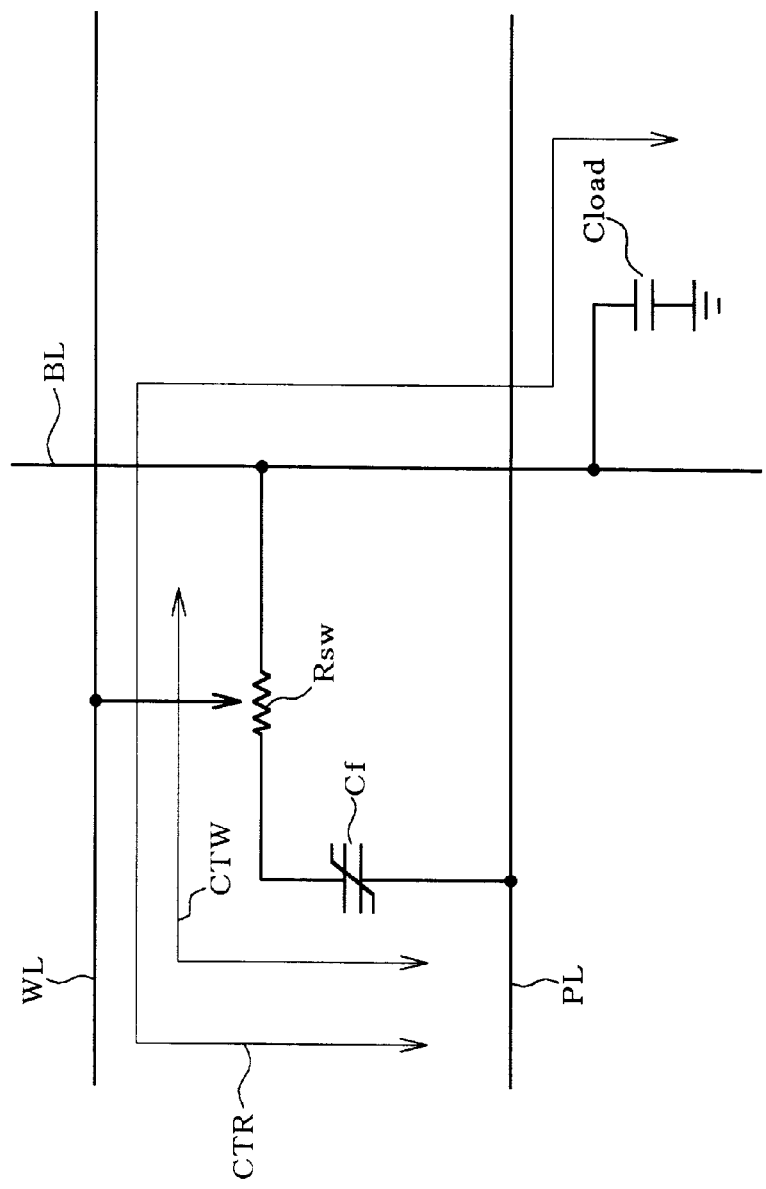
FIG. 19 is a diagram of an equivalent circuit of the circuit shown in FIG. 18.

FIG. 19 is a diagram showing a simplified equivalent circuit of the memory cell MC shown in FIG. 18 for determining the transient responses during the read-out operation and write-operation to the memory cell MC. An electric resistance during the ON-state of the selector transistor Q1 is expressed as a resister $R_{SW}$. In this embodiment, the resister $R_{SW}$ is fixed at a certain value as a reason of convenience for description.

In the write-operation, a voltage for writing data is applied between the plate line PL and the bit line BL. The voltage for writing data is applied to both the ferroelectric capacitor Cf and the resister $R_{SW}$ connected in series.

On the contrary, a voltage for reading out data is applied between the plate line PL and the ground G after making the bit line BL into floating state when read-out operation is performed. Thus, the voltage for reading out data is applied to all the ferroelectric capacitor Cf, the electric resistance $R_{SW}$ and the load capacitor Cload connected in series.

In other words, two different circuits are formed during the read-out operation and the write-operation. The process for determining the transient responses of the circuit including the ferroelectric capacitor Cf corresponding to write operation is described herein.

[Write-operaiton]

The CPU 6 calculates the dynamic time constants τ of a circuit CTW including the ferroelectric capacitor Cf (the circuit shown in FIG. 19 which connecting the ferroelectric capacitor Cf and the resister $R_{SW}$ in series) (FIG. 7, step S46) in accordance with the dynamic capacitance Cd (see equation (8)) of the ferroelectric capacitor Cf thus calculated. Further, the CPU 6 determines the transient responses (q(t), i(t) or the like) of the circuit CTW in accordance with the dynamic time constants τ thus calculated (FIG. 7, step S48).

A method for calculating both the dynamic time constants τ and the transient responses during the write-operation is described herein in detail. As described earlier, the capacitance of the ferroelectric capacitor Cf (the dynamic capacitance Cd) are varied in accordance with a variation of the voltages applied thereto, and varying depend on the hysteresis of the applied voltages v. In this way, time constant of the circuit CTW including the ferroelectric capacitor Cf is varied in accordance with the variation of the voltages applied thereto and depend on the hysteresis of the applied voltages v. The time constant is referred to as the dynamic time constants τ. Further, the transient responses of the circuit CTW are also varied in accordance with the hysteresis of the applied voltages v since the dynamic time constants τ of the circuit CTW are varied depend upon the hysteresis of the applied voltages v.

The dynamic time constants τ of the circuit CTW are calculated as a product of the resister $R_{SW}$ and the dynamic capacitance Cd of the ferroelectric capacitor Cf shown in the equation (8) under an equation shown in below, $\tau = R_{SW} \cdot Cd$     equation (9).

The response time dtj corresponding to a variation of the polarization charges charged in the ferroelectric capacitor Cf is determined in accordance with the dynamic time constants τ thus calculated when the applied voltages v correspond to voltages vj (hereinafter referred to as transient voltage vj).

Figure 20:
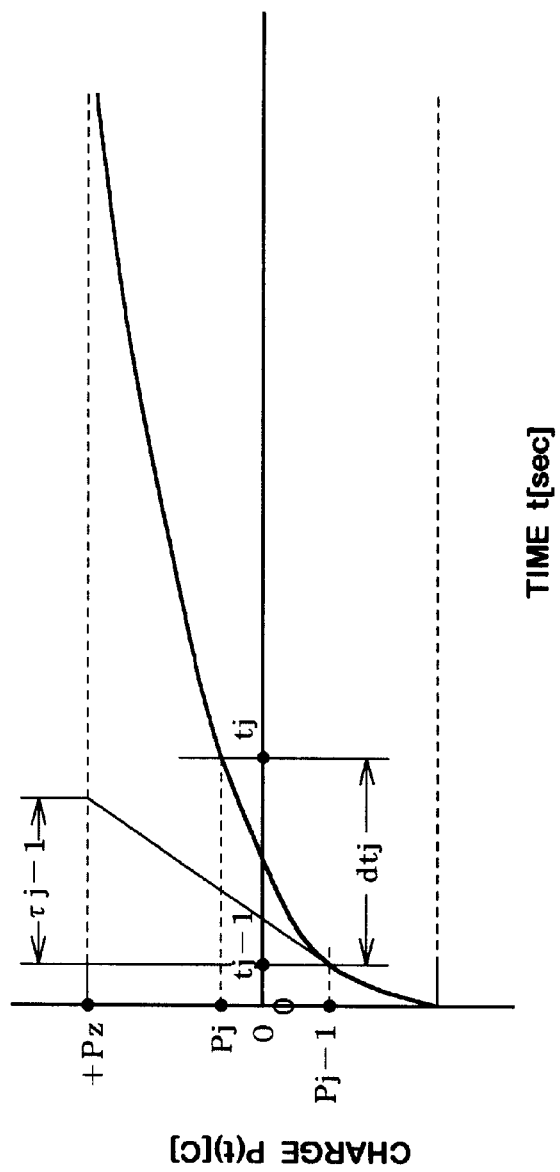
FIG. 20 is a graph for describing an approximate equation for determining response time dtj.

Response for charges having a relationship shown in FIG. 20 is assumed as the transient responses of the circuit CTW. The value of the polarization charges P(t) is headed for a value of polarization charge Pz (the value of the polarization charges reaches the value Pz when the infinitive period has been passed).

Further, the dynamic time constants of the circuit CTW at a time tj−1 (correspond to a time detecting the transient voltage vj−1) is assumed as τj−1, and assuming the polarization charges of the ferroelectric capacitor Cf at the time as Pj−1. Also, the dynamic time constants of the circuit CTW at a time tj (corresponding to a time detecting the transient voltage vj) elapsing of the duration dtj from the time tj−1 is assumced τj, and assuming the polarization charges of the ferroelectric capacitor Cf at the time as Pj as shown in FIG. 20.

The response time dtj can be calculated by an approximate equation described below utilizing FIG. 20. The response time dtj correspond to a variation of the polarization charges within a range of the polarization charges Pj−1 to Pj charged in the ferroelectric capacitor Cf when the transient voltage vj (a transient voltage correspond to the time tj) is applied thereto, $$dtj = -\tau j \cdot 1 \cdot \ln((Pz-Pj)/(Pz-Pj-1)) \qquad \text{equation (10).}$$

The CPU 6 determines the transient responses of the circuit including the ferroelectric capacitor Cf by determining a relationship between factors of time bases dtj and response values (the response values corresponds to the transient voltage vj) corresponding to the factors dtj. Before determining the transient responses of the circuit, the CPU 6 performs calculation of the response time dtj when the transient voltage vj is applied in accordance with the equation (10) described above, and performs setting of the time bases (such as dt1, dt2 . . . , dtj−1, dtj, dtj+1, . . . , and ∞) by using the response time dtj as the factor thereof.

Polarization charge q(tj) charged in the ferroelectric capacitor Cf and a value of a current i(tj) flowing through the circuit CTW can be the response values corresponding to the factors of time bases dtj or the transient voltage vj. The polarization charge q(tj) charged in the ferroelectric capacitor Cf can be calculated as the value of the hysteresis loop fQd by the equation (3), the equation (4) and the equation (5) when the voltage v is equal to vj.

Further, the current value i (tj) flowing through the circuit CTW will be described as an equation shown in below when a voltage having a step shaped waveform is expressed as E, $$i(tj)=(E-vj)/R_{SW} \qquad \text{equation (11).}$$

The transient responses corresponding to a voltage E (a range of which is $-V_{IN}$ to $+V_{IN}$) having a step shaped waveform to the circuit CTW can be calculated as described below.

Dynamic time constants τa (as τ) of the circuit CTW at a time ta (as t) can be calculated under an equation described below in accordance with the equation (9), $$\tau a = R_{SW} \cdot Cda$$

The Cda used in the above equation describes the dynamic capacitance of the ferroelectric capacitor Cf corresponding to a transient voltage value va applied at the time ta. The dynamic capacitance Cda is calculated by conducting a calculation of the first dynamic capacitance Cd1 in the equation (8) when the voltage v equal to the transient voltage value va.

Factors of time bases dta (as dtj) can be calculated under an equation described below when the polarization charges Pz to be headed for used in the equation (10) is equivalent to the maximum polarization charges Ps, $$dta = -\tau a \cdot 1 \cdot \ln((Ps-Pa)/(Ps-Pa-1))$$

Polarization charge q(ta) charged in the ferroelectric capacitor Cf corresponding to the factors of time bases dta or the transient voltage value va can be calculated as the value of the first hysteresis curve fQd1 by the equation (3), the equation (4) and the equation (5) when the voltage v is equal to the voltage va.

Figure 21:
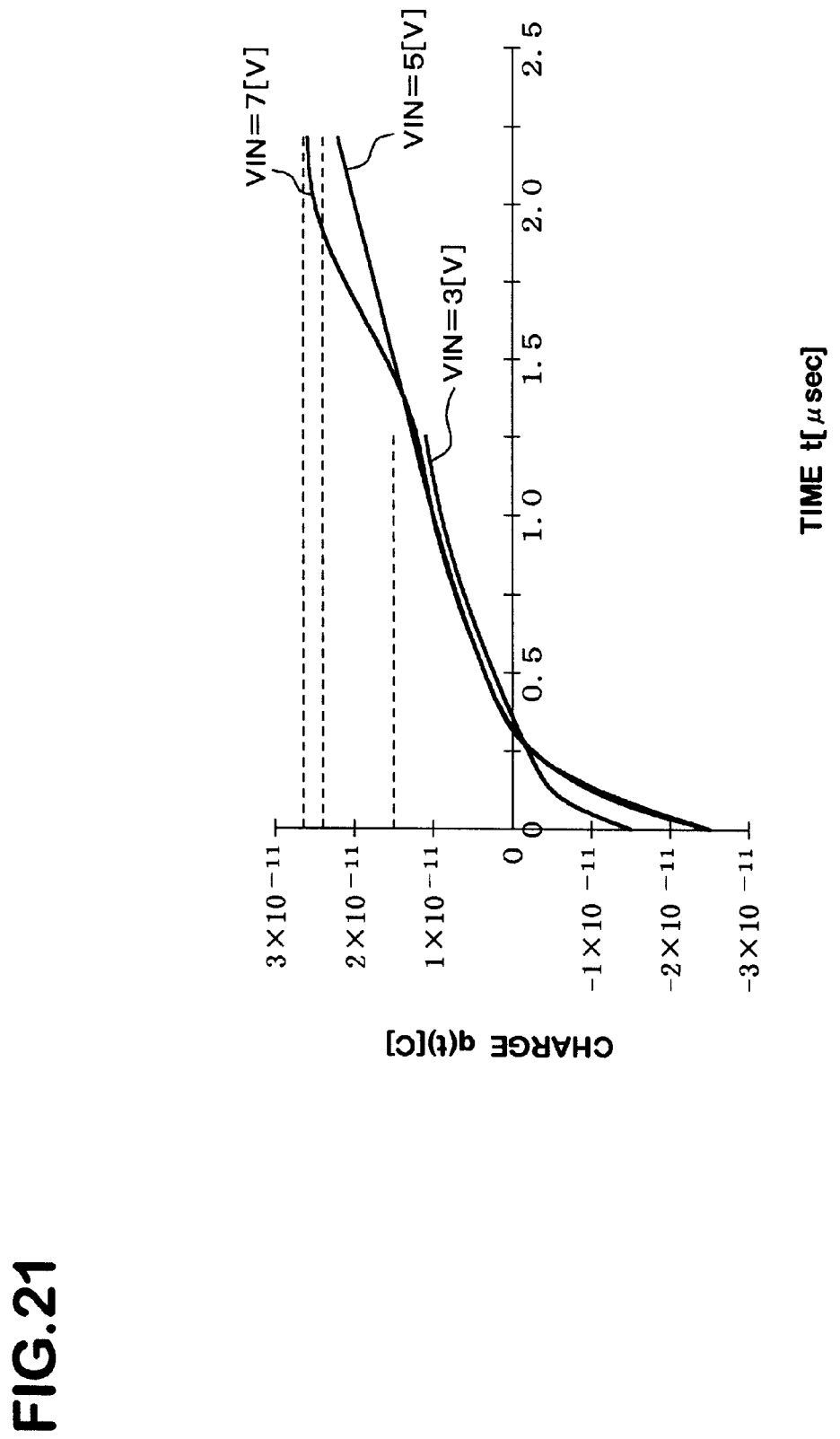
FIG. 21 is a graph illustrating transient charge response q(t) of a circuit CTW when a voltage E ($-V_{IN}$ to $+V_{IN}$) having a step shaped waveform is applied thereto.

FIG. 21 is a graph illustrating the transient responses q(t) of the circuit CTW when the voltage E (a range of which is $-V_{IN}$ to $+V_{IN}$) is applied thereto. The FIG. 21 shows a comparison of the transient responses when various values of the voltage E such as $V_{IN}$ equal to 3 volts, 5 volts and 7 volts are respectively applied to the circuit CTW.

On the other hand, another value of a current i (ta) flowing through the circuit CTW corresponding to the factors of time bases dta or the transient voltage value va can be calculated under an equation described below when the voltage v equal to the transient voltage value va in the equation (11), $$i(ta)=(E-va)/R_{SW}$$

Figure 22:
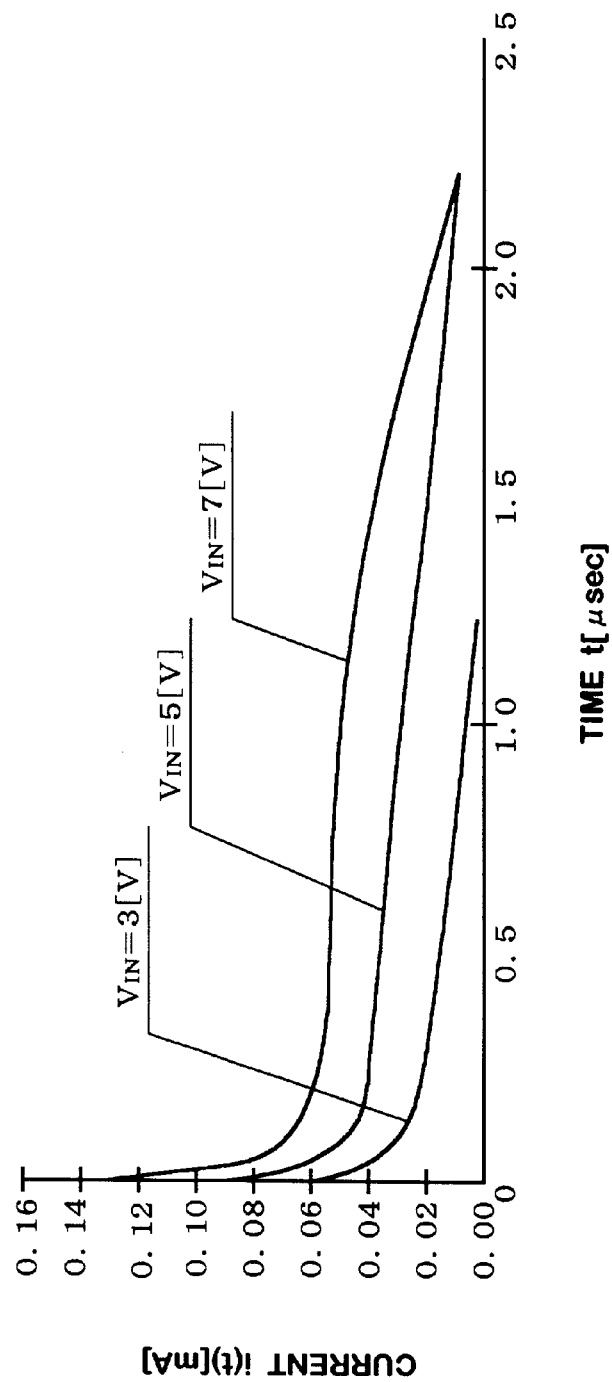
FIG. 22 is a graph illustrating transient current response i(t) of the circuit CTW when another voltage E ($-V_{IN}$ to $+V_{IN}$) is applied thereto.

FIG. 22 is a graph illustrating transient response i(t) to the current flowing through the circuit CTW when the voltage E (a range of which is $-V_{IN}$ to $+V_{IN}$) is applied thereto. FIG. 22 shows another comparison of the transient responses when various values of the voltage E such as $V_{IN}$ equal to 3 volts, 5 volts and 7 volts are applied to the circuit CTW similar to FIG. 21.

Similarly, both the transient responses q(t) and i(t) of applying an reversed pulse voltage (a range of which is $+V_{IN}$ to $-V_{IN}$) can be calculated in the same manner.

Figure 23A:
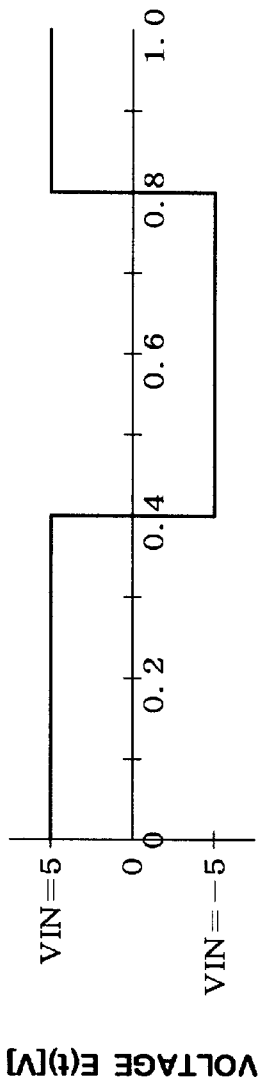
FIG. 23A is a graph illustrating an example of the voltage E.
Figure 23B:
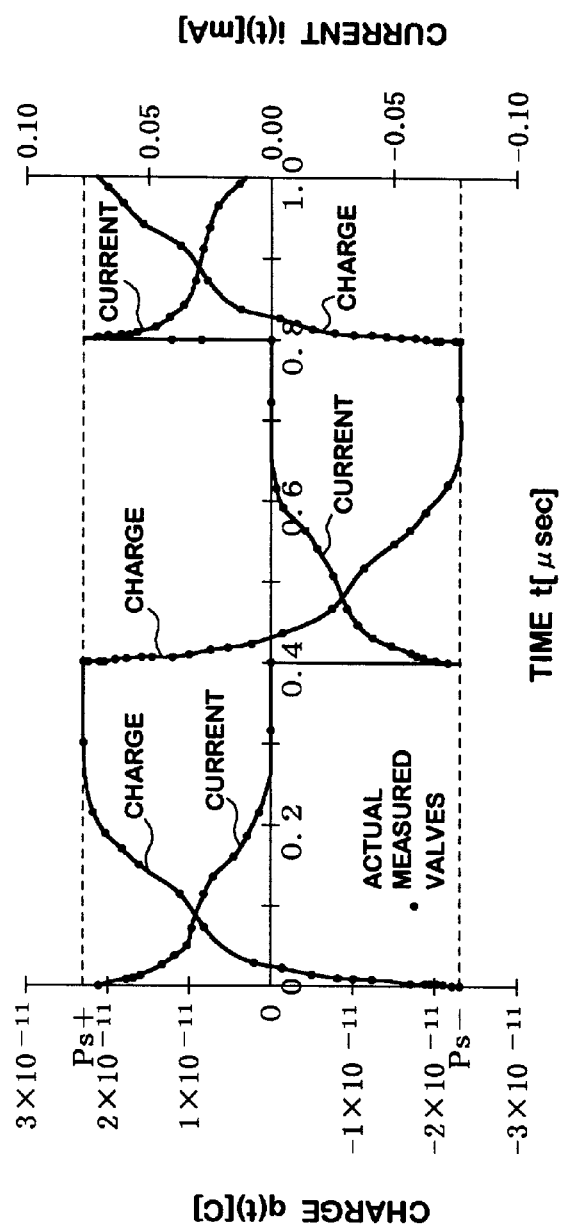
FIG. 23B is a graph illustrating both the transient current response i(t) and the transient charge response q(t) of the circuit CTW when the voltage E ($-V_{IN}$ to $+V_{IN}$) is applied thereto, and illustrating both the transient current response i(t) and the transient charge response q(t) of the circuit CTW when a reversed voltage E ($+V_{IN}$ to $-V_{IN}$) is applied thereto.

FIG. 23B is a graph illustrating the transient charge response q(t) and the transient current responses i(t) of the circuit CTW when the voltage E ($-V_{IN}$ to $+V_{IN}$) shown in FIG. 23A is applied thereto, and FIG. 23B further illustrating the transient charge response q(t) and the transient current response i(t) of the circuit CTW when a reversed voltage E ($+V_{IN}$ to $-V_{IN}$) is applied thereto.

Figure 24:
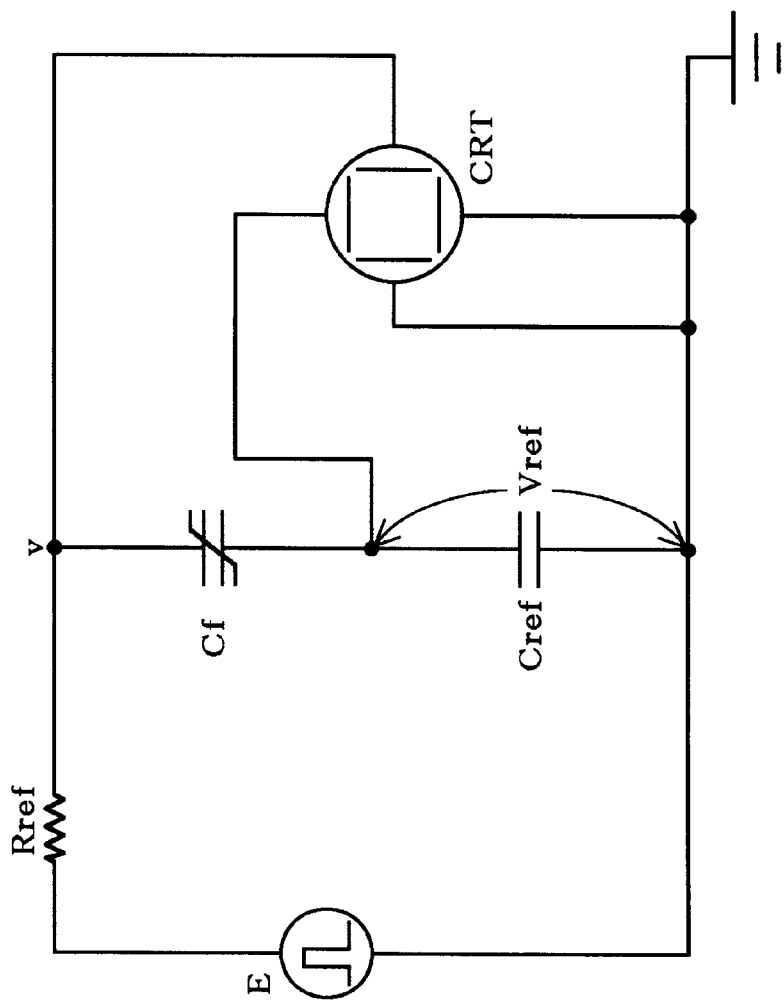
FIG. 24 is a circuit diagram of a measuring device for measuring both the transient current response i(t) and the transient charge response q(t) of the circuit CTW.

Both the transient current responses i(t) and the transient charge response q(t) of the circuit CTW can be measured by a measuring device. FIG. 24 is a circuit diagram of the measuring device using a Sawyer-Tower circuit. The ferroelectric capacitor Cf is installed in the Sawyer-Tower circuit shown in FIG. 24, and both a capacitor having relatively larger capacitance than that of the dynamic capacitance Cd of the ferroelectric capacitor Cf and a resistor Rref having similar electric resistance with the resister $R_{SW}$ shown in FIG. 19 are connected with the ferroelectric capacitor Cf in series. The voltage E having a step shaped waveform is supplied from a power source.

The transient responses (q(t) can be calculated under an equation described below using a voltage generated at the capacitor Cref in the measuring device shown in FIG. 24, $$q(t)=Cref \cdot Vref$$

Further, the transient current response i(t) can be calculated under another equation described below by measuring a voltage E−v generated at the resistor Rref, $$i(t)=(E-v)/Rref$$

The values thus measured are illustrated in black dots in FIG. 23. It is understood that the calculated values by the equations described above are coincide with the measured values with high accuracy.

Figure 25:
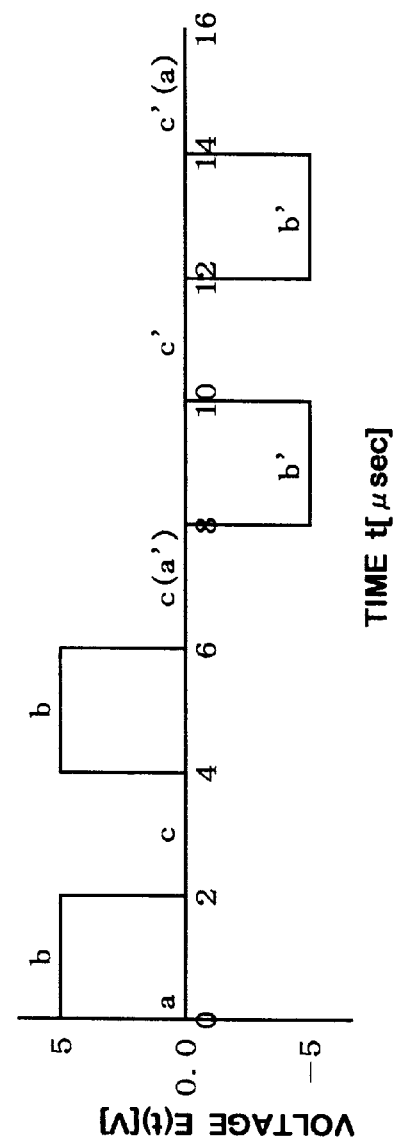
FIG. 25 is a graph illustrating an example of the voltage E practically applied.

Thereafter, transient responses of the circuit CTW when a voltage E having a step shaped waveform shown in FIG. 25 is applied thereto will be described. The ferroelectric capacitor Cf composing the circuit CTW has hysteresis characteristics shown in FIG. 26. Also, FIG. 27 illustrates the dynamic capacitance Cd of the ferroelectric capacitor Cf thus calculated.

A variation of the dynamic capacitance Cd when a voltage E is varied so as to take a course of "a" to "b", "b" to "c", "c" to another "b" and "b" to another "c" shown in FIG. 25 will be described herein.

Polarization state of the ferroelectric capacitor Cf being detected when the first pulse shown in FIG. 25 is applied thereto (hereinafter referred to as first positive pulse charging duration) is moved from a point "a" to a point "b" shown in FIG. 26. Depending upon the movement of the polarization state, the dynamic capacitance Cd shows a variation illustrated in a curve "a–b" shown in FIG. 27.

Dynamic time constants $\tau a$ (as $\tau$) of the circuit CTW at a time ta (as t) can be calculated under an equation described below in accordance with the equation (9), $$\tau a = R_{SW} \cdot Cda$$

The Cda used in the above equation describes the dynamic capacitance Cd of the ferroelectric capacitor Cf corresponding to the transient voltage value va applied at the time ta. The dynamic capacitance Cda is calculated by conducting a calculation of the first dynamic capacitance Cd1 in the equation (8) when the voltage v equal to the voltage va. So that, the dynamic capacitance Cd shows a variation illustrated in the curve "a–b" shown in FIG. 27 as described earlier.

Figure 26:
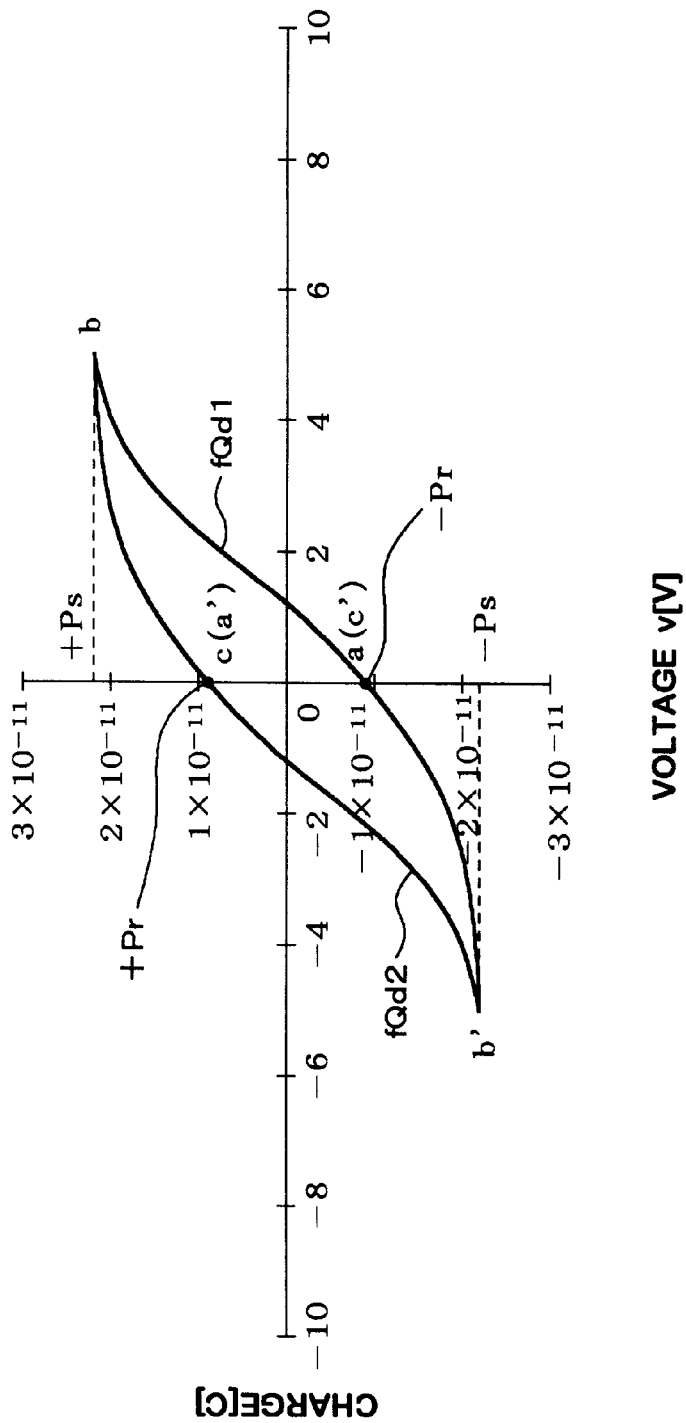
FIG. 26 is a graph illustrating a hysteresis loop of the ferroelectric capacitor Cf composing the circuit CTW.
Figure 27:
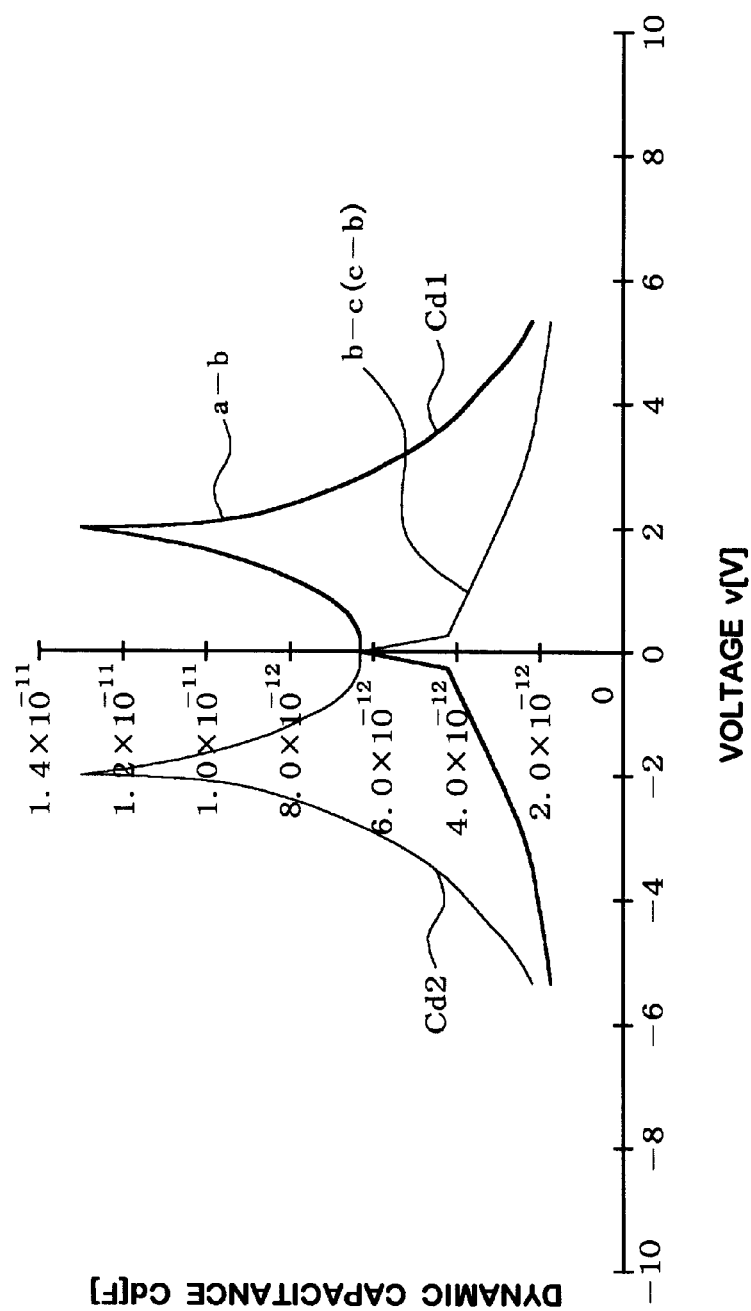
FIG. 27 is a graph illustrating dynamic capacitance Cd when the hysteresis is measured as shown in FIG. 26.

Factors of time bases dta (as dtj) can be calculated under an equation described below when the polarization charges Pz to be headed for used in the equation (10) is equivalent to the maximum polarization charges Ps, $$dta = -\tau a - 1 \cdot \ln((Ps-Pa)/(Ps-Pa-1))$$

when a condition of Pa−1=−Pr is satisfied in the case of a=1 (see FIG. 26).

Polarization charge q(ta) charged in the ferroelectric capacitor Cf corresponding to the factors of time bases dta or the transient voltage value va can be calculated as the value of the first hysteresis curve fQd1 by the equation (3), the equation (4) and the equation (5) when the voltage v is equal to the transient voltage value va.

On the other hand, another value of a current i (ta) flowing through the circuit CTW corresponding to the factors of time bases dta or the transient voltage value va can be calculated under an equation described below when the voltage v equal to the transient voltage value va in the equation (11), $$i(ta) = (E-va)/R_{SW}$$

Figure 28:
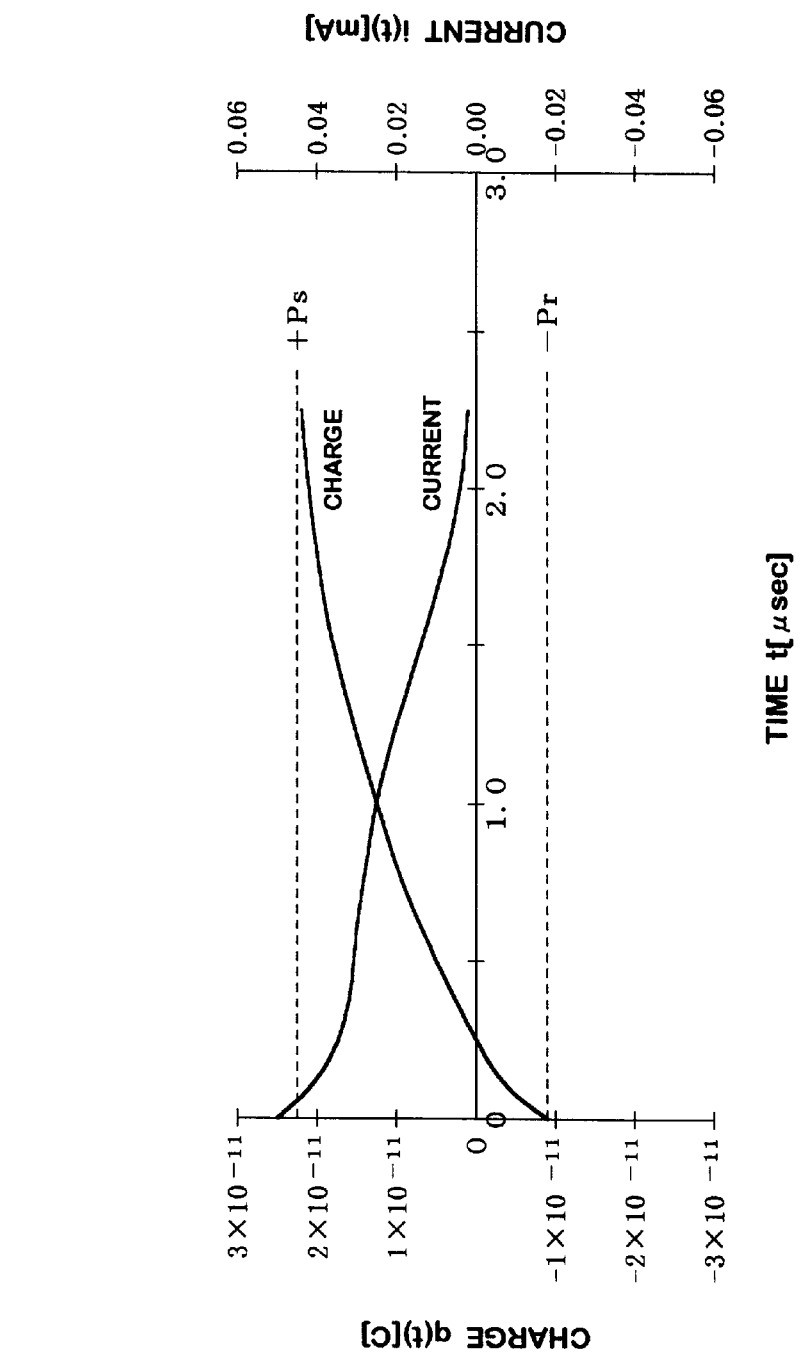
FIG. 28 is a graph illustrating both the transient current response i(t) and the transient charge response q(t) of the circuit CTW when a first forward voltage is charged.

FIG. 28 Is a graph illustrating both the transient charge responses q(t), and the transient current response i(t) of the circuit CTW during the first positive pulse charging duration.

Polarization state of the ferroelectric capacitor Cf being detected when no pulse voltage shown in FIG. 25 is applied thereto (hereinafter referred to as first positive pulse discharging duration) is moved from a point "b" to a point "c" shown in FIG. 26. Depending upon the movement of the polarization state, the dynamic capacitance Cd shows a variation illustrated in a curve "b–c" shown in FIG. 27.

Dynamic time constants $\tau b$ (as $\tau$) of the circuit CTW at a time tb (as t) can be calculated in accordance with the equation (9) as follows, $$\tau b = R_{SW} \cdot Cdb$$

The Cdb used in the above equation describes the dynamic capacitance Cd of the ferroelectric capacitor Cf corresponding to a transient voltage value vb applied at the time tb. The dynamic capacitance Cdb is calculated by conducting a calculation of the second dynamic capacitance Cd2 in the equation (8) when the voltage v equal to the voltage vb. So that, the dynamic capacitance Cd shows a variation illustrated in the curve "b–c" shown in FIG. 27 as described earlier.

Factors of time bases dtb (as dtj) can be calculated under an equation described below when the polarization charges Pz to be headed for used in the equation (10) is equivalent to the maximum polarization charges Pr, $$dtb = -\tau b - 1 \cdot \ln((Pr-Pb-1))$$

when a condition of Pb−1=+Ps is satisfied in the case of b=1.

Polarization charge q(tb) charged in the ferroelectric capacitor Cf corresponding to the factors of time bases dtb or the transient voltage value vb can be calculated as the value of the second hysteresis curve fQd2 by the equation (3), the equation (4) and the equation (5) when the voltage v is equal to the transient voltage value vb.

On the other hand, another value of a current i (tb) flowing through the circuit CTW corresponding to the factors of time bases dtb or the transient voltage value vb can be calculated under an equation described below when the voltage v equal to the transient voltage value vb in the equation (11), $$i(tb) = (E-vb)/R_{SW}$$

Figure 29:
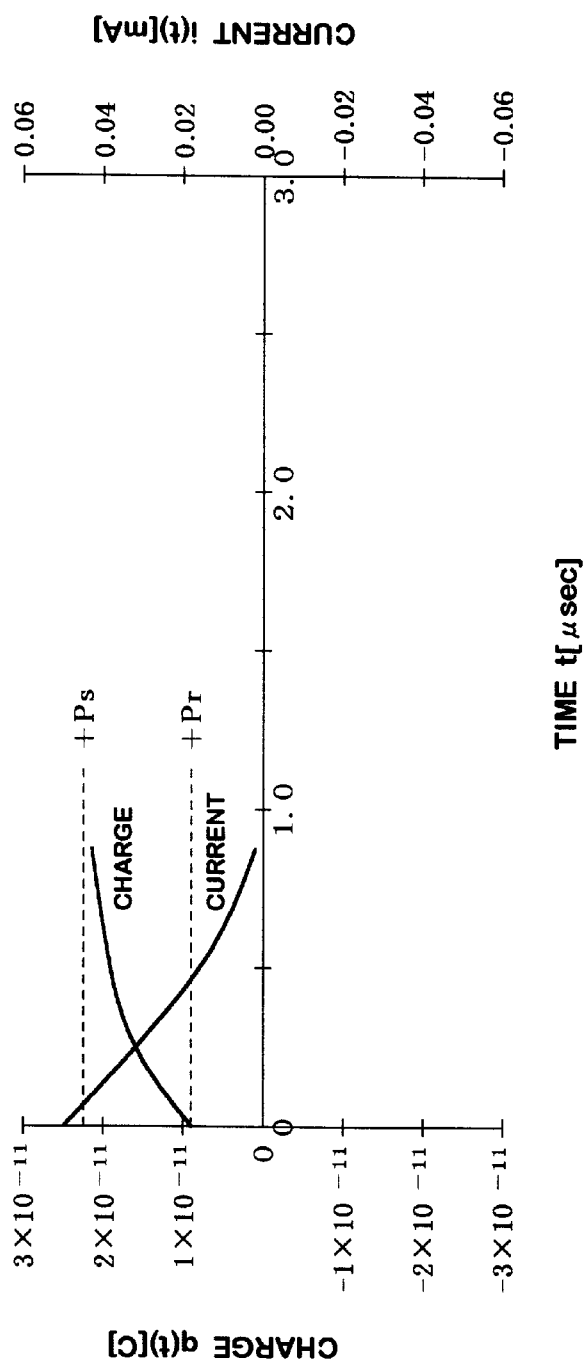
FIG. 29 is a graph illustrating both the transient current response i(t) and the transient charge response q(t) of the circuit CTW when the first forward voltage is discharged.

FIG. 29 is a graph illustrating both the transient charge responses q(t) and the transient current response i(t) of the circuit CTW during the first positive pulse discharging duration.

Polarization state of the ferroelectric capacitor Cf being detected when the second pulse shown in FIG. 25 is applied thereto (hereinafter referred to as second positive pulse charging duration) is moved from a point "c" to a point "b" shown in FIG. 26. Depending upon the movement of the polarization state, the dynamic capacitance Cd shows a variation illustrated in a curve "c–b" shown in FIG. 27.

Dynamic time constants $\tau c$ (as $\tau$) of the circuit CTW at a time tc (as t) can be calculated in accordance with the equation (9), $$\tau c = R_{SW} \cdot Cdc$$

The Cdc used in the above equation describes the dynamic capacitance Cd of the ferroelectric capacitor Cf corresponding to a transient voltage value vc applied at the time tc. The dynamic capacitance Cdc are calculated by conducting a calculation of the second dynamic capacitance Cd2 in the equation (8) when the voltage v equal to the voltage vc. So that, the dynamic capacitance Cd shows a variation illustrated in the curve "c–b" shown in FIG. 27 as described earlier.

Factors of time bases dtc (as dtj) can be calculated under an equation described below when the polarization charges Pz to be headed for used in the equation (10) is equal to the maximum polarization charges Ps, $$dtc = -\tau c - 1 \cdot \ln((Ps-Pc)/(Ps-Pc-1))$$

when a condition of Pc−1=+Pr is satisfied in the case of c=1 (see FIG. 26).

Polarization charge q(tc) charged in the ferroelectric capacitor Cf corresponding to the factors of time bases dtc or the transient voltage value vc can be calculated as the value of the second hysteresis curve fQd2 by the equation (3), the equation (4) and the equation (5) when the voltage v is equal to the transient voltage value vc.

On the other hand, another value of a current i (tc) flowing through the circuit CTW corresponding to the factors of time bases dtc or the transient voltage value vc can be calculated under an equation described below when the voltage v equal to the transient voltage value vc in the equation (11), $$i(tc)=(E-vc)/R_{SW}$$

Figure 30:
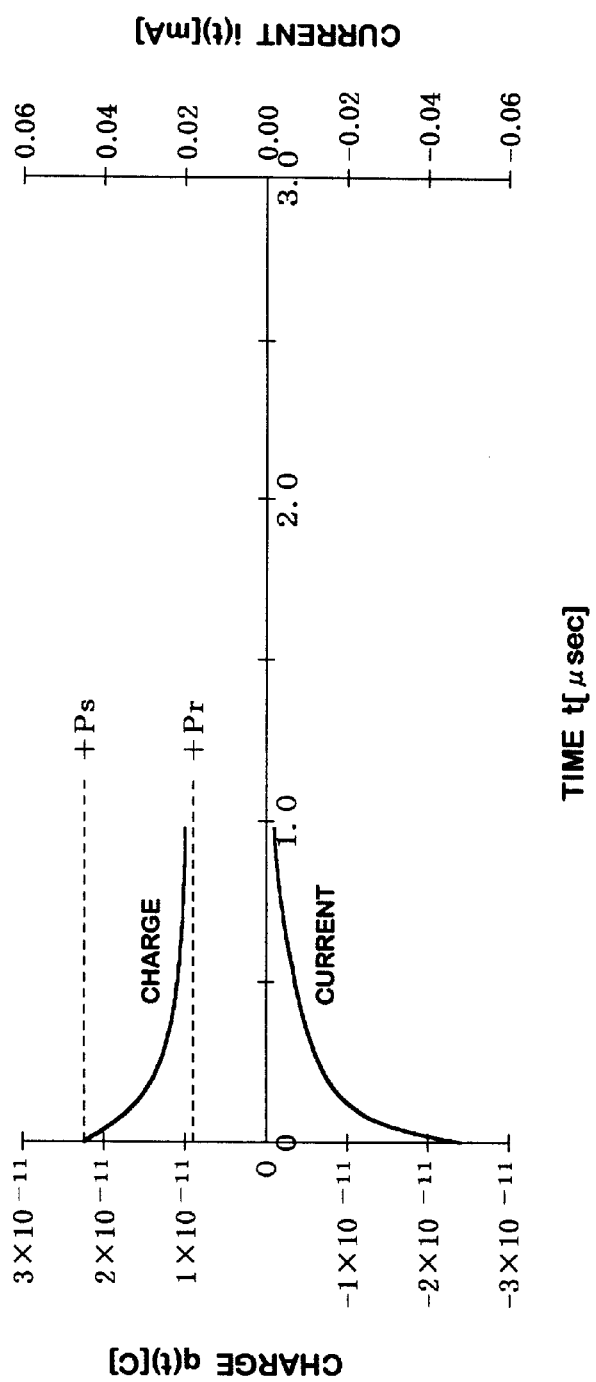
FIG. 30 is a graph illustrating both the transient current response i(t) and the transient charge response q(t) of the circuit CTW when a second forward voltage is charged.

FIG. 30 is a graph illustrating both the transient charge responses q(t) and the transient current response i(t) of the circuit CTW during the second positive pulse charging duration.

Polarization status of circuit CTW being detected when no pulse shown in FIG. 25 is applied thereto (hereinafter referred to as second positive pulse discharging duration) is moved in the same manner as that of the first positive pulse discharging duration. In other words, the polarization status of the ferroelectric capacitor Cf is moved from a point "b" to a point "c" shown in FIG. 26. Depending upon the movement of the polarization state, the dynamic capacitance Cd shows a variation illustrated in a curve "b–c" shown in FIG. 27. The transient charge responses q(t) and the transient current response i(t) of the circuit CTW are the same of that shown in FIG. 29.

Figure 31A:
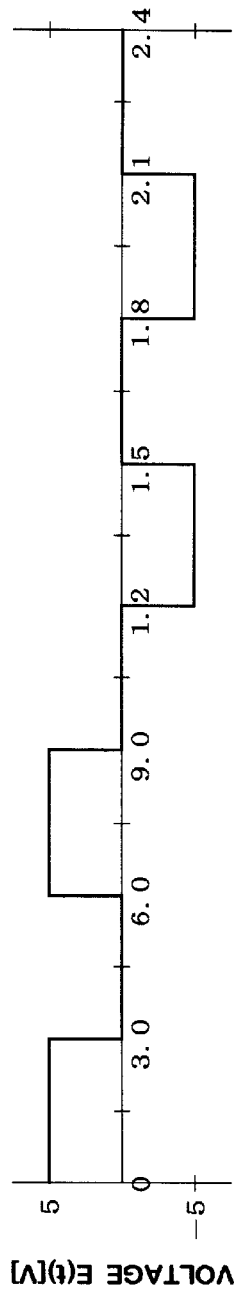
FIG. 31A is a graph illustrating another example of the voltage E having a step shaped waveform.
Figure 31B:
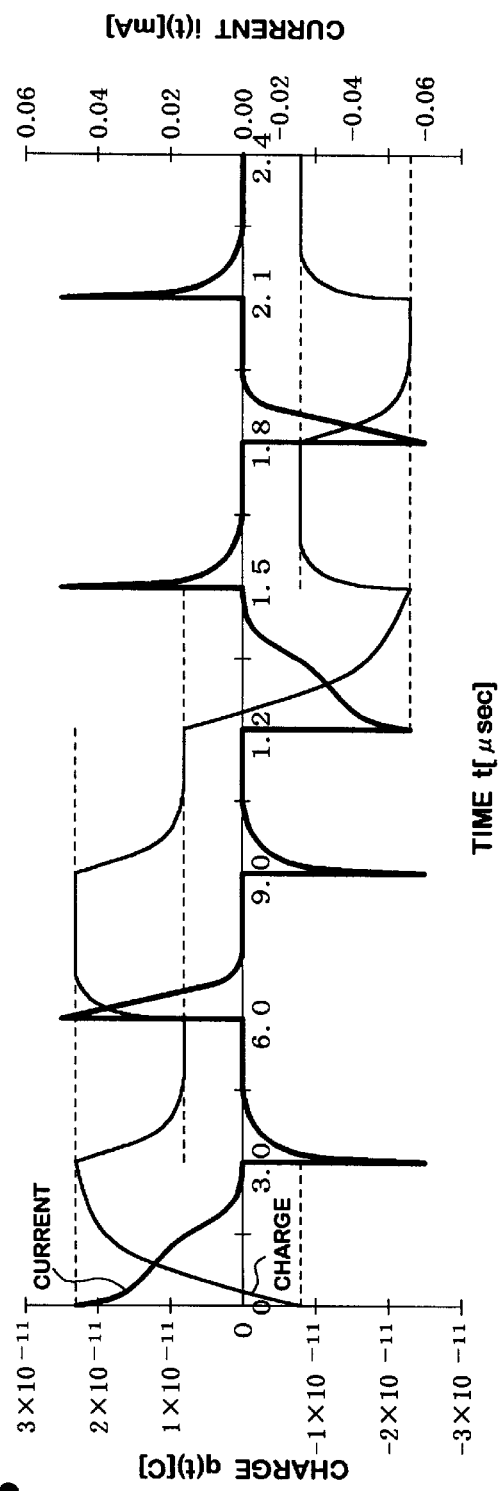
FIG. 31B is a graph illustrating both the transient current response i(t) and the transient charge response q(t) of the circuit CTW when the voltage E shown in FIG. 31A is applied to the circuit CTW.

Transient response of the circuit CTW during application of a step shaped voltage E varied in a sequence of a line a', b', c', b' and c' shown in FIG. 25 can be shown as an opposite polarity of the transient response when the step shaped voltage E thus applied is varied in a sequence of a line a, b, c, b, c shown in FIG. 25. FIG. 31A is a graph illustrating another example of the voltage E having a step shaped waveform. FIG. 31B is a graph illustrating both the transient current response i(t) and the transient charge response q(t) of the circuit CTW when the voltage E shown in FIG. 31A varied in a sequence of line a, b, c, b, c (a'), b', c', b' to c' (a) is applied thereto.

As described above, the transient responses of the circuit CTW during the write-operation can easily be calculated with simple calculation.

[Read-out Operation]

Figure 32A:
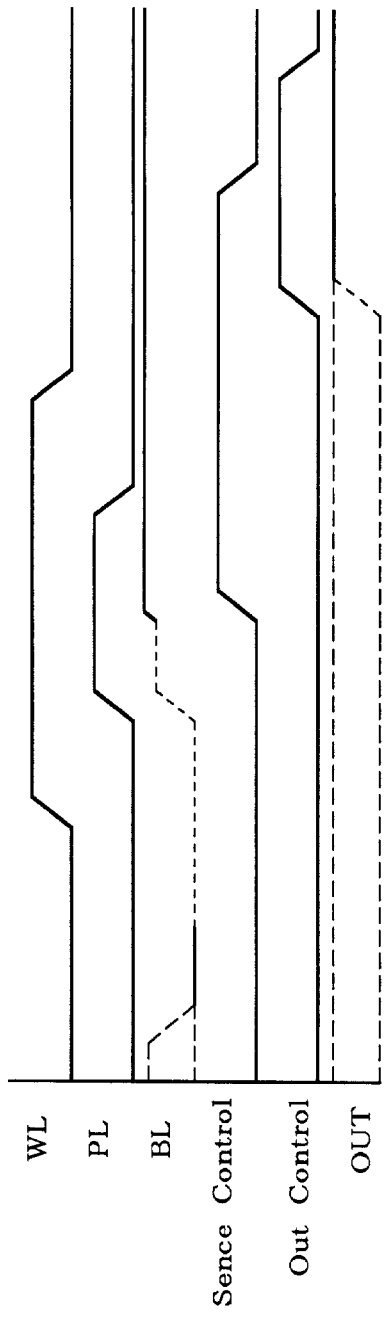
FIG. 32A is a timing chart used for reading out the stored data when data "High" are stored in the memory cell MC.
Figure 32B:
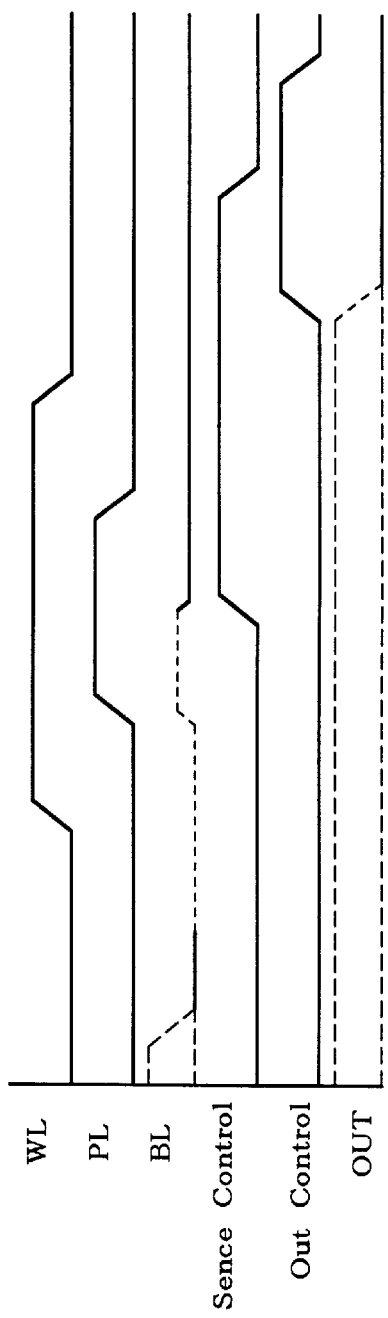
FIG. 32B is a timing chart used for reading out the stored data when data "Low" are stored in the memory cell MC.

Next, a process for calculating transient responses of the circuit including the ferroelectric capacitor Cf will be described. The circuit is capable of using for the read out-operation. FIG. 32A and 32B are timing charts showing status of the word line WL, the plate line PL and the bit line BL and the like when the read out operation is carried out to the memory cell MC shown in FIG. 18. FIG. 32A is a chart used for reading out the stored data when data "High" are stored in the memory cell MC, and FIG. 32B is a chart used for reading out the stored data when data "Low" are stored in the memory cell MC. As understood from the FIG. 32A and FIG. 32B, a voltage for reading out data is applied between the plate line PL and the ground G shown in FIG. 18. In thus case, the circuit including the ferroelectric capacitor Cf is equivalent to a circuit CTR shown in FIG. 19 composed of the ferroelectric capacitor Cf, the electric resistance Rsw and the load capacitor Cload each connected in series.

Similar to the write-operation, the CPU 6 calculates the dynamic time constants τ of the circuit CTR including the ferroelectric capacitor Cf in accordance with the dynamic capacitance Cd of the ferroelectric capacitor Cf thus calculated (see equation (8)). Further, the CPU 6 determines the transient responses of the circuit CTR in accordance with the dynamic time constants τ thus calculated (step S48).

A method for calculating both the dynamic time constants τ and the transient responses during the read out-operation is described herein in detail. As described earlier, the circuit CTR shown in FIG. 19 is a circuit connecting the ferroelectric capacitor Cf, the electric resistance $R_{SW}$ and the load capacitor Cload in series. So that, the dynamic time constants τ of the circuit CTR are calculated as a product of the resister $R_{SW}$, and a capacitance composed of the dynamic capacitance Cd of the ferroelectric capacitor Cf shown in the equation (8) and the capacitance (Cload) of the load capacitor Cload under an equation shown in below, $$\tau=R_{SW}\cdot(Cd\cdot Cload)/(Cd+Cload) \qquad \text{equation (9').}$$

The dynamic time constants τ in the equation (9') is varied in accordance with a variation of the voltage v as well as hysteresis of the voltage v. Further, transient responses of the CTR described later is varied in accordance with hysteresis of the voltage v similar to the circuit CTW described earlier.

Thereafter, the response time dtj corresponding to a variation of the polarization charges of the ferroelectric capacitor Cf is determined in accordance with the dynamic time constants τ thus calculated when an equation the voltage v=vj (hereinafter referred to as transient voltage vj) is satisfied.

The response time dtj thus determined can be estimated by using the equation (10) similar to that of the circuit CTW. In this way, the CPU 6 performs calculation of the response time dtj when the transient voltage vj is applied in accordance with the equation (10) similar to that of the circuit CTW, and the CPU 6 also performs setting of the time bases by using the response time dtj thus determined as the factor thereof. The transient responses of the circuit CTR is calculated by determining a relationship between factors of time bases dtj and response values corresponding to the factors of time bases dtj (that is, the response values corresponds to the transient voltage vj).

The fact that the polarization charge q(tj) charged in the ferroelectric capacitor Cf corresponding to the factors of time basis dtj (the transient voltage vj) can be calculated as a value of the hysteresis loop fQd in accordance with the equations (3), (4) and (5) when the voltage v=vj is satisfied in the equations, and another fact that the current values I (tj) flowing through the circuit CTR corresponding to the factors of time basis dtj (the transient voltage vj) can be shown in the equation (11) are similar to the circuit CTW.

Figure 33:
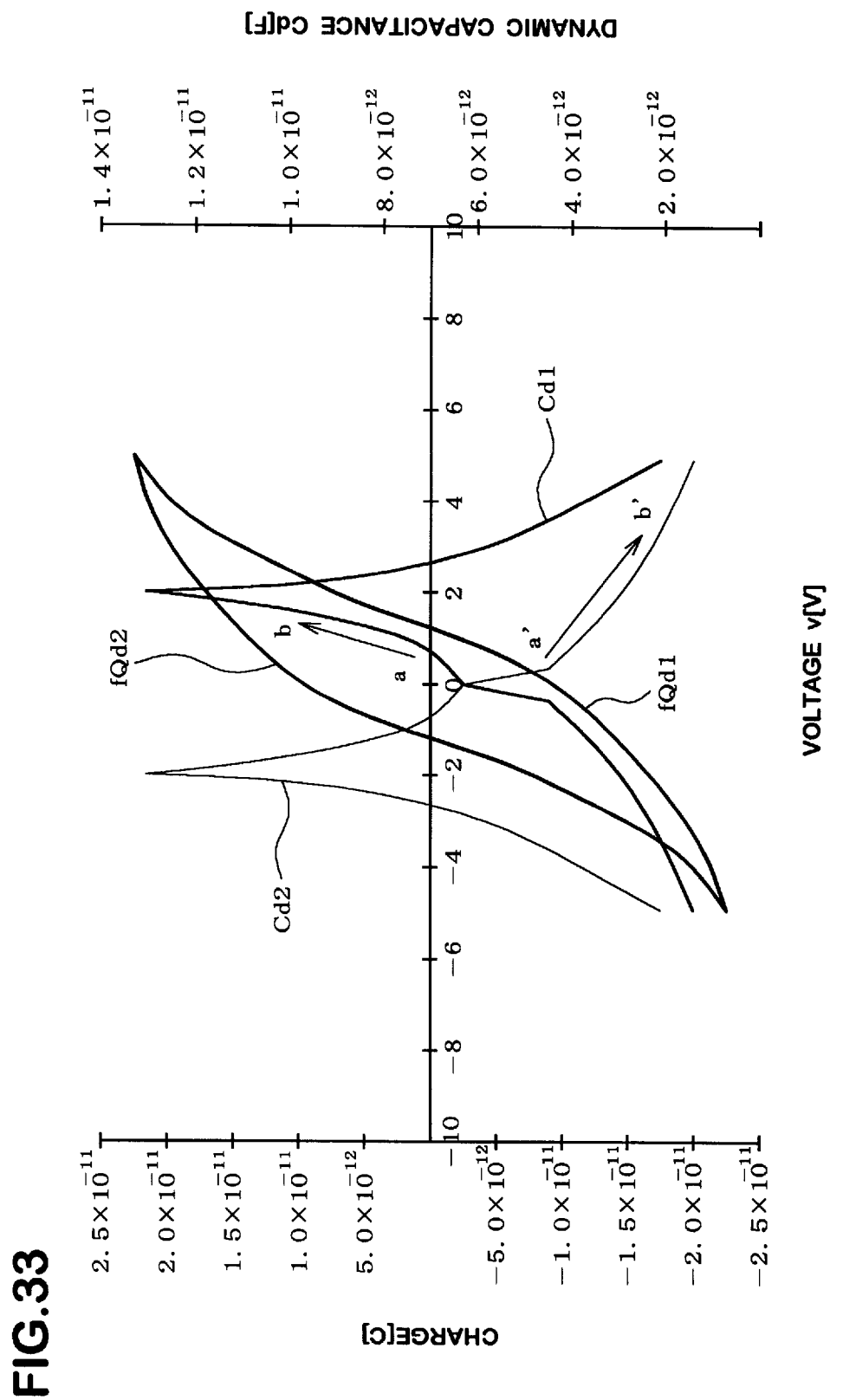
FIG. 33 is a graph illustrating both a hysteresis loop and dynamic capacitance Cd of the ferroelectric capacitor Cf composing the circuit CTW.

Next, transient responses in the read-out operation when the ferroelectric capacitor Cf included in the circuit CTR has hysteresis characteristics shown in FIG. 33 will be described herein. Calculation results of the dynamic capacitance Cd are indicated on FIG. 33 also.

Figure 34:
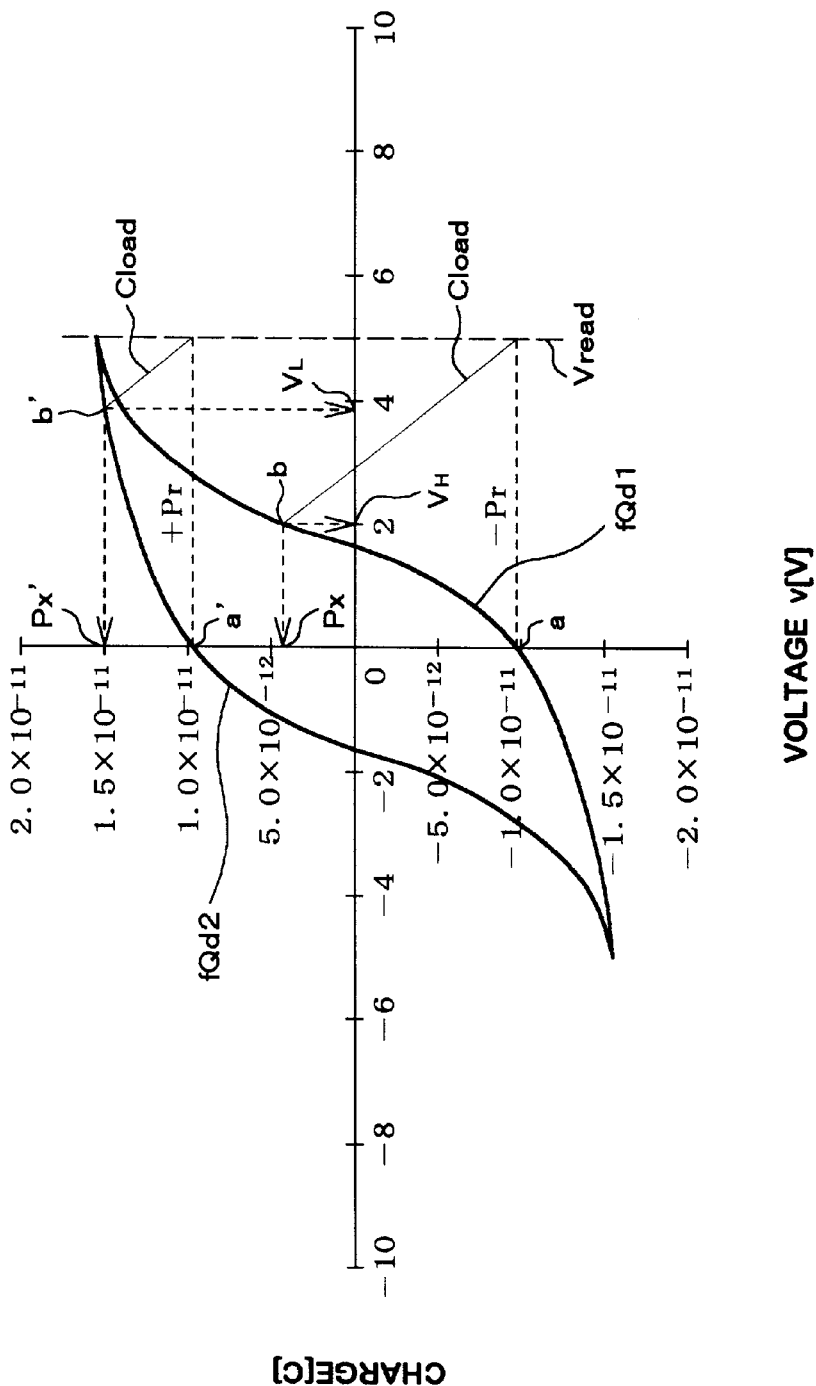
FIG. 34 is a graph for describing pictorial solutions for determining either a voltage $V_H$ or a voltage $V_L$ generated on a bit line BL when the stored data are read out.

FIG. 34 is a graph for describing pictorial solutions for determining either of a voltage $V_H$ or a voltage $V_L$ detected on a bit line BL (see FIG. 18) responsive to the stored data being in "High" state or in "Low" state when the stored data are read out.

According to the pictorial solutions shown in FIG. 34, an electric potential detected at an intersection of the first hysteresis curve fQd1 and a curve illustrating load characteristics (hereinafter referred to as load characteristics curve) of the load capacitor Cload is the voltage $V_H$ when the stored data are in "High" state, that is the remanent polarization charges Cf are −Pr. At that time, polarization charges of the ferroelectric capacitor Cf become Px. In other words, polarization charges of the ferroelectric capacitor Cf are headed for a polarization charge Px when the stored data in "High" state are read out.

On the other hand, an electric potential detected at an intersection of the second hysteresis curve fQd2 and the load characteristics curve of the load capacitor Cload is the voltage $V_L$ when the stored data is in "Low" state, that is the remanent polarization charges of the ferroelectric capacitor Cf are +Pr. At that time, the polarization charge of the ferroelectric capacitor Cf is equivalent to a polarization charge Px'. In other words, polarization charges of the ferroelectric capacitor Cf are headed for the polarization charge Px' when the stored data in "Low" state are read out.

Figure 35:
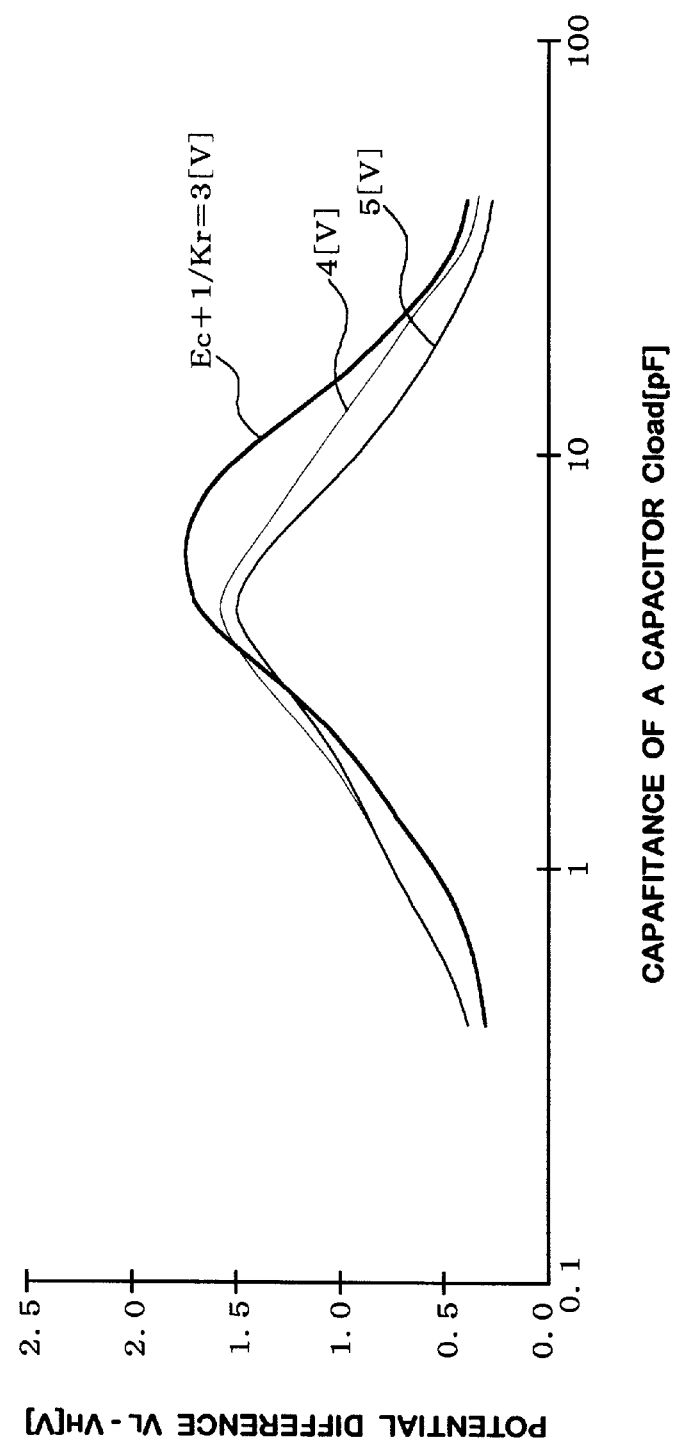
FIG. 35 is a graph illustrating a relationship between capacitances of a load capacitor Cload and potential differences of the voltage $V_H$ and the voltage $V_L$ detected during the read out operation using the characteristic constants Kr as parameters.

Potential difference between the voltage $V_L$ and the voltage $V_H$ are varied depending upon several factors such as the load characteristics of the load capacitor Cload and/or the characteristic constants of the ferroelectric capacitor Cf. FIG. 35 is a graph illustrating a relationship between capacitances of the load capacitor Cload and the potential difference between the voltage $V_L$ and the voltage $V_H$ using the fourth characteristic constant Kr of the ferroelectric capacitor Cf as a factor. According to the Figure, it is understood that a maximum value of the potential difference between the voltage $V_L$ and the voltage $V_H$ can be obtained by adjusting the load characteristics of the load capacitor Cload and/or the characteristic constants of the ferroelectric capacitor Cf in an appropriate range.

Referring back to FIG. 34, the transient responses in the read-out operation when the stored data are in "High" state will be described herein. In other words, the transient responses in the read-out operation when the remanent polarization charges of the ferroelectric capacitor Cf are −Pr will be described. In this case, the polarization charges of the ferroelectric capacitor Cf moves toward the polarization charge Px shown in FIG. 34 when another voltage E (a range of which is 0V to $+V_{read}$) having a step shaped waveform is applied to the circuit CTR. That is, the polarization charges of the ferroelectric capacitor Cf is headed for a point "b" from a point "a" shown in FIG. 34. In that case, the dynamic capacitance Cd shows a variation illustrated in a curve "a-1 b" shown in FIG. 33.

Dynamic time constants τa (as τ) determined at the time ta (as t) can be calculated under an equation described below in accordance with the equation (9'), $$\tau a = R_{SW} \cdot (Cda \cdot Cload)/(Cda + Cload)$$

The Cda used in the above equation describes the dynamic capacitance Cd of the ferroelectric capacitor Cf corresponding to the transient voltage value va applied at the time ta. The dynamic capacitance Cda are calculated by conducting a calculation of the first dynamic capacitance Cd1 in the equation (8) when the voltage v is equal to the transient voltage value va. In that case, the dynamic capacitance Cd shows a variation illustrated in the curve "a-b" shown in FIG. 33.

Further, the factors of time of time basis dta (as dtj) can be calculated under an equation described below when the polarization charge Pz to be headed for used in the equation (10) is equal to the polarization charge Px, $$dta = -\tau a - 1 \cdot \ln((Px-Pa)/(Px-Pa-1))$$

when a condition of Pa−1=−Pr is satisfied in the case of a=1.

Polarization charge q (ta) charged in the ferroelectric capacitor Cf corresponding to the factors of time basis dta (the transient voltage value va) can be calculated as the value of the first hysteresis curve fQd1 by the equation (3), the equation(4), and the equation (5) when the voltage v is equal to the voltage va.

On the other hand, the value of the current i (ta) flowing through the circuit CTR corresponding to the factors of time basis d ta (the transient voltage value va) can be calculated under an equation described below when the voltage v is equal to the transient voltage value va in the equation (11), $$i(ta) = (E-va)/R_{SW}$$

Figure 36:
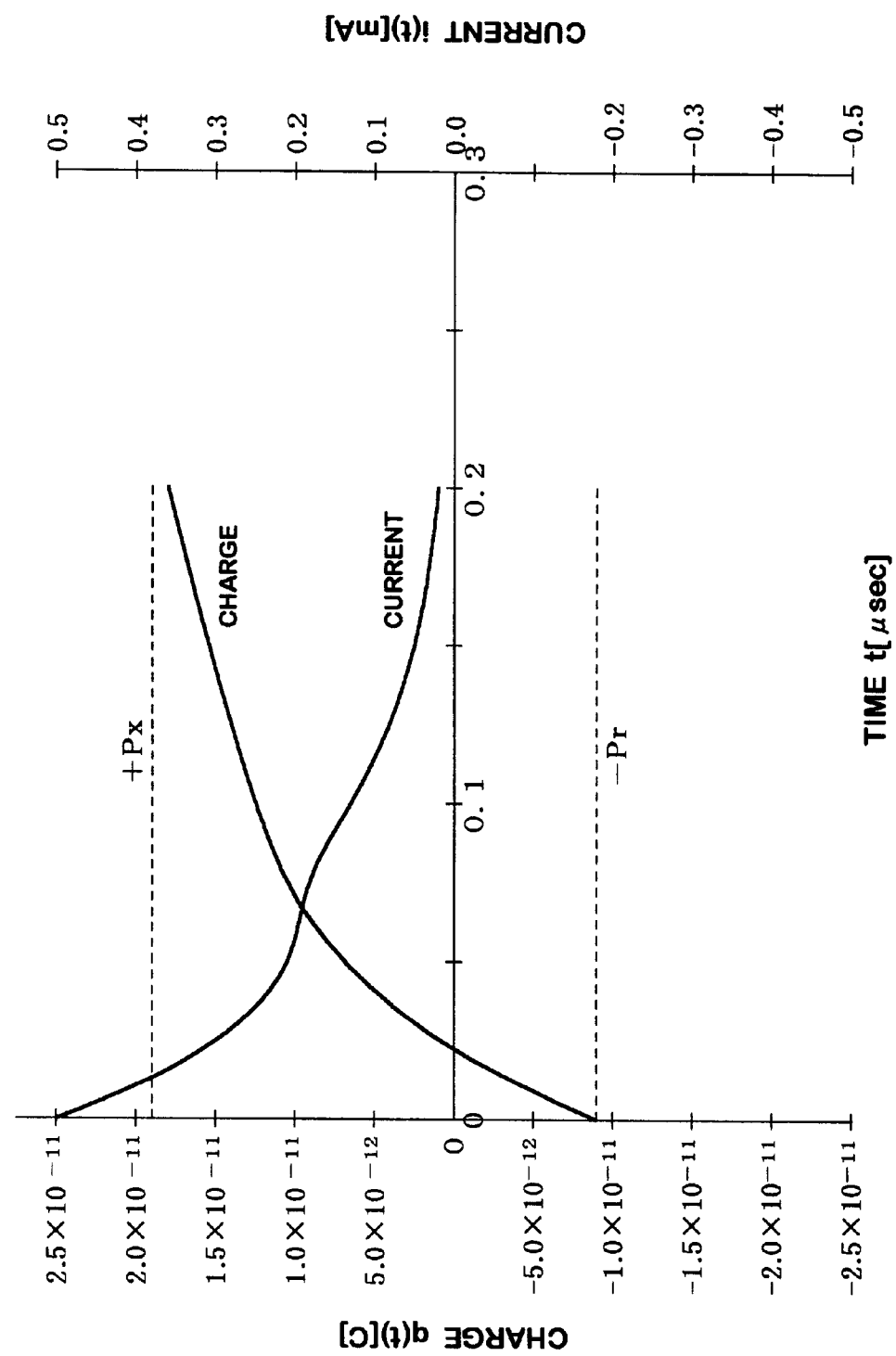
FIG. 36 is a graph illustrating both the transient charge response q(t) and the transient current response i(t) of a circuit CTR during the read out operation.

FIG. 36 is a graph illustrating both the transient charge response q(t) and the transient current responses i(t) of the circuit CTR thus calculated when the stored data in "High" state are read out.

Figure 37:
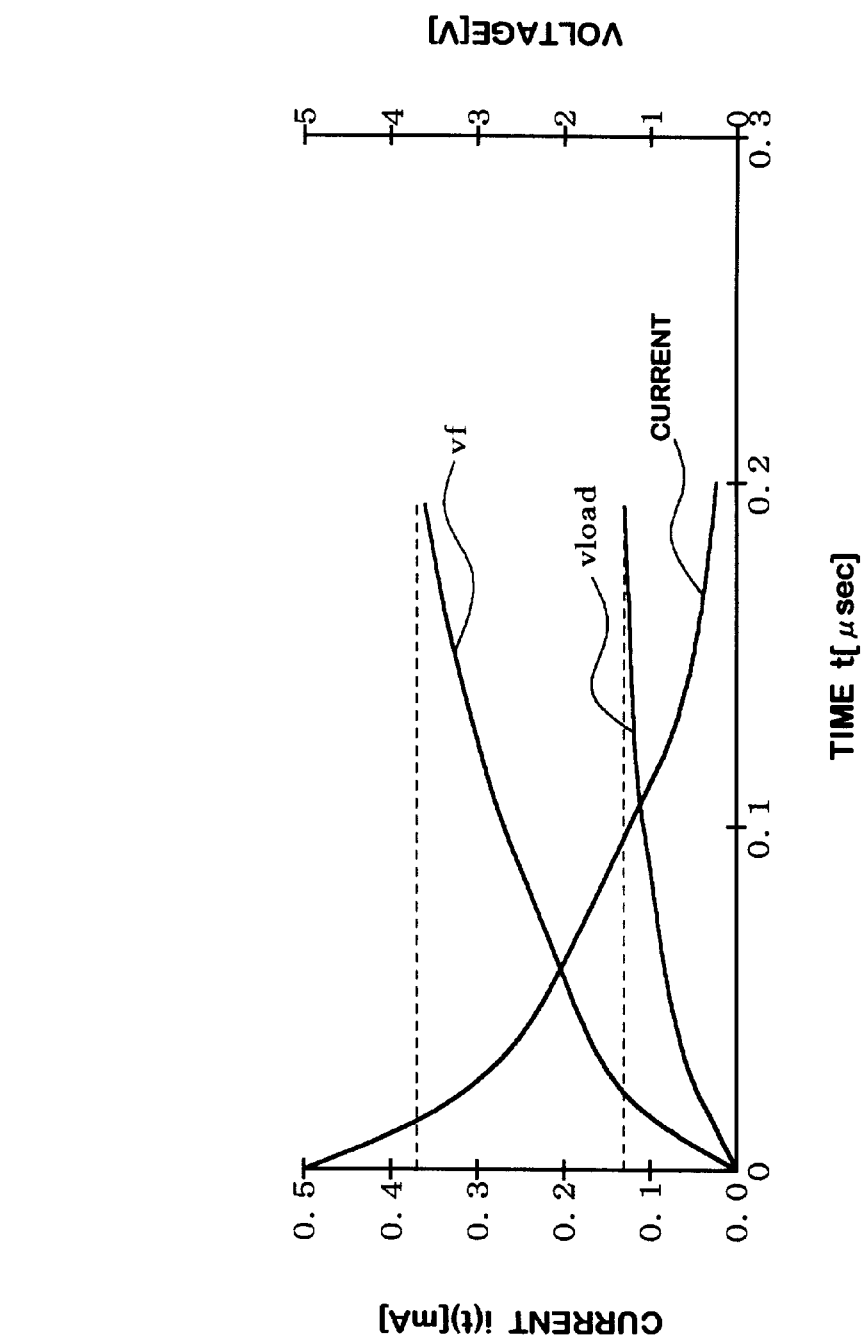
FIG. 37 is a graph illustrating both voltages vf generated at the capacitor Cf and voltages vload generated at the load capacitor Cload both corresponding to the transient charge response q(t) shown in FIG. 36.

Also, FIG. 37 shows a graph illustrating voltages vf generated at the ferroelectric capacitor Cf and voltages vload generated at the load capacitor Cload both corresponding to the transient charge response q(t) shown in FIG. 36. The voltage vload generated at the load capacitor Cload are calculated under an equation described below, $$i\ vload = q(t)/Cload$$

Next, the transient responses in the read-out operation when the stored data are in "low state" will be described herein. In other words, the transient responses in the read-out operation when the remanent polarization charges of the ferroelectric capacitor Cf are +Pr will be described. In this case, the polarization charges of the ferroelectric capacitor Cf are headed for the polarization charge Px' shown in FIG. 34 when the voltage E (a range of which is OV to $+V_{read}$) having a step shaped waveform is applied to the circuit CTR. That is, the polarization charges of the ferroelectric capacitor Cf are headed for a point "b'" from a point "a'" shown in FIG. 34. In that case, the dynamic capacitance Cd shows a variation illustrated in a curve "a'-b'" shown in FIG. 33.

Dynamic time constants τa' (as τ) determined at the time ta (as t) can be calculated under an equation described below in accordance with the equation (9'), $$\tau a' = R_{SW} \cdot (Cda' \cdot Cload)/(Cda' + Cload)$$

The Cda' used in the above equation describes the dynamic capacitance Cd of the ferroelectric capacitor Cf corresponding to a transient voltage value va' applied at the time ta'. The dynamic capacitance Cda' are calculated by conducting a calculation of the second dynamic capacitance Cd2 in the equation (8) when the voltage v is equal to the transient voltage value va'. In that case, the dynamic capacitance Cd shows a variation illustrated in a curve "a'-b'" shown in FIG. 33.

Factors of time basis dta' (as dtj) can be calculated under an equation described below when the polarization charges Pz to be headed for used in the equation (10) is equivalent to the polarization charges Px', $$dta' = -\tau a' - 1 \cdot \ln((Px'-Pa')/(Px'-Pa'-1))$$

when a condition of Pa'−1=+Pr is satisfied in the case of a'=1.

Polarization charge q (ta') charged in the ferroelectric capacitor Cf corresponding to the factors of time basis d ta' (the transient voltage value va') can be calculated as the value of the second hysteresis curve fQd2 by the equation (3), the equation (4) and the equation (5) when the voltage v is equivalent to the voltage va'.

On the other hand, another value of the current i(ta') flowing through the circuit CTR corresponding to the factors of time basis d ta' (the transient voltage value va') can be calculated under an equation described below when the voltage v is equal to the transient voltage value va' in the equation (11), $$i(ta')=(E-va')/R_{SW}$$

Figure 38:
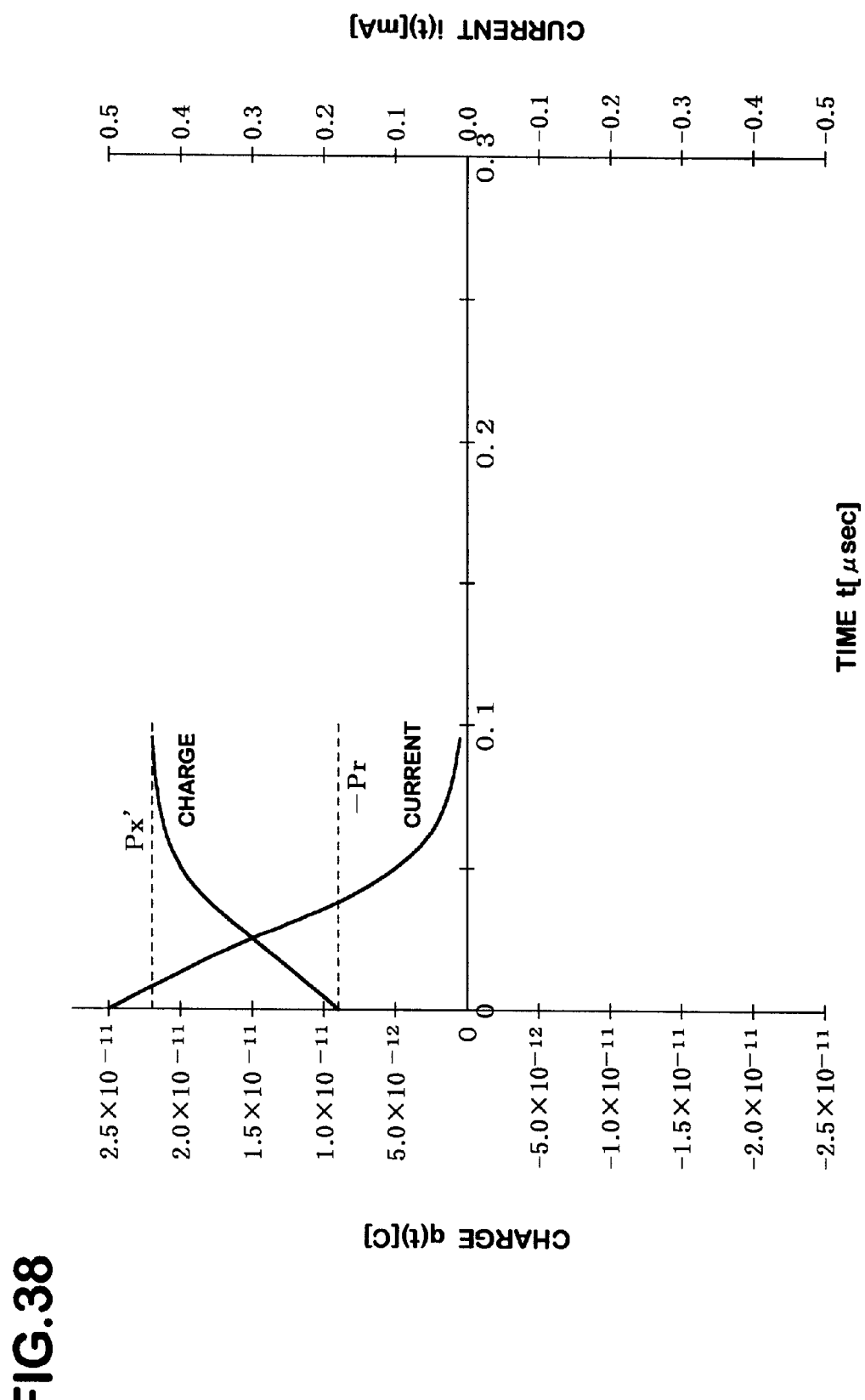
FIG. 38 is a graph illustrating both the transient charge response q(t) and the transient current response i(t) of the circuit CTR when the stored data "Low" are read out.

FIG. 38 is a graph illustrating both the transient charge response q(t) and the transient current responses i(t) of the circuit CTR thus calculated when the stored data in "low" state are read out.

Figure 39:
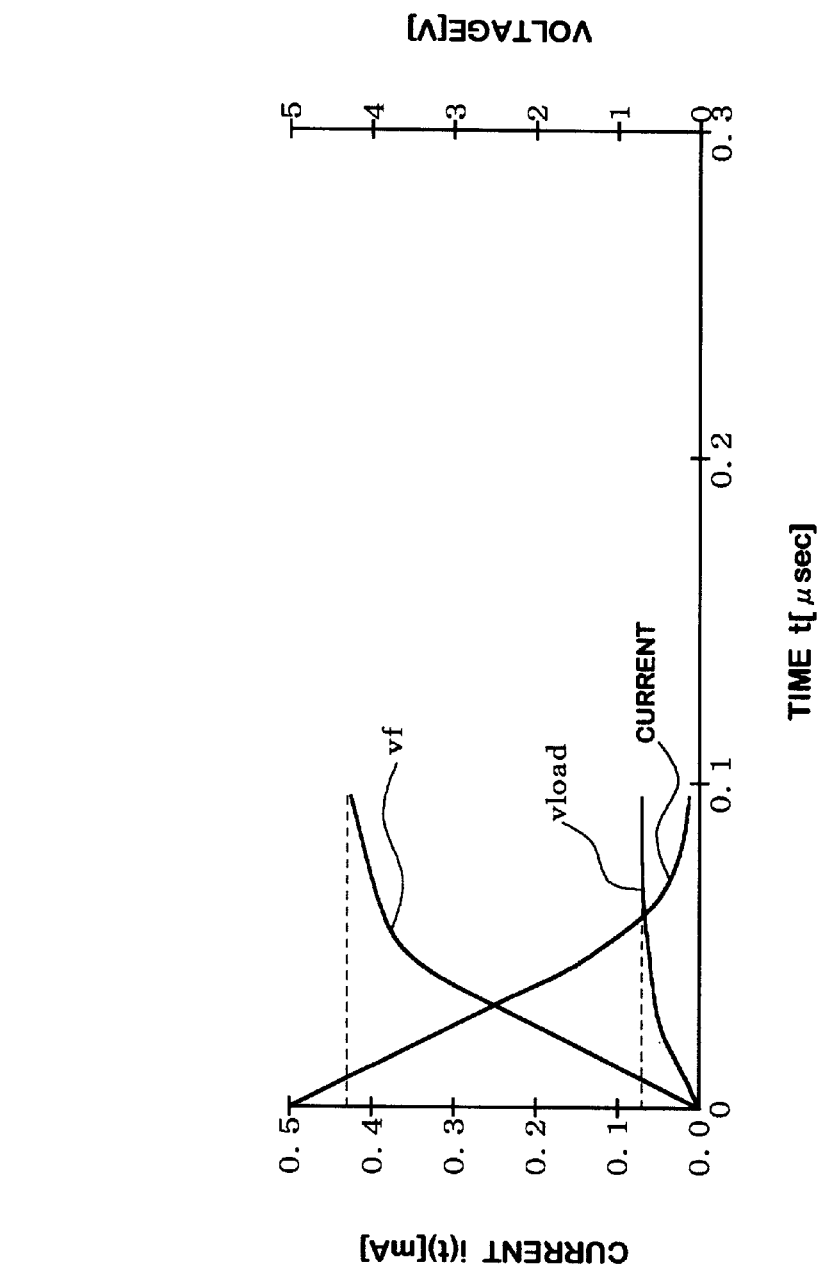
FIG. 39 is a graph illustrating both the voltages vf generated at the capacitor Cf and the voltages vload generated at the load capacitor Cload both corresponding to the transient charge response q(t) shown in FIG. 38.

FIG. 39 shows a graph illustrating voltages vf generated at the ferroelectric capacitor Cf and voltages vload generated at the load capacitor Cload both corresponding to the transient charge response q(t) shown in FIG. 38. The voltage vload generated at the load capacitor Cload are calculated under the equation below which is the same equation to case of reading out the stored data in "high" state, $$vload=q(t)/Cload$$

Figure 40:
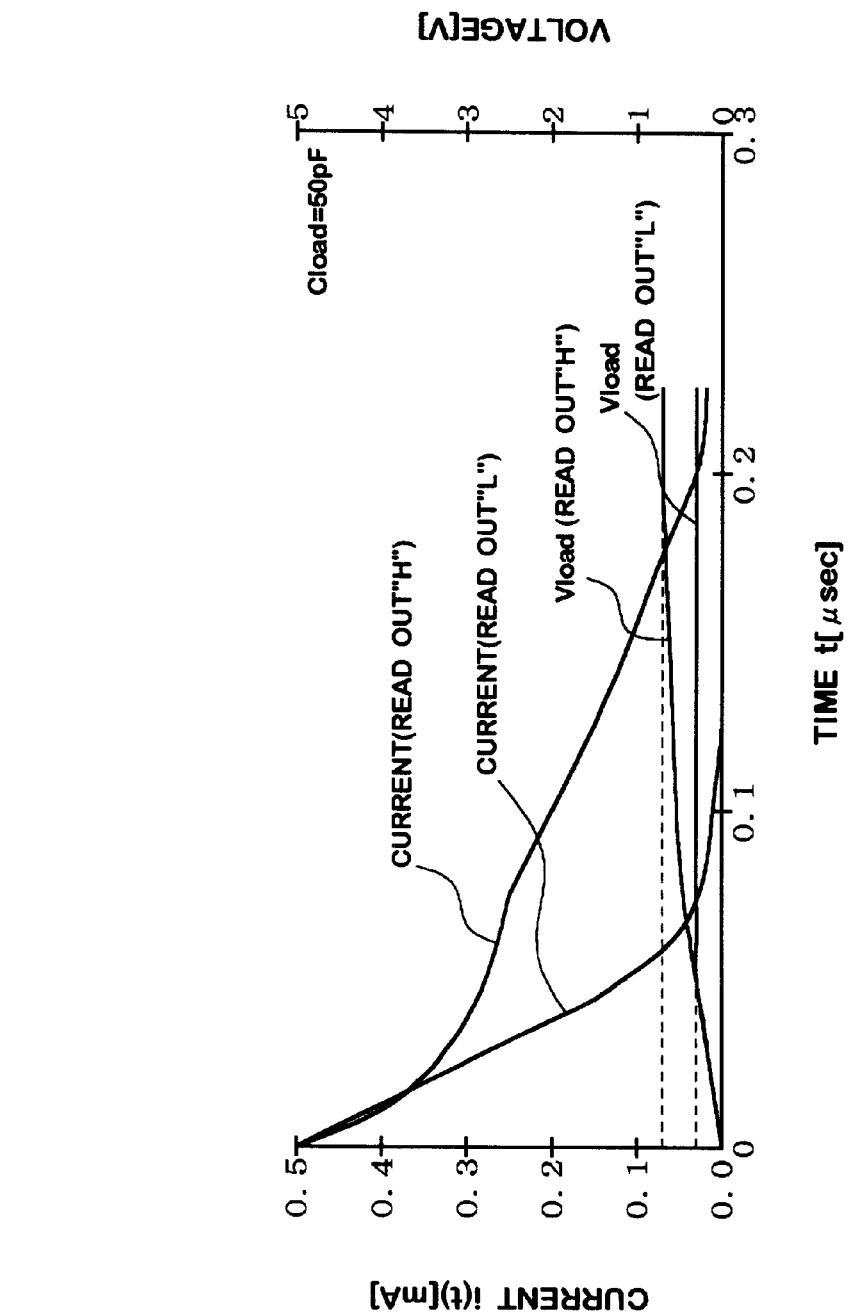
FIG. 40 is a graph illustrating both the transient voltage response and the transient current response when capacitance of the load capacitor Cload is set at 50 pico farads.
Figure 41:
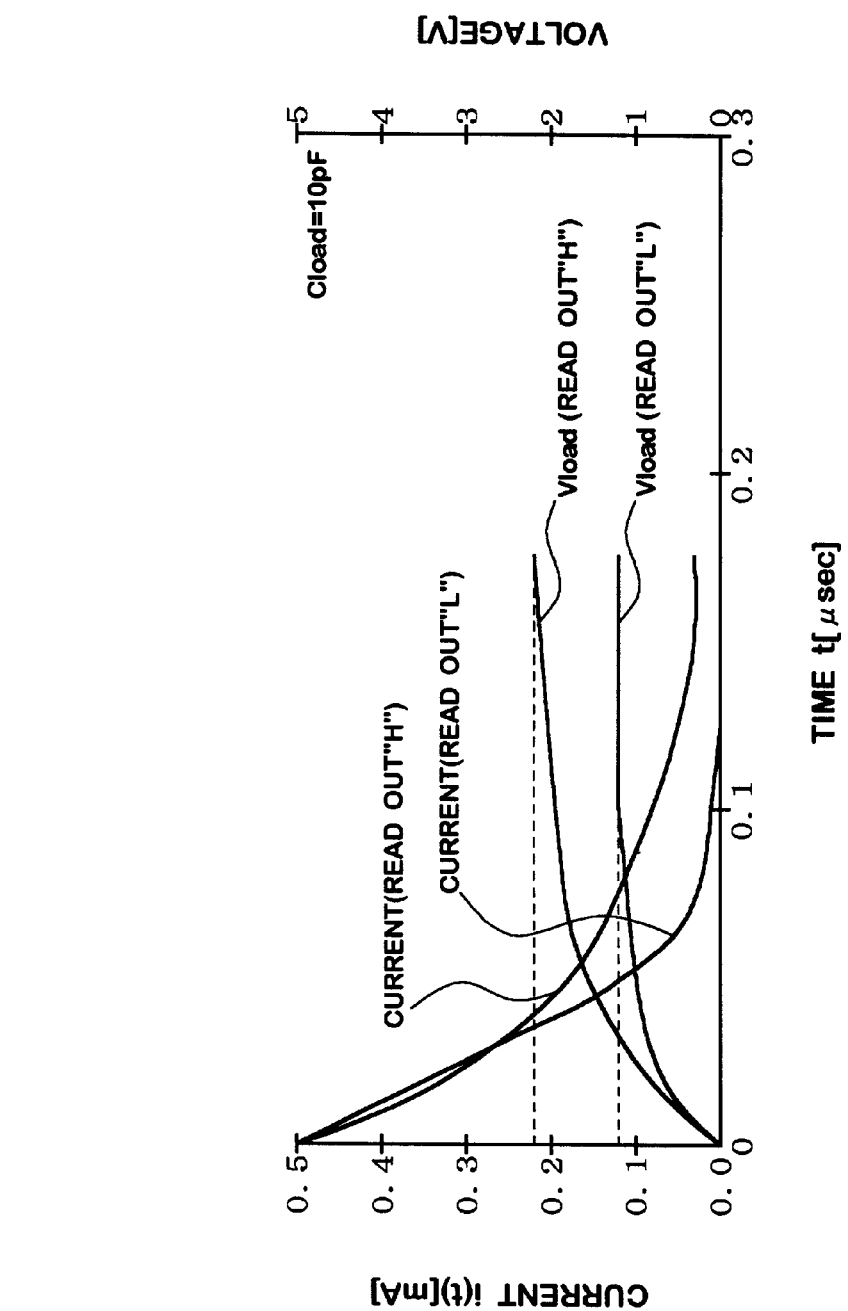
FIG. 41 is a graph illustrating both the transient voltage response and the transient current response when capacitance of the load capacitor Cload is set at 40 pico farads.
Figure 42:
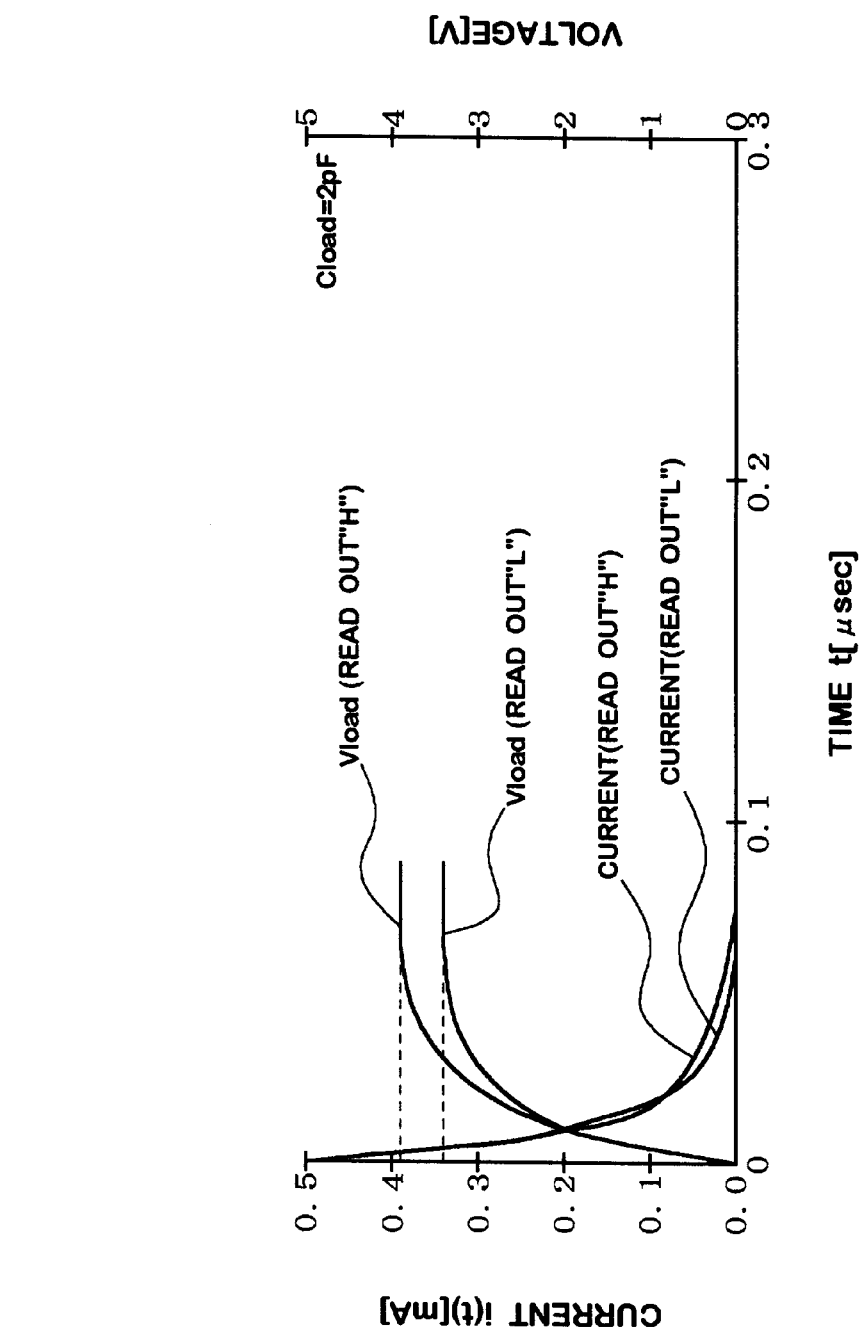
FIG. 42 is a graph illustrating both the transient voltage response and the transient current response when capacitance of the load capacitor Cload is set at 2 pico farads.

As described above, the dynamic characteristics of the circuit CTR are varied depending upon the capacitance of the load capacitor Cload. FIGS. 40, 41 and 42 are graphs each illustrating the transient responses when the capacitances of the load capacitor Cload are set at various values.

FIG. 40 is a graph illustrating both the transient current responses i(t) and the voltage Vload of the load capacitor Cload in case of reading out the stored data both in "High" state and "Low" state when capacitance of the load capacitor Cload is set at 50 pico farads. FIG. 41 is another graph illustrating both the transient current response i(t) and the voltage Vload of the load capacitor Cload in case similar to FIG. 40 when capacitance of the load capacitor Cload is set at 10 pico farads. And FIG. 42 is another graph illustrated in similar manner to FIG. 40 and FIG. 41 when capacitance of the load capacitor Cload is set at 2 pico farads.

Significant variation of the transient responses can be observed with variation of the capacitance of the load capacitor Cload by referring to the FIGS. 40, 41, and 42 even when the same ferroelectric capacitor Cf is used.

Figure 43:
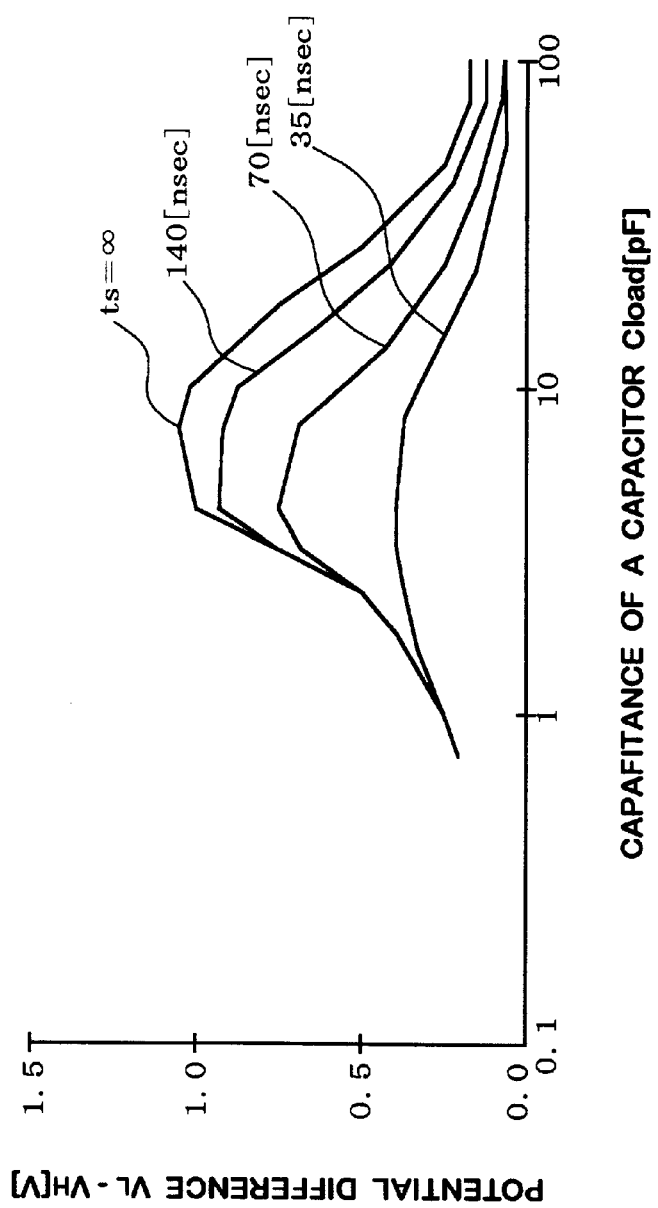
FIG. 43 is a graph illustrating a relationship between the capacitance of the load capacitor Cload and the potential differences of the voltage $V_H$ and the voltage $V_L$ detected during the read out operation using a settling time ts as a parameter.

FIG. 43 is a graph illustrating a relationship between the capacitance of the load capacitor Cload and the potential difference between the voltage $V_H$ to and voltage $V_L$ by using a settling time "ts" as a parameter. The settling time "ts" is duration from when a voltage E (a range of which is OV to +$V_{read}$) having a step shaped waveform is applied to the circuit CTR to when the voltages are detected at the bit line B.

The potential difference between the voltage $V_H$ and the voltage $V_L$ become a maximum value fo 1.1 volts when capacitance of the load capacitor Cload is set at 8 pico farads in case of setting the settling time "ts" as ∞. Further, the potential difference between the voltage $V_H$ and the voltage $V_L$ become another maximum value of 0.75 volts when capacitance. of the load capacitor Cload is set at 5 pico farads in case of setting the settling time "ts" as 70 nano-seconds.

In order to obtain a larger potential difference of the voltage $V_H$ and the voltage $V_L$ at a predetermined settling time, it is understood that the load capacitor Cload having a capacitance of 8 pico farads is preferable when the settling time "ts" is set as ∞, and the load capacitor Cload having a capacitance of 5 pico farads is preferable when the settling time "ts" is set as 70 nano-seconds.

Thus, analysis of the transient response being conducted by using the simulator 20 for simulating a circuit according to the present invention allows to easily find the conditions for maintaining a certain value of the potential difference between the voltage $V_H$ and the voltage $V_L$ as well as to achieve a high speed read-out operation. Also, the conditions to save power consumption can easily be found by the simulator 20.

[Other Embodiments]

Although, the memory cell MC so called a one-transistor and one-capacitor type memory cell is used as the circuit including the ferroelectric part in the embodiment described above, the circuit is not limited to that structure. The present invention can be applied to another circuit which includes a two-transistor and two-capacitor type memory cell as the circuit including the ferroelectric part. Further, the present invention can also be applied to a memory cell using a transistor(s) having a ferroelectric part(s) as the circuit including the ferroelectric part. Still further, the present invention can be applied to circuits other than memory cells as long as the circuits use the ferroelectric parts.

The CPU 6 controls other parts in accordance with a control program stored in the hard disc 2. The control program is a program which is installed into the hard disk 2 by reading out from flexible disk(s) storing the control program through the FDD 14. The control program can be installed into the hard disk 2 from a computer readable medium(s) incorporated with program(s) such as a CD-ROM, an IC card or the like, beside the flexible disk(s). Further, the control program can be downloaded through a communication line.

In the embodiment describe above, the control program stored in the flexible disk(s) is executed indirectly on the apparatus by installing the control program into the hard disk 2 from th flexible disk(s). It is not limited to do that, the control program stored in the flexible disk(s) can be executed directly on the apparatus through the FDD 14.

The control program which can be executed by the apparatus in this embodiment is not only the control program itself being executed directly by the apparatus by installing under as is condition, but also the control program herein includes a control program which need to be converted such as decompressed data and the like and a control program which can be executed on the apparatus combining with other modules such as operating systems or library.

Although. the CPU 6 is used for realizing functions of the apparatus (simulator 20) described above, a part or all of the functions can be realized by hardware such as logic circuits or the like.

Further, other equation(s) and/or different steps can be used in order to execute the simulations described above according to the present invention. For instance, the sequence of the steps shown in flow charts can be changed in another sequence as well as combining same steps as one step and dividing one step into some steps.

The present invention is characterized in that, the dynamic characteristics of the circuit including the ferroelectric part are determined in accordance with both the without-polarization reversal term and the with-polarization reversal term, at least a part of the without-polarization reversal term being determined as a saturation function and the without-polarization reversal term corresponding to phenomena not accompanying with reversal of spontaneous polarization of the ferroelectric part in the hysteresis, at least a part of the with-polarization reversal term is determined as a saturation function and the with-polarization reversal term corresponds to phenomena accompanying with reversal of spontaneous polarization of the ferroelectric part in the hysteresis.

In this way, the evaluation of the dynamic characteristics of the circuit including the ferroelectric part in quantitative manner can conducted easily by using simple saturation functions. Consequently, it is possible to adequately set a timing for the operation of the circuit incorporating the ferroelectric part and the like.

Further, the present invention is characterized in that, the procedures for calculating the dynamic characteristics of the circuit include a step for calculating dynamic capacitance of the ferroelectric part corresponding to the without-polarization reversal term by differentiating the without-polarization reversal term with the voltages applied thereto, a step for calculating dynamic capacitance of the ferroelectric part corresponding to the with-polarization reversal term by differentiating the with-polarization reversal term with the voltages applied thereto, and a step for calculating dynamic capacitance of the ferroelectric part by using both the dynamic capacitance of the ferroelectric part corresponding to the without-polarization reversal term and the dynamic capacitance of the ferroelectric part corresponding to the with-polarization reversal term.

In this way, the simple saturation functions representing both the with-polarization reversal term and the without-polarization reversal term allow easy calculation in the differentiation. Also, both the dynamic capacitance of the ferroelectric part corresponding to the without-polarization reversal term and that of the ferroelectric part corresponding to the with-polarization reversal term both being calculated by conducting the differentiation are described as simple exponential functions. Consequently, the dynamic capacitances of the ferroelectric part composing these capacitance can be described as a combination of the simple exponential functions.

In other words, the dynamic capacitances of the ferroelectric part can be calculated easily by conducting easy calculation in the differentiation while describing the dynamic capacitance thus calculated as a combination of the simple functions.

Still further, the present invention is characterized in that, the procedures for calculating the dynamic characteristics of the circuit include both a step for determining dynamic time constants of the circuit including the ferroelectric part in accordance with the dynamic capacity of the ferroelectric part, and a step for determining transient responses of the circuit including the ferroelectric part in accordance with the dynamic time constants of the circuit.

In this way, the combination of the simple exponential functions indicating the dynamic capacitances of the ferroelectric part allow easy calculation of dynamic time constants of the circuit including the ferroelectric part described as a product of the resister and the dynamic capacitance of the circuit.

The dynamic time constants thus calculated can also be indicated as the combination of the simple exponential functions. Therefore, the transient responses of the circuit can be calculated by conducting simple calculation in accordance with the dynamic time constants thus calculated. Consequently, the transient responses of the circuit including the ferroelectric part can easily be calculated by conducting simple calculation.

The present invention is characterized in that, the procedures for calculating the dynamic characteristics of the circuit include a step for determining dynamic time constant of the circuit including the ferroelectric part in accordance with dynamic capacity corresponding to transient voltage generated at the ferroelectric part during a transient period, the dynamic time constant of the circuit corresponding to the transient voltage, a step for determining response time corresponding to a variation of the polarization charges corresponding to the transient voltage in accordance with the dynamic time constant corresponding to the transient voltage, a step for setting time bases using the response time as factors thereof, and a step for determining a relationship between the factors and response values corresponding to the factors.

In other words, the dynamic time constant corresponding to the transient voltage of the circuit including the ferroelectric part is determined, and then the transient voltage is related to the time bases of the transient responses in accordance with the dynamic time constant thus determined. In this way, a relationship between the time bases and the responses can be obtained once the relationship between the transient voltage and the responses are given. Consequently, the transient responses can be determined easily.

Further, the present invention is characterized in that, the procedures for calculating the dynamic characteristics of the circuit includes a step for determining the transient responses when the ferroelectric part is headed for a predetermined balanced state.

Therefore, operation of the circuit including the ferroelectric part can be finished at a moment whenever an appropriate response is detected even when state of the ferroelectric part has not been reached to the predetermined balanced state by detecting all the transient responses until the state reaches to the predetermined balanced state. Consequently, it is possible to achieve a high speed operation as well as decreasing the power consumption.

Still further, the present invention is characterized in that, the predetermined balanced state in the procedures for calculating the dynamic characteristics of the circuit is a state which the ferroelectric part is headed, in case of writing data into the ferroelectric part.

In this way, the write operation can be finished at a moment whenever an appropriate response for performing the write operation is detected even when state of the ferroelectric part has not been reached to the predetermined balanced state by detecting all the transient responses until the state reaches to the predetermined balanced state which the ferroelectric part is headed for, in case of writing the data into the ferroelectric part. Consequently, it is possible to achieve a high speed write operation as well as decreasing the power consumption.

The present invention is characterized in that, the predetermined balanced state in the procedures for calculating the dynamic characteristics of the circuit is a state which the ferroelectric part is headed, in case of reading out data from the ferroelectric part.

In this way, the read-out operation can be finished at a moment whenever an appropriate response for performing the read-out operation is detected even when state of the ferroelectric part has not been reached to the predetermined balanced state by detecting all the transient responses until the state reaches to the predetermined balanced state which the ferroelectric part is headed for, in case of reading out the data from the ferroelectric part. Consequently, it is possible to achieve a high speed read-out operation as well as decreasing the power consumption.

Further, the present invention is characterized in that, the apparatus, the method and the procedures for extracting characteristic constants of a ferroelectric part comprises the steps for extracting a first characteristic constant Qpmax corresponding to a saturation point of the saturation function composing the without-polarization reversal term, a second characteristic constant Kp corresponding to sensitivity of the saturation function composing the without-polarization reversal term, a third characteristic constant Qrmax corresponding to a saturation point of the saturation function composing the with-polarization reversal term, a fourth characteristic constant Kr corresponding to sensitivity of the saturation function composing the with-polarization reversal term, and a fifth characteristic constant Ec corresponding to a starting point of the saturation function composing the with-polarization reversal term.

In this way, hysteresis characteristics of the actual ferroelectric part can be described with simple saturation functions by extracting a total of five characteristic constants. Consequently, the operation of the actual ferroelectric part can be evaluated quantitatively by performing the calculations.

Still further, the present invention is characterized in that, the procedures for extracting the characteristic constants includes a step for determining both maximum polarization charges Ps charged in the ferroelectric part and remanent polarization charges Pr remains therein in accordance with voltage amplitudes $V_T$ when an alternating voltage for extracting the characteristic constants is applied.

In this way, the remanent polarization charges Pr and the maximum polarization charges Ps can easily be obtained respectively by using a measuring circuit generally known such as a Sawyer-Tower circuit. The remanent polarization charges Pr includes only a component corresponding to phenomena accompanying with reversal of spontaneous polarization of the ferroelectric part, and the maximum polarization charges Ps includes both components corresponding to phenomena accompanying with reversal of spontaneous polarization of the ferroelectric part and another phenomena not accompanying with reversal of spontaneous polarization of the ferroelectric part.

The present invention is characterized in that, the procedures for extracting the characteristic constants includes a step for determining dielectric polarization charges Pp representing differences between the maximum polarization charges Ps and the remanent polarization charges Pr in accordance with the voltage amplitudes $V_T$ of the applied alternating voltage by calculating a difference between the maximum polarization charges Ps and the remanent polarization charges Pr thus obtained. In this way, the dielectric polarization charges Pp including only a component corresponding to the phenomena accompanying with reversal of spontaneous polarization of the ferroelectric part can easily be obtained by conducting a very simple calculation.

Further, the present invention is characterized in that, the procedures for extracting the characteristic constants include a step for determining the dielectric polarization charges Pp as the first characteristic constant Qpmax when a ratio for a variation of the dielectric polarization charges Pp to a variation of the voltage amplitudes $V_T$ is within a predetermined value, and a step for extracting the second characteristic constant Kp under an equation described below by utilizing both k representing a constant when the dielectric polarization charges Pp is described as a product of k and Qpmax, and $V_T$k describing the voltage amplitudes $V_T$ corresponding to the desired values of the dielectric polarization charges Pp, $Kp=-\ln(1-k)/VTk$ when a condition of $0 \leq k \leq 1$ is satisfied.

In this way, the first characteristic constant Qpmax and the second characteristic constant Kp both required to specify the without-polarization reversal term of the actual ferroelectric part can be determined in a very short period of time by conducting a simple calculation.

Still further, the present invention is characterized in that, the procedures for extracting the characteristic constants include a step for estimating a saturation function using the extracted first characteristic constant Qpmax and the extracted second characteristic constant Kp as a saturation point and a sensitivity of the saturation function respectively, and a step for adjusting the second characteristic constant Kp to minimize sum totals of absolute values of differences between function values of the saturation function thus estimated and the dielectric polarization charges Pp corresponding to the function values.

In this way, the second characteristic constant Kp facilitating fidelity of the simulation of the actual ferroelectric part can be obtained by additionally conducting a simple calculation.

The present invention is characterized in that, the procedures for extracting the characteristic constants include a step for determining the remanent polarization charges Pr as the third characteristic constant Qrmax when a ratio for a variation of the remanent polarization charges Pr to a variation of the voltage amplitudes $V_T$ is within a predetermined value, and a step for extracting the fifth characteristic constant Ec under an equation described below by utilizing K1, $V_T$k1, K2 and $V_T$k2, the k1 representing a constant when remanent polarization charges Pr is described as a product of k1 and Qrmax, the $V_T$k1 describing the voltage amplitudes $V_T$ corresponding to one of the desired values of the remanent polarization charges Pr, the K2 representing a constant when remanent polarization charges Pr is described as a product of k2 and Qrmax, and the $V_T$k2 describing the voltage amplitudes $V_T$ corresponding to the other one of the desired values of the remanent polarization charges Pr, $Ec=(VTk1 \cdot \ln(1-k2)-VTk2 \cdot \ln(1-k1))/(\ln(1-k2)-\ln(1-k1))$ when a condition of $0 \leq k1 \leq 1$, $0 \leq k2 \leq 1$, $k1 \neq k2$ is satisfied.

Therefore, the third characteristic constant Qrmax and the fifth characteristic constant Ec both required to specify the with-polarization reversal term of the actual ferroelectric part can be determined in a very short period of time by conducting a simple calculation.

Further, the present invention is characterized in that, the procedures for extracting the characteristic constants include a step for extracting the fourth characteristic constant Kr under an equation described below by using the fifth characteristic constant Ec, and utilizing both k representing a constant when the remanent polarization charges Pr is described as a product of k and Qrmax, and $V_T$k describing the voltage amplitudes $V_T$ corresponding to the desired values of the remanent polarization charges Pr, $Kr=-\ln(1-k)/(VTk-Ec)$ when a condition of $0 \leq k \leq 1$ is satisfied.

In this way, the fourth characteristic constant Kr required to specify the with-polarization reversal term of the actual ferroelectric part can be determined in a very short period of time by conducting a simple calculation.

Still further, the present invention is characterized in that, the procedures for extracting the characteristic constants include a step for estimating a saturation function using the extracted third characteristic constant Qrmax, the extracted fifth characteristic constant Ec and the extracted fourth characteristic constant Kr as a saturation point, a starting point and sensitivity of the saturation function respectively, and a step for adjusting the fourth characteristic constant Kr to minimize sum totals of absolute values of differences between function values of the saturation function thus estimated and the remanent polarization charges Pr corresponding to the function values.

Therefore, the fourth characteristic constant Kr facilitating fidelity of the simulation of the actual ferroelectric part can be obtained by additionally conducting a simple calculation.

Definition of words used in the appended claims for describing the present invention as well as correspondence in the embodiment herein are as follows.

In the appended claims, a word "ferroelectric part" represents an actual part composed of a ferroelectric material. The ferroelectric part includes a part of the ferroelectric capacitor made of a ferroelectric material and/or a part of a ferroelectric transistor made of the ferroelectric material. In the embodiment earlier, the word "ferroelectric part" correspond to a part of the ferroelectric capacitor Cf made of the ferroelectric material.

A word "dynamic characteristics" represents a part of characteristics of the circuit including the ferroelectric part, the characteristics varied together with a variation of time and/or applied voltages. In the embodiment earlier, the word "dynamic characteristics" correspond to the dynamic capacitance Cp, the dynamic time constants τ, the transient charge response q(t) and the transient current response i(t) and the like shown in FIG. 1 and other Figs.

While the invention has been described in its preferred embodiments, it is to be understood that the words which have been used and words of description rather than limitation and that changes within the purview of the appended claims may be made without departing from the true scope and spirit of the invention in its broader aspects.

What is claimed is:

1. An apparatus for simulating electrical characteristics of a circuit including a ferroelectric part, the apparatus calculating dynamic characteristics of the circuit based on a hysteresis representing a relationship between voltages applied to the ferroelectric part and polarization charges measured in the ferroelectric part, the apparatus comprising:

means for measuring polarization phenomena in the ferroelectric part in response to a voltage applied in the ferroelectric part;

first means for determining a without-polarization reversal term at least a part of which as a saturation function, the without-polarization reversal term corresponds to phenomena not accompanying with reversal of spontaneous polarization of the ferroelectric part in the hysteresis, second means for determining a with-polarization reversal term at least a part of which as a saturation function, the with-polarization reversal term corresponds to phenomena accompanying with reversal of spontaneous polarization of the ferroelectric part in the hysteresis, and third means for determining dynamic characteristics of the circuit including the ferroelectric part in accordance with the hysteresis of the ferroelectric part composing of both the without-polarization reversal term and the with-polarization reversal term.

2. A method for simulating electrical characteristics of a circuit including a ferroelectric part, the method calculating dynamic characteristics of the circuit based on a hysteresis representing a relationship between voltages applied to the ferroelectric part and polarization charges measured in the ferroelectric part the method comprising the steps of:

measuring polarization phenomena in the ferroelectric part in response to a voltage applied in the ferroelectric part;

determining a without-polarization reversal term at least a part of which as a saturation function, the without-polarization reversal term corresponds to phenomena not accompanying with reversal of spontaneous polarization of the ferroelectric part in the hysteresis, determining a with-polarization reversal term at least a part of which as a saturation function, the with-polarization reversal term corresponds to phenomena accompanying with reversal of spontaneous polarization of the ferroelectric part in the hysteresis, and determining dynamic characteristics of the circuit including the ferroelectric part in accordance with both the without-polarization reversal term and the with-polarization reversal term, dynamic characterstics of the circuit including the ferroelectric part in accordance with both the without-polarization reversal term and the with-polarization reversal term.

3. A program storage medium readable by a machine, the machine performing procedures for calculating dynamic characteristics of a circuit including a ferroelectric part based on a hysteresis representing a relationship between voltages applied to the ferroelectric part and polarization charges measured in the ferroelectric part in accordance with a program stored in the program storage medium, the program being executable to perform steps comprising:

measuring polarization phenomena in the ferroelectric part in response to a voltage applied in the ferroelectric part;

determining a without-polarization reversal term at least part of which as a saturation function, the without-polarization reversal term corresponds to phenomena not accompanying with reversal of spontaneous polarization of the ferroelectric part in the hysteresis, determining a with-polarization reversal term at least a part of which as a saturation function, the with-polarization reversal term corresponds to phenomena accompanying with reversal of spontaneous polarization of the ferroelectric part in the hysteresis, and determining the dynamic characteristics of the circuit including the ferroelectric part in accordance with both the without-polarization reversal term and the with-polarization reversal term.

4. A program storage medium in accordance with claim 3, wherein the procedures for calculating the dynamic characteristics of the circuit include a step for calculating dynamic capacitance of the ferroelectric part corresponding to the without-polarization reversal term by differentiating the without-polarization reversal term with the voltages applied thereto, a step for calculating dynamic capacitance of the ferroelectric part corresponding to the with-polarization reversal term by differentiating the with-polarization reversal term with the voltages applied thereto, and a step for calculating dynamic capacitance of the ferroelectric part by using both the dynamic capacitance of the ferroelectric part corresponding to the without-polarization reversal term and the dynamic capacitance of the ferroelectric part corresponding to the with-polarization reversal term.

5. A program storage medium in accordance with claim 4, wherein the procedures for calculating the dynamic characteristics of the circuit include both a step for determining dynamic time constants of the circuit including the ferroelectric part in accordance with the dynamic capacitance of the ferroelectric part, and a step for determining transient responses of the circuit including the ferroelectric part in accordance with the dynamic time constants of the circuit.

6. A program storage medium in accordance with claim 5, wherein the procedures for calculating the dynamic characteristics of the circuit include a step for determining dynamic time constant of the circuit including the ferroelectric part in accordance with dynamic capacitance corresponding to transient voltage generated at the ferroelectric part during a transient period, the dynamic time constant of the circuit correspond to the transient voltage, a step for determining response time corresponding to a variation of the polarization charges corresponding to the transient voltage in accordance with the dynamic time constant corresponding to the transient voltage, a step for setting time bases using the response time as factors thereof, and a step for determining a relationship between the factors and response values corresponding to the factors.

7. A program storage medium in accordance with claim 5, wherein the procedures for calculating the dynamic characteristics of the circuit includes a step for determining the transient responses when the ferroelectric part is headed for a predetermined balanced state.

8. A program storage medium in accordance with claim 7, wherein the predetermined balanced state in the procedures for calculating the dynamic characteristics of the circuit is a state which the ferroelectric part is headed, in case of writing data into the ferroelectric part.

9. A program storage medium in accordance with claim 7, wherein the predetermined balanced state in the procedures for calculating the dynamic characteristics of the circuit is a state which the ferroelectric part is headed, in case of reading out data from the ferroelectric part.

10. A program storage medium in accordance with claim 3, herein the procedures for calculating the dynamic characteristics of the circuit include following steps for extracting characteristic constants used for describing the hysteresis of the ferroelectric part, A) extracting a first characteristic constant Qpmax corresponding to a saturation point of the saturation function composing the without-polarization reversal term, B) extracting a second characteristic constant Kp corresponding to sensitivity of the saturation function composing the without-polarization reversal term, C) extracting a third characteristic constant Qrmax corresponding to a saturation point of the saturation function composing the with-polarization reversal term, D) extracting a fourth characteristic constant Kr corresponding to sensitivity of the saturation function composing the with-polarization reversal term, and E) extracting a fifth characteristic constant Ec corresponding to a starting point of the saturation function composing the with-polarization reversal term.

11. A program storage medium in accordance with claim 10, wherein the procedures for extracting the characteristic constants includes a step for determining both maximum polarization charges Ps charged in the ferroelectric part and remanent polarization charges Pr remains therein in accordance with voltage amplitudes $V_T$ when an alternating voltage for extracting the characteristic constants is applied.

12. A program storage medium in accordance with claim 11, wherein the procedures for extracting the characteristic constants includes a step for determining dielectric polarization charges Pp representing differences between the maximum polarization charges Ps and the remanent polarization charges Pr in accordance with the voltage amplitudes $V_T$ of the applied alternating voltage.

13. A program storage medium in accordance with claim 12, wherein the procedures for extracting the characteristic constants include a step for determining the dielectric polarization charges Pp as the first characteristic constant Qpmax when a ratio for a variation of the dielectric polarization charges Pp to a variation of the voltage amplitudes $V_T$ is within a predetermined value, and a step for extracting the second characteristic constant Kp under an equation described below by utilizing both k representing a constant when the dielectric polarization charges Pp is described as a product of k and Qrmax, and $V_T k$ describing the voltage amplitudes $V_T$ corresponding to the desired values of the dielectric polarization charges Pp, $$Kp=-\ln(1-k)/VTk$$

when a condition of $0 \leq k \leq 1$ is satisfied.

14. A program storage medium in accordance with claim 13, wherein the procedures for extracting the characteristic constants include a step for estimating a saturation function using the extracted first characteristic constant Qpmax and the extracted second characteristic constant Kp as a saturation point and a sensitivity of the saturation function respectively, and a step for adjusting the second characteristic constant Kp to minimize sum totals of absolute values of differences between function values of the saturation function thus estimated and the dielectric polarization charges Pp corresponding to the function values.

15. A program storage medium in accordance with claim 11, wherein the procedures for extracting the characteristic constants include a step for determining the remanent polarization charges Pr as the third characteristic constant Qrmax when a ratio for a variation of the remanent polarization charges Pr to a variation of the voltage amplitudes $V_T$ is within a predetermined value, and a step for extracting the fifth characteristic constant Ec under an equation described below by utilizing K1, $V_T k1$, K2 and $V_T k2$, the k1 representing a constant when remanent polarization charges Pr is described as a product of k1 and Qrmax, the $V_T k1$ describing the voltage amplitudes $V_T$ corresponding to one of the desired values of the remanent polarization charges Pr, the K2 representing a constant when remanent polarization charges Pr is described as a product of k2 and Qrmax, and the $V_T k2$ describing the voltage amplitudes $V_T$ corresponding to the other one of the desired values of the remanent polarization charges Pr, $$Ec=(VTk1 \cdot \ln(1-k2)-VTk2 \cdot \ln(1-k1))/(\ln(1-k2)-\ln(1-k1))$$

when a condition of $0 \leq k1 \leq 1$, $0 \leq k2 \leq 1$, $k1 \neq k2$ is satisfied.

16. A program storage medium in accordance with claim 15, wherein the procedures for extracting the characteristic constants include a step for extracting the fourth characteristic constant Kr under an equation described below by using the fifth characteristic constant Ec, and utilizing both k representing a constant when the remanent polarization charges Pr is described as a product of k and Qrmax, and $V_T k$ describing the voltage amplitudes $V_T$ corresponding to the desired values of the remanent polarization charges Pr, $$Kr=-\ln(1-k)/(VTk-Ec)$$

when a condition of $0 \leq k \leq 1$ is satisfied.

17. A program storage medium in accordance with claim 16, wherein the procedures for extracting the characteristic constants include a step for estimating a saturation function using the extracted third characteristic constant Qrmax, the extracted fifth characteristic constant Ec and the extracted fourth characteristic constant Kr as a saturation point, a starting point and sensitivity of the saturation function respectively, and a step for adjusting the fourth characteristic constant Kr to minimize sum totals of absolute values of differences between function values of the saturation function thus estimated and the remanent polarization charges Pr corresponding to the function values.

18. An apparatus for extracting characteristic constants of a ferroelectric part used for describing a hysteresis as a composition of both without-polarization reversal term at least a part of which being described in a saturation function not accompanying with reversal of spontaneous polarization of the ferroelectric part, and a with-polarization reversal term at least a part of which being described in a saturation function accompanying with reversal of spontaneous polarization of the ferroelectric part, the hysteresis representing a relationship between voltages applied to the ferroelectric part and polarization charges measured therein, the apparatus at least comprising means of:

means for measuring features of the saturation functions in the ferroelectric part in response to a voltage applied in the ferroelectric part;

first extracting means for extracting a first characteristic constant Qpmax corresponding to a saturation point of the saturation function composing the without-polarization reversal term, second extracting means for extracting a second characteristic constant Kp corresponding to sensitivity of the saturation function composing the without-polarization reversal term, third extracting means for extracting a third characteristic constant Qrmax corresponding to a saturation function composing the with-polarization reversal term, fourth extracting means for extracting a fourth characteristic constant Kp corresponding to sensitivity of the saturation function composing the with-polarization reversal term, and fifth extracting means for extracting a fifth characteristic constant Ec corresponding to a starting point of the saturation function composing the with-polarization reversal term.

19. A method for extracting characteristic constants of a ferroelectric part used for describing a hysteresis as a composition of both a without-polarization reversal term at least a part of which being described in a saturation function not accompanying with reversal of spontaneous polarization of the ferroelectric part, and a with-polarization reversal term at least a part of which being described in a saturation function accompanying with reversal of spontaneous polarization of the ferroelectric part, the hysteresis representing a relationship between voltages applied to the ferroelectric part and polarization charges measured therein, the method comprising the steps of:

measuring features of the saturation functions in the ferroelectric part in response to a voltage applied in the ferroelectric part;

extracting a first characteristic constant Qpmax corresponding to a saturation point of the saturation function composing the without-polarization reversal term, extracting a second characteristic constant Kp corresponding to sensitivity of the saturation function composing the without-polarization reversal term, extracting a third characteristic constant Qrmax corresponding to a saturation point of the saturation function composing the with-polarization reversal term, extracting a fourth characteristic constant Kr corresponding to sensitivity of the saturation function composing the with-polarization reversal term, and extracting a fifth characteristic constant Ec corresponding to a starting point of the saturation function composing the with-polarization reversal term.

20. A program storage medium readable by a machine, the program storage medium being used for performing procedures for extracting characteristic constants of a ferroelectric part used for describing a hysteresis as a composition of both a without-polarization reversal term at least a part of which being described in a saturation function not accompanying with reversal of spontaneous polarization of the ferroelectric part, and a with-polarization reversal term at least a part of which being described in a saturation function accompanying with reversal of spontaneous polarization of the ferroelectric part in accordance with a program stored in the medium by the machine, the hysteresis representing a relationship between voltages applied to the ferroelectric part and features of the saturation functions measured in the ferroelectric part, the program being executable to perform steps comprising:

extracting a first characteristic constant Qpmax corresponding to a saturation point of the saturation function composing the without-polarization reversal term, extracting a second characteristic constant Kp corresponding to sensitivity of the saturation function composing the without-polarization reversal term, extracting a third characteristic constant Qrmax corresponding to a saturation point of the saturation function composing the with-polarization reversal term, extracting a fourth characteristic constant Kr corresponding to sensitivity of the saturation function composing the with-polarization reversal term, and extracting a fifth characteristic constant Ec corresponding to a starting point of the saturation function composing the with-polarization reversal term.

21. A program storage medium in accordance with claim 20, wherein the procedures for extracting the characteristic constants includes a step for determining both maximum polarization charges Ps charged in the ferroelectric part and remanent polarization charges Pr remains therein in accordance with voltage amplitudes $V_T$ when an alternating voltage for extracting the characteristic constants is applied.

22. A program storage medium in accordance with claim 21, wherein the procedures for extracting the characteristic constants includes a step for determining dielectric polarization charges Pp representing differences between the maximum polarization charges Ps and the remanent polarization charges Pr in accordance with the voltage amplitudes $V_T$ of the applied alternating voltage.

23. A program storage medium in accordance with claim 22, wherein the procedures for extracting the characteristic constants include a step for determining the dielectric polarization charges Pp as the first characteristic constant Qpmax when a ratio for a variation of the dielectric polarization charges Pp to a variation of the voltage amplitudes $V_T$ is within a predetermined value, and a step for extracting the second characteristic constant Kp under an equation described below by utilizing both k representing a constant when the dielectric polarization charges Pp is described as a product of k and Qpmax, and $V_T k$ describing the voltage amplitudes $V_T$ corresponding to the desired values of the dielectric polarization charges Pp, $$Kp=-\ln(1-k)/VTk$$

when a condition of $0 \leq k \leq 1$ is satisfied.

24. A program storage medium in accordance with claim 23, wherein the procedures for extracting the characteristic constants include a step for estimating a saturation function using the extracted first characteristic constant Qpmax and the extracted second characteristic constant Kp as a saturation point and a sensitivity of the saturation function respectively, and a step for adjusting the second characteristic constant Kp to minimize sum totals of absolute values of differences between function values of the saturation function thus estimated and the dielectric polarization charges Pp corresponding to the function values.

25. A program storage medium in accordance with claim 21, wherein the procedures for extracting the characteristic constants include a step for determining the remanent polarization charges Pr as the third characteristic constant Qrmax when a ratio for a variation of the remanent polarization charges Pr to a variation of the voltage amplitudes $V_T$ is within a predetermined value, and a step for extracting the fifth characteristic constant Ec under an equation described below by utilizing K1, $V_T$k1, K2 and $V_T$k2, the k1 representing a constant when remanent polarization charges Pr is described as a product of k1 and Qrmax, the $V_T$k1 describing the voltage amplitudes $V_T$ corresponding to one of the desired values of the remanent polarization charges Pr, the K2 representing a constant when remanent polarization charges Pr is described as a product of k2 and Qrmax, and the $V_T$k2 describing the voltage amplitudes $V_T$ corresponding to the other one of the desired values of the remanent polarization charges Pr, $$Ec=(VTk1 \cdot \ln(1-k2)-VTk2 \cdot \ln(1-k1))/(\ln(1-k2)-\ln(1-k1))$$

when a condition of $0 \leq k1 \leq 1$, $0 \leq k2 \leq 1$, $k1 \neq k2$ is satisfied.

26. A program storage medium in accordance with claim 25, wherein the procedures for extracting the characteristic constants include a step for extracting the fourth characteristic constant Kr under an equation described below by using the fifth characteristic constant Ec, and utilizing both k representing a constant when the remanent polarization charges Pr is described as a product of k and Qrmax, and $V_T$k describing the voltage amplitudes $V_T$ corresponding to the desired values of the remanent polarization charges Pr, $$Kr=-\ln(1-k)/(VTk-Ec)$$

when a condition of $0 \leq k \leq 1$ is satisfied.

27. A program storage medium in accordance with claim 26, wherein the procedures for extracting the characteristic constants include a step for estimating a saturation function using the extracted third characteristic constant Qrmax, the extracted fifth characteristic constant Ec and the extracted fourth characteristic constant Kr as a saturation point, a starting point and sensitivity of the saturation function respectively, and a step for adjusting the fourth characteristic constant Kr to minimize sum totals of absolute values of differences between function values of the saturation function thus estimated and the remanent polarization charges Pr corresponding to the function values.

\* \* \* \* \*